US007919858B2

(12) United States Patent
Danno

(10) Patent No.: US 7,919,858 B2
(45) Date of Patent: Apr. 5, 2011

(54) SEMICONDUCTOR DEVICE HAVING LANDS DISPOSED INWARD AND OUTWARD OF AN AREA OF A WIRING BOARD WHERE ELECTRODES ARE DISPOSED

(75) Inventor: Tadatoshi Danno, Tokyo (JP)

(73) Assignee: Renesas Electronics Corporation, Kawasaki (JP)

( * ) Notice: Subject to any disclaimer, the term of this patent is extended or adjusted under 35 U.S.C. 154(b) by 0 days.

(21) Appl. No.: 12/432,057

(22) Filed: Apr. 29, 2009

(65) Prior Publication Data
US 2009/0309210 A1    Dec. 17, 2009

(30) Foreign Application Priority Data

Jun. 12, 2008  (JP) ................................. 2008-153988

(51) Int. Cl.
*H01L 23/48*     (2006.01)
*H01L 23/52*     (2006.01)
*H01L 29/40*     (2006.01)
*H01L 23/04*     (2006.01)
*H01L 23/053*    (2006.01)
*H01L 23/12*     (2006.01)

(52) U.S. Cl. ........ 257/734; 257/690; 257/698; 257/700; 257/737; 257/738; 257/774; 257/784; 257/E23.011; 257/E23.02; 257/E23.021; 257/E23.067; 257/E23.068

(58) Field of Classification Search .................. 257/700, 257/737–738, 774, E23.011, E23.02, E23.021, 257/E23.067, E23.068, 690, 698, 734, 784
See application file for complete search history.

(56) References Cited

U.S. PATENT DOCUMENTS

| 5,672,911 | A  | * | 9/1997  | Patil et al. ........................ 257/691 |
| 6,006,428 | A  | * | 12/1999 | Feilchenfeld et al. ........... 29/852 |
| 6,433,441 | B1 | * | 8/2002  | Niwa et al. ...................... 257/784 |
| 6,838,767 | B2 | * | 1/2005  | Hirano et al. ................... 257/737 |
| 7,387,917 | B2 |   | 6/2008  | Choi et al. |
| 7,405,474 | B1 | * | 7/2008  | Brophy ........................... 257/700 |
| 7,538,441 | B2 | * | 5/2009  | Inagawa ......................... 257/784 |
| 7,728,421 | B2 | * | 6/2010  | Tanoue ........................... 257/692 |
| 2004/0080025 | A1 | * | 4/2004 | Kasahara et al. .............. 257/666 |
| 2004/0113271 | A1 | * | 6/2004 | Takahashi et al. ............. 257/735 |
| 2005/0046023 | A1 | * | 3/2005 | Takahashi et al. ............. 257/734 |
| 2005/0189627 | A1 | * | 9/2005 | Ito et al. ......................... 257/666 |
| 2005/0206014 | A1 | * | 9/2005 | Sakamoto et al. ............. 257/782 |
| 2006/0017151 | A1 | * | 1/2006 | Yoon et al. ..................... 257/700 |
| 2006/0023439 | A1 | * | 2/2006 | Fraley et al. ................... 361/780 |
| 2006/0237830 | A1 | * | 10/2006 | Danno et al. .................. 257/678 |
| 2007/0126112 | A1 | * | 6/2007 | Cho et al. ....................... 257/700 |
| 2007/0170578 | A1 | * | 7/2007 | Yoshikawa et al. ........... 257/700 |
| 2007/0271783 | A1 | * | 11/2007 | Ikeda .............................. 29/852 |

FOREIGN PATENT DOCUMENTS

| JP | 2002-368154 A | 12/2002 |
| JP | 2006-190928 A | 7/2006 |

* cited by examiner

FOREIGN PATENT DOCUMENTS

*Primary Examiner* — Ida M Soward
(74) *Attorney, Agent, or Firm* — Mattingly & Malur, P.C.

(57) ABSTRACT

The present invention provides a technique capable of suppressing variations in the height of each solder ball where an NSMD is used as a structure for each land. Vias that extend through a wiring board are provided. Lands are formed at the back surface of the wiring board so as to be coupled directly to the vias respectively. The lands are respectively formed so as to be internally included in openings defined in a solder resist. Half balls are mounted over the lands respectively. Namely, the present invention has a feature in that the configuration of coupling between each of the lands and its corresponding via both formed at the back surface of the wiring board is taken as a land on via structure and a configuration form of each land is taken as an NSMD.

14 Claims, 45 Drawing Sheets

*FIG. 20*
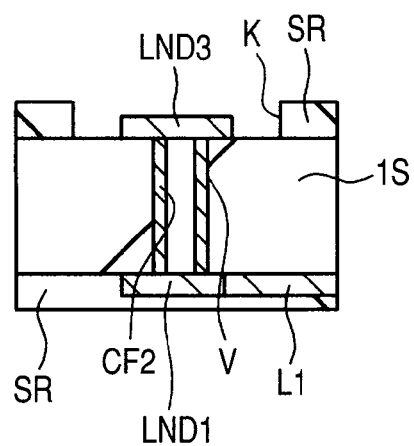
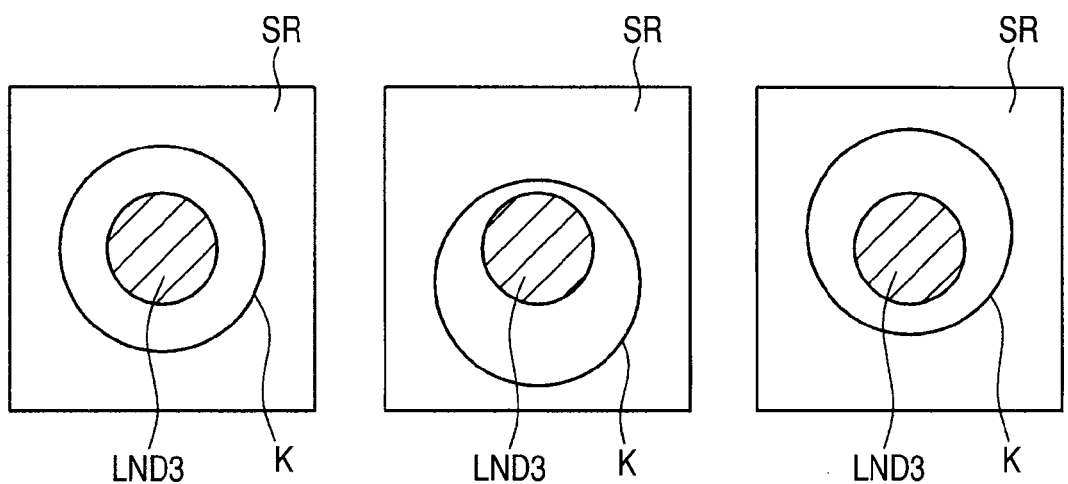
*FIG. 21(a)*  *FIG. 21(b)*  *FIG. 21(c)*

FIG. 26

| | SUBSTRATE SPECIFICATIONS | NUMBER OF EVALUATIONS | | | | | |
|---|---|---|---|---|---|---|---|
| | | 30 TIMES | 50 TIMES | 100 TIMES | 150 TIMES | 200 TIMES |
| 1500G, 0.5ms | BGA | NSMD | 0/60 | 0/60 | 1/60 | 2/59 | 3/57 |
| 1500G, 0.5ms | HALF BALL LGA | NSMD | 0/60 | 0/60 | 0/60 | 2/59 | 0/60 |

US 7,919,858 B2

SEMICONDUCTOR DEVICE HAVING LANDS DISPOSED INWARD AND OUTWARD OF AN AREA OF A WIRING BOARD WHERE ELECTRODES ARE DISPOSED

CROSS-REFERENCE TO RELATED APPLICATIONS

The disclosure of Japanese patent application No. 2008-153988 filed on Jun. 12, 2008 including the specification, drawings and abstract is incorporated herein by reference in its entirety.

BACKGROUND OF THE INVENTION

The present invention relates to a semiconductor device and a manufacturing technology thereof, and particularly to a semiconductor device wherein a semiconductor chip is mounted over a wiring board and external coupling terminals are provided at a surface (back surface) opposite to a semiconductor chip mounting surface (front surface) of the wiring board, and a technology effective if applied to the manufacture of the semiconductor device.

A technique related to a BGA (Ball Grid Array) which prevents the formation of bores or dimples in via holes defined in a wiring substrate or board has been described in Japanese Unexamined Patent Publication No. 2006-190928 (patent document 1). In this technique, vias (blind vias) that do not extend through the wiring board are formed inside the wiring board. Lands (pads) are formed at the back surface of the wiring board so as to be directly coupled to the vias respectively. Namely, a so-called Pad on via structure has been disclosed in which each of the vias is disposed over its corresponding land formed at the back surface of the wiring board. At this time, the ends of the lands formed at the back surface of the wiring board are covered with a solder resist, and openings that open the solder resist are formed at their corresponding central portions of the lands. That is, each of the lands described in the patent document 1 has a so-called SMD (Solder Mask Defined) structure wherein the diameter of each opening defined in the solder resist is smaller than the diameter of each land, and the opening is formed so as to be internally contained in its corresponding land in plan view. Solder balls are mounted onto their corresponding lands each brought to the SMD structure thereby to form the BGA.

In Japanese Unexamined Patent Publication No. 2002-368154 (patent document 2), vias that extend through a wiring board are formed and lands (pads) are formed at the back surface of the wiring board so as to be directly coupled to the vias respectively. Namely, a so-called pad on via structure has been disclosed even in the patent document 2. At this time, a package targeted in the patent document 2 is of an LGA (Land Grid Array) and is configured in such a manner that a solder resist is not applied onto the back surface of the wiring board.

SUMMARY OF THE INVENTION

In recent years, for example, a form called "BGA (Ball Grid Array)" has been known as a package form for a semiconductor chip. In the BGA, a semiconductor chip is first mounted onto the surface of a wiring substrate or board. Bonding pads formed at the semiconductor chip and electrodes formed at the surface of the wiring board are coupled to one another by wires. The electrodes formed at the surface of the wiring board are respectively electrically coupled to the vias that penetrate the wiring board. The vias that penetrate the wiring board are respectively coupled to the lands formed at the back surface of the wiring board. Solder balls are mounted onto their corresponding lands and configure external coupling terminals respectively.

In the BGA configured in this way, the lands are disposed in matrix form at the back surface of the wiring board. Therefore, many external coupling terminals can be disposed with the wiring board smaller in area as compared with a QFP (Quad Flat Package) that takes out leads (external coupling terminals) only from the four directions of a lead frame. Thus, the BGA has an advantage in that it is suitable for miniaturization with respect to an increase in the external coupling terminal with high integration and high functioning of the semiconductor chip as compared with the QFP.

A description will be made of the configuration of each land formed at the back surface of the wiring board in the BGA referred to above. Normally in the BGA, one ends of wirings formed at the back surface of the wiring board are coupled to their corresponding vias that penetrate the wiring board, and the lands are coupled to the other ends of the wirings respectively. At this time, a solder resist is applied onto the back surface of the wiring board so as to cover the lands, and openings are formed or defined in the solder resist so as to expose the lands. The lands are separated into an SMD (Solder Mask Defined) and an NSMD (Non Solder Mask Defined) according to the relationship between the diameter of the opening and the diameter of the land.

The SMD is called a structure in which the diameter of the opening is smaller than that of the land and the opening is internally contained in the land in plan view. The NSMD is called a structure in which the diameter of the opening is larger than the diameter of the land and the land is internally included in the opening in plan view. That is, in the SMD, the ends of the lands are covered with the solder resist and each of the openings each smaller in area than the area of the land is formed in the center of the land. On the other hand, in the NSMD, the lands are exposed from the openings over the entirety thereof. Although such a configuration that the structure of the land is brought to the SMD and NSMD exists in the BGA, the NSMD is superior to the SMD in terms of an improvement in the adhesion between each of the lands and its corresponding solder ball. This reason will be explained. Since each of the openings is internally contained in the land in the case of the SMD, the area for each land exposed from the opening is only its upper surface. On the other hand, since each of the lands is exposed from the opening over its entirety in the case of the NSMD, the side surface of each land is also exposed from the opening as well as the upper surface of the land. Namely, the land is formed of, for example, a metal film. However, in the case of the MSD, only the surface of the metal film is exposed, whereas in the case of the NSMD, the side surface of the metal film in its thickness direction is also exposed as well as the surface of the metal film. Thus, the NSMD is larger in exposed area than the SMD and the area at which each land makes contact with its corresponding solder ball mounted on the land becomes larger. From this respect, the NSMD can be improved in the adhesion to each solder ball as compared with the SMD. Namely, it can be said that it is desired to use the NSMD rather than the SMD when an improvement in the strength of adhesion or bonding between the land and the solder ball is taken into consideration.

However, the NSMD involves problems shown below. As a result of that the diameter of the opening becomes larger than that of the land, some of the wirings coupled to the lands are also exposed from the openings as well as the lands in the NSMD. When the opening defined by opening the solder resist is formed with being shifted with respect to the land in this case, for example, the area of the wiring exposed from the opening changes. Namely, even if the above shift is a small shift or displacement corresponding to such an extent that the opening can include the land internally, the area of the wiring exposed from the opening changes. At this time, the exposed area at which the land and the wiring exposed from the opening are aligned differ every opening. In doing so, the exposed area of the land brought into contact (wet) with the solder ball changes every opening. As a result, the height of the solder ball differs every opening. A plurality of solder balls mounted onto the back surface of the wiring board vary greatly in height. When the variations in the height of the solder ball increase, there is a risk of occurrence in mounting failure when the wiring board is mounted onto its corresponding motherboard.

Therefore, the land for the SMD is used without using that for the NSMD from the viewpoint of ensuring reliability of mounting between the wiring board and the motherboard under the current circumstances. Since, however, the strength of adhesion or bonding between the land and the solder ball becomes weak in the SMD, it is not possible to avoid the degradation in coupling life where the BGA is mounted onto the motherboard. Namely, since the strength of bonding between the land and the solder ball can be made strong in the NSMD rather than the SMD, the life of coupling between the BGA and the motherboard can be lengthened in the NSMD rather than the SMD. Thus, if the variations in the height of the solder ball corresponding to the problem of the NSMD can be suppressed, then the advantage that the NSMD is used can be obtained.

An object of the present invention is to enhance the characteristic of a semiconductor device and particularly provide a technique capable of suppressing variations in the height of each solder ball where an NSMD is used as a structure for each land.

The above and other objects and novel features of the present invention will become apparent from the description of the present specification and the accompanying drawings.

Summaries of representative ones of the inventions disclosed in the present application will be explained in brief as follows:

A semiconductor device according to a typical embodiment comprises (a) a wiring board, (b) a semiconductor chip mounted over a first surface of the wiring board, and (c) a plurality of wires which respectively couple a plurality of electrodes formed at the wiring board and a plurality of bonding pads formed at the semiconductor chip. Here, the wiring board includes (a1) the electrodes formed at the first surface of the wiring board, (a2) a plurality of first lands formed at the first surface of the wiring board and provided so as not to overlap with the electrodes in plan view, and (a3) a plurality of first wirings which are formed at the first surface of the wiring board and electrically couple the electrodes and the first lands respectively. Further, the wiring board has (a4) a plurality of vias which are respectively formed so as to be internally contained in the first lands in plan view and extend through the wiring board, and (a5) a plurality of second lands which are formed at a second surface corresponding to a surface opposite to the first surface of the wiring board and formed so as to internally contain the vias in plan view and which are electrically coupled to the vias respectively. The wiring board has (a6) a protective film formed at the second surface of the wiring board and having a plurality of first openings being larger in area than the second lands respectively and internally containing the second lands respectively, and (a7) a plurality of first protruded electrodes respectively provided at the first openings defined in the protective film and electrically coupled to the second lands respectively.

A method for manufacturing a semiconductor device according to a typical embodiment comprises the steps of (a) mounting a semiconductor chip over a first surface of a wiring board, and (b) coupling a plurality of electrodes formed at the wiring board and a plurality of bonding pads formed at the semiconductor chip by a plurality of wires respectively. Further, the method includes the steps of (c) sealing the semiconductor chip mounted over the first surface of the wiring board with a resin, and (d) applying solder paste onto a second surface opposite to the first surface of the wiring board via a mask thereby to form a plurality of first protruded electrodes. Here, the wiring board prepared before the step (a) is formed with the electrodes formed at the first surface of the wiring board, a plurality of first lands formed at the first surface of the wiring board and provided so as not to overlap with the electrodes in plan view, and a plurality of first wirings which are formed at the first surface of the wiring board and electrically couple the electrodes and the first lands respectively. Further, a plurality of vias which are respectively formed so as to be internally contained in the first lands in plan view and extend through the wiring board, and a plurality of second lands which are formed at the second surface corresponding to a surface opposite to the first surface of the wiring board and formed so as to internally contain the vias in plan view and which are electrically coupled to the vias respectively, are formed at the wiring board. A protective film formed at the second surface of the wiring board and having a plurality of first openings being larger in area than the second lands respectively and internally containing the second lands respectively is formed at the wiring board. At this time, the step (d) forms the first protruded electrodes in such a manner that they are electrically coupled to the second lands via the first openings defined in the protective film respectively.

An advantageous effect obtained by a typical one of the inventions disclosed in the present application will be explained in brief as follows:

When an NSMD is used as a structure for each land, variations in the height of each solder ball can be suppressed.

BRIEF DESCRIPTION OF THE DRAWINGS

FIG. 20 is a sectional view cut along line A-A of FIG. 19;

FIG. 21A is a diagram showing an NSMD formed with an opening normally with respect to a land in the land on via structure according to the first embodiment;

FIG. 21B is a diagram showing an NSMD formed with an opening with being shifted downward as viewed on the sheet with respect to a land in the land on via structure according to the first embodiment;

FIG. 21C is a diagram showing an NSMD formed with an opening with being shifted upward as viewed on the sheet with respect to a land in the land on via structure according to the first embodiment;

FIG. 26 is a table showing a result of measurements of resistance to a half ball LGA and a BGA;

DETAILED DESCRIPTION OF THE PREFERRED EMBODIMENTS

Figure 1:
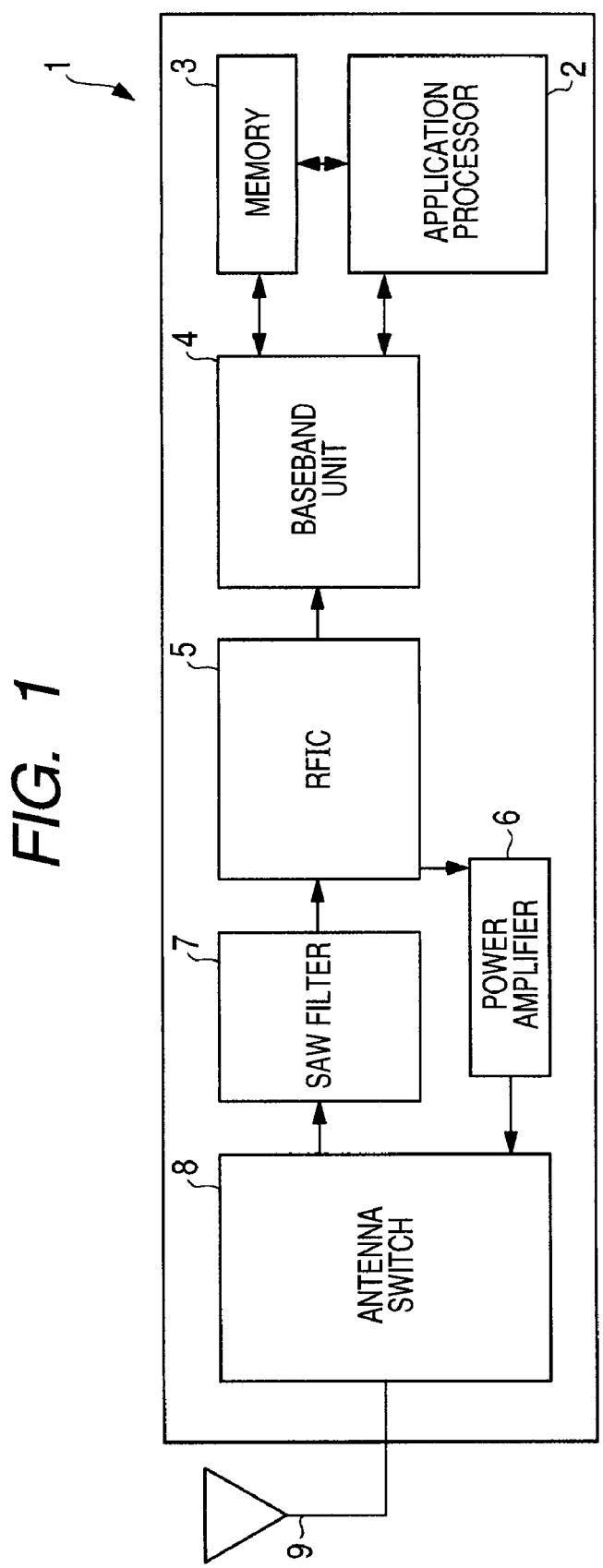
FIG. 1 is a block diagram showing a configuration of a transceiver unit of a cellular phone.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

The same reference numerals are respectively attached to the same components or members in all the drawings for describing the embodiments in principle, and their repetitive explanations will be omitted. Incidentally, some hatching might be provided to make it easy to view the drawings even in the case of plan views.

First Embodiment

FIG. 1 is a block diagram showing a configuration of a transceiver unit of a cellular phone. As shown in FIG. 1, the cellular phone 1 has an application processor 2, a memory 3, a baseband unit 4, an RFIC 5, a power amplifier 6, a SAW (Surface Acoustic Wave) filter 7, an antenna switch 8 and an antenna 9.

The application processor 2 comprises, for example, a CPU (Central Processing Unit) and has the function of realizing an application function of the cellular phone 1. Described concretely, the application processor 2 reads an instruction from the memory 3, decodes it and performs various arithmetic operations and control, based on the result of decoding thereby to realize the application function. The memory 3 has the function of storing data therein and stores therein, for example, a program for operating the application processor 2 and processing data at the application processor 2. Further, the memory 3 is capable of obtaining access not only to the application processor 2 but also to the baseband unit 4 and can be used even for the storage of data processed at the baseband unit.

The baseband unit 4 has a CPU corresponding to a central control unit built therein. The baseband unit 4 digitally processes a voice or audio signal (analog signal) from a user (calling party) via an operation unit upon transmission to make it possible to generate a baseband signal. On other hand, the baseband unit 4 is capable of generating an audio signal from the baseband signal corresponding to a digital signal.

The RFIC 5 is capable of modulating the baseband signal upon transmission to generate a radio frequency signal and demodulating a receive signal upon reception to generate a baseband signal. The power amplifier 6 is of a circuit which newly generates a high power signal analogous to a weak input signal by power supplied from a power supply or source. The SAW filter 7 allows only signals lying in a predetermined frequency band from the receive signal to pass therethrough.

The antenna switch 8 is provided to separate the receive signal inputted to the cellular phone 1 and a transmit signal outputted from the cellular phone 1 from each other. The antenna 9 is provided to transmit and receive a radio wave.

The cellular phone 1 is configured in the above-described manner. The operation thereof will be explained below in brief. A description will first be made of a case in which a signal is transmitted. A baseband signal generated by digitally processing an analog signal such as an audio signal by means of the baseband unit 4 is inputted to the RFIC 5. The RFIC 5 converts the baseband signal to a signal of a radio frequency (RF (Radio Frequency) frequency) by a modulation signal source and a mixer. The signal converted to the RF signal is outputted from the RFIC 5 to the power amplifier (RF module) 6. The RF signal inputted to the power amplifier 6 is amplified by the power amplifier 6 and thereafter transmitted through the antenna 9 via the antenna switch 8.

A description will next be made of a case in which a signal is received. The RF signal (received signal) received by the antenna 9 passes through the SAW filter 7 and is thereafter inputted to the RFIC 5. The RFIC 5 amplifies the received signal and thereafter performs its frequency conversion by the modulation signal source and the mixer. Then, the frequency-converted signal is detected to extract a baseband signal. Thereafter, the baseband signal is outputted from the RFIC 5 to the baseband unit 4. The baseband signal is processed by the baseband unit 4 from which an audio signal is outputted.

As described above, the RFIC 5 has the functions of modulating the baseband signal to generate the RF signal when the transmit signal is transmitted from the cellular phone 1 and demodulating the RF signal to generate the baseband signal when the receive signal is received from the cellular phone 1. The configuration of the RFIC 5 having such functions will next be explained.

Figure 2:
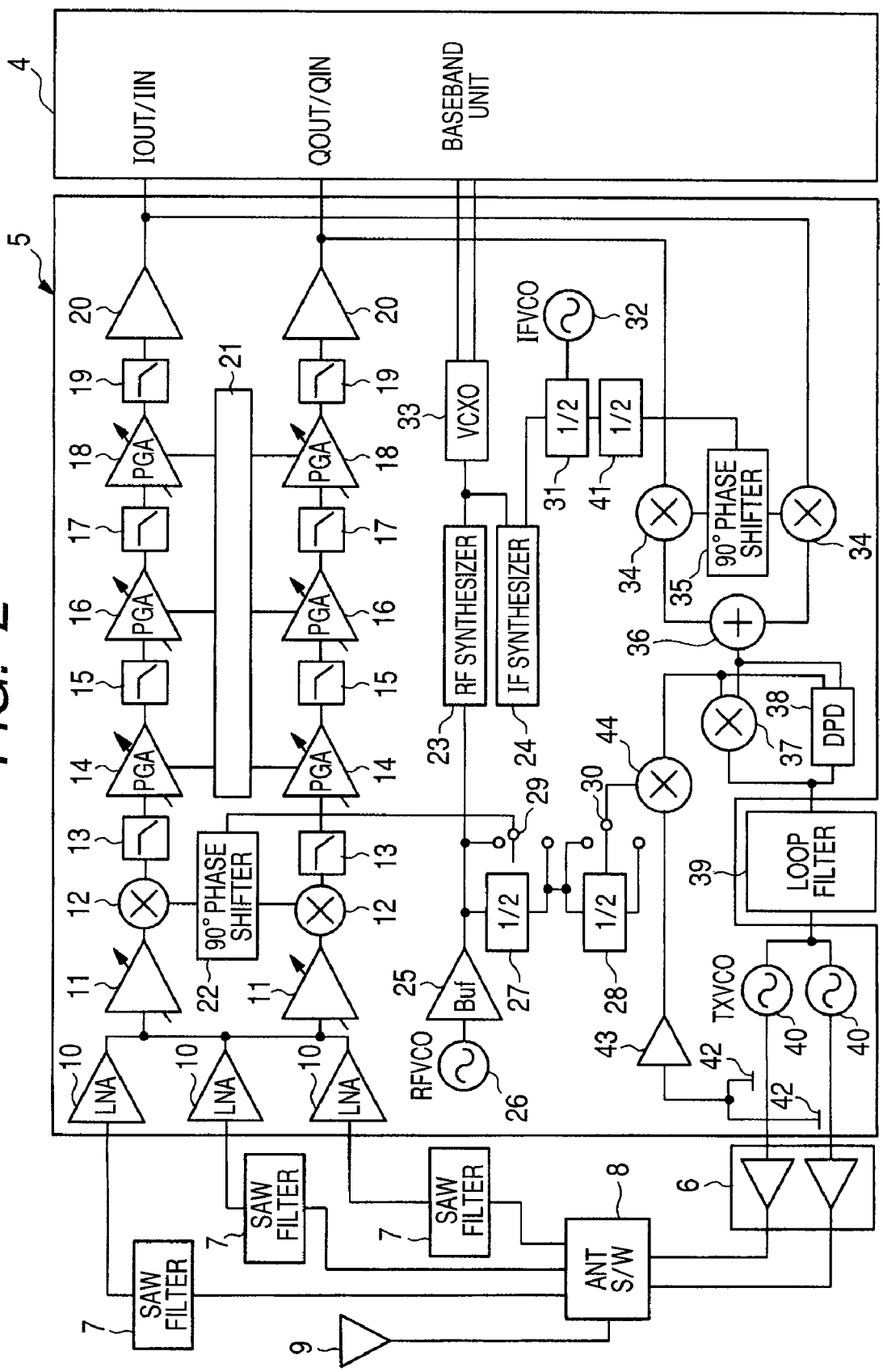
FIG. 2 is a block diagram for describing the function of an RFIC.

FIG. 2 is a block diagram for describing the functions of the RFIC 5. The cellular phone according to a first embodiment of the present application performs, for example, triple-band signal processing. The cellular phone is capable of performing signal processing of, for example, a 900 MHz-band GSM communication system, a 1800 MHz-band DCS1800 communication system and a 1900 MHz-band PCS1900 communication system. The RFIC 5 that performs such triple-band signal processing is shown in FIG. 2.

A receiving circuit and a transmitting circuit are formed in the RFIC 5 shown in FIG. 2. The configuration of the receiving circuit will first be explained. The receiving circuit of the RFIC 5 is disposed through an antenna 9, an antenna switch 8 and three SAW filters 7 coupled in parallel to the antenna switch 8. Described concretely, the receiving circuit of the RFIC 5 has three low noise amplifiers (LNAs) 10 respectively coupled to the SAW filters 7, and two variable amplifiers 11 respectively coupled to the three LNAs 10 and coupled in parallel to each other. Mixers 12, low-pass filters 13, PGAs (Programmable Gain Amplifiers) 14, low-pass filters 15, PGAs 16, low-pass filters 17, PGAs 18, low-pass filters 19 and demodulators 20 are coupled to the two variable amplifiers 11 respectively. The PGAs 14, PGAs 16 and PGAs 18 are controlled by an ADC/DAC & DC offset control logic circuit unit 21. Further, the phases of the two mixers 12 are controlled by a 90° phase shifter (90° phase converter) 22.

While I/Q modulators each comprised of the 90° phase shifter and the two mixers 12 are respectively provided corresponding to the three LNAs 10 to correspond to respective bandwidths, they are shown in one integrated form for simplification in FIG. 2.

A synthesizer comprised of an RF synthesizer 23 and an IF (Intermediate Frequency) 24 is provided in the RFIC 5 as a signal processing IC. The RF synthesize 23 is coupled to an RFVCO (Radio Frequency Voltage-Controlled Oscillator) 26 via a buffer 25 and controls it in such a manner that the RFVCO 26 outputs an RF local signal. Two local signal dividers 27 and 28 are coupled in series to the buffer 25 and have output ends or terminals to which switches 29 and 30 are coupled respectively. The RF local signal outputted from the RFVCO 26 is inputted to the 90° phase shifter 22 by switching of the switch 29. The 90° phase shifter 22 controls each mixer 12 in accordance with the RF local signal.

The IF synthesizer 24 is coupled to an IFVCO (Intermediate-Frequency Voltage-Controlled Oscillator) 32 via a divider 31 and controls it in such a manner that the IFVCO 32 outputs an IF local signal. A VCXO (Voltage-Controlled Xtal or crystal Oscillator) 33 is controlled by the RF synthesizer 23 and the IF synthesizer 24 thereby to output a reference signal, followed by being outputted to the baseband unit 4.

In the receiving circuit of the RFIC 5, an RF signal having passed through each SAW filter 7 is amplified by its corresponding LNA 10 and variable amplifier 11 and thereafter converted to an intermediate frequency signal by the corresponding mixer 12. The mixer 12 is controlled by the 90° phase shifter 22, based on the RF local signal outputted from the RFVCO 26 controlled by the RF synthesizer 23. Subsequently, the intermediate frequency signal converted by the mixer 12 is amplified by the PGAs 14, 16 and 18. At this time, the PGAs 14, 16 and 18 have been controlled by the ADC/DA & offset control logic circuit unit 21. The amplified intermediate frequency signal is converted to baseband signals (I and Q signals) by the demodulator 20, which in turn are outputted to the baseband unit 4. The receiving circuit of the RFIC 5 is operated in this way.

The configuration of the transmitting circuit will next be described. The transmitting circuit of the RFIC 5 has two mixers 34 which respectively receive the I and Q signals outputted from the baseband unit 4 as input signals, and a 90° phase shifter 35 that controls the phases of the two mixers 34. Further, the transmitting circuit has an adder 36 which adds signals outputted from the two mixers 34, and a mixer 37 and a DPD (Digital Phase Detector) 38 each of which receives a signal outputted from the adder 36 as an input signal. The transmitting circuit has a loop filter 39 which inputs together the output signals of the mixer 37 and the DPD 38, and two TXVCOs (Transmission Xtal Voltage-Controlled Oscillators) 40 which input together signals outputted from the loop filter 39.

A quadrature modulator is configured by the mixers 34, the 90° phase shifter 35 and the adder 36. The 90° phase shifter 35 is coupled to its corresponding divider 31 via a divider 41 and controlled by an IF local signal outputted from the IFVCO 32.

Signals outputted from the two TXVCOs 40 are respectively detected by couplers 42 as current values. The signals detected by the couplers 42 are inputted to a mixer 44 via an amplifier 43. The mixer 44 is controlled by the RF local signal outputted from the RFVCO 26 via the switch 30. A signal outputted from the mixer 44 is inputted to the mixer 37 and the DPD 38 together with the output signal of the adder 36. The mixer 37 and the DPD 38 configure an offset PLL (Phase-Locked Loop) circuit.

In the transmitting circuit of the RFIC 5, the I and Q signals (baseband signals) outputted from the baseband unit 4 are modulated by the quadrature modulator. Thereafter, the I and Q signals are converted to RF signals through the offset PLL circuit and the TXVCO 40. The RF signals are amplified by the power amplifier 6, followed by being transmitted from the antenna 9 via the antenna switch 8. The transmitting circuit of the RFIC 5 is operation in this way. While the two TXVCOs 40 have been described in FIG. 2, the TXVCO 40 corresponding to one of the two TXVCOs 40 is one used for a GSM communication system, and the frequency of its output signal ranges from 880 MHz to 915 MHz, for example. On the other hand, the other TXVCO 40 is one used for DCS and PCS communication systems, and the frequency of its output signal ranges from 1710 MHz to 1785 MHz or 1850 MHz to 1910 MHz. Thus, in the first embodiment of the present application, the power amplifier 6 that amplifies the signals outputted from the RFIC 5 builds a high-frequency amplifier and a low-frequency amplifier therein. Namely, the power amplifier 6 amplifies a signal ranging from 880 MHz to 915 MHz at the low-frequency amplifier and amplifies a signal ranging from 1710 MHz to 1785 MHz or 1850 MHz to 1910 MHz at the high-frequency amplifier.

As described above, the RFIC 5 has the functions of modulating and demodulating the transmit/receive signals. A modem circuit for realizing the functions and the like are formed in a semiconductor chip. A layout of a semiconductor chip formed with an integrated circuit for realizing the functions of the RFIC 5 will be explained below.

Figure 3:
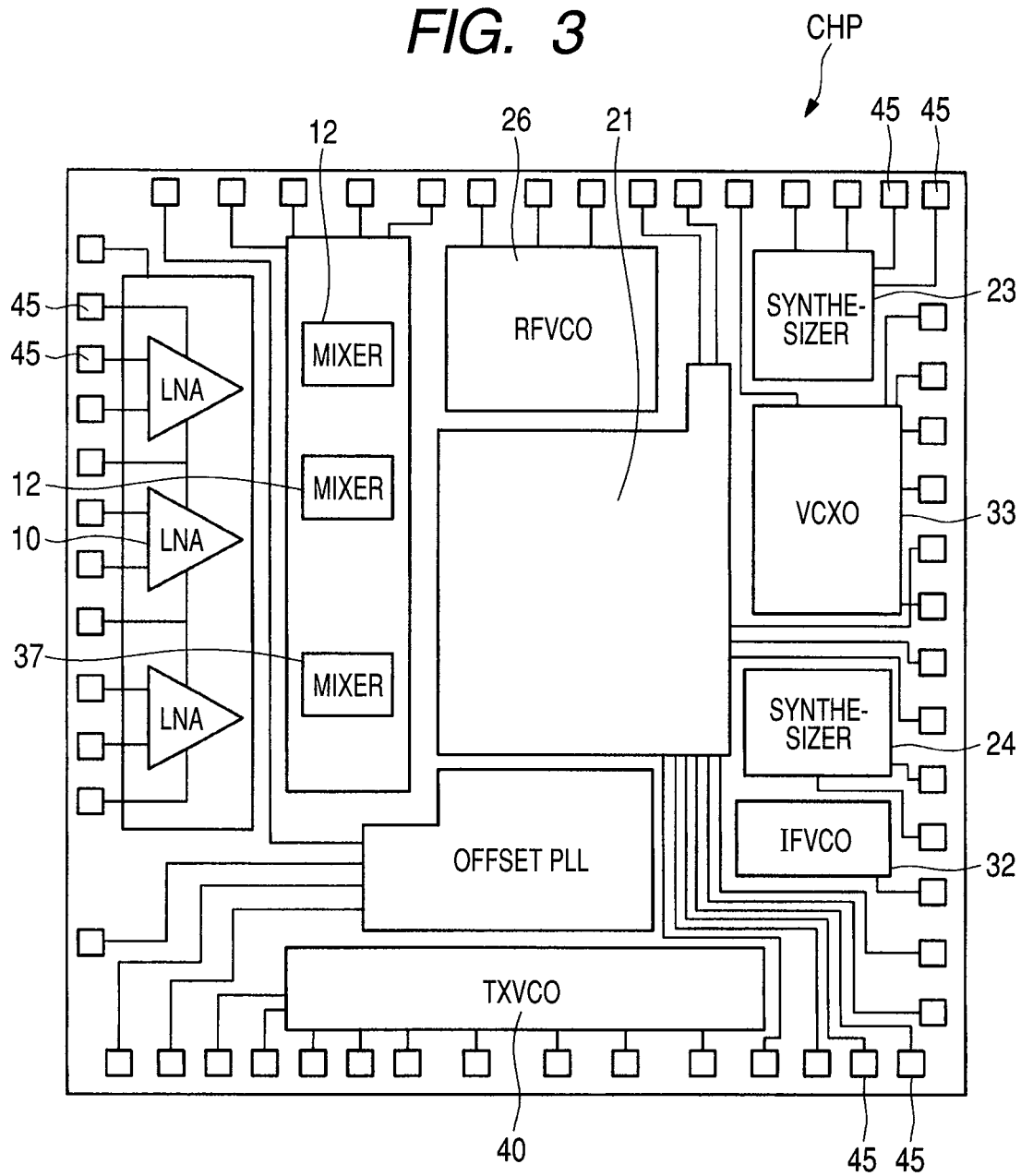
FIG. 3 is a diagram illustrating a layout configuration of a semiconductor chip formed with the RFIC.

FIG. 3 is a diagram showing a layout configuration of a semiconductor chip CHP formed with the RFIC 5. As shown in FIG. 3, the semiconductor chip CHP has a rectangular form and includes pads 45 disposed along its four sides. An integrated circuit for realizing the functions of the RFIC 5 is formed in an area lying inside an area in which the pads 45 are formed. Described concretely, for example, an ADC/DAC & offset control logic circuit unit 21 is formed in the central part of the semiconductor chip CHP. Mixers 12 and a mixer 37 and three LNAs 10 are formed side by side on the left side of the area. An RFVCO 26 is formed in an area lying on the upper side of the area formed with the ADC/DAC & offset control logic circuit unit 21. An RF synthesizer 23, a VCXO 33, an IF synthesizer 24 and an IFVCO 32 are formed on the right side of the area formed with the ADC/DAC & offset control logic circuit unit 21 from top down. Further, an offset PLL (circuit) and a TXVCO 40 are formed on the lower side of the area formed with the ADC/DAC & offset control logic circuit unit 21. The integrated circuit for realizing the functions of the RFIC 5 is formed in the semiconductor chip CHP in this way.

Figure 4:
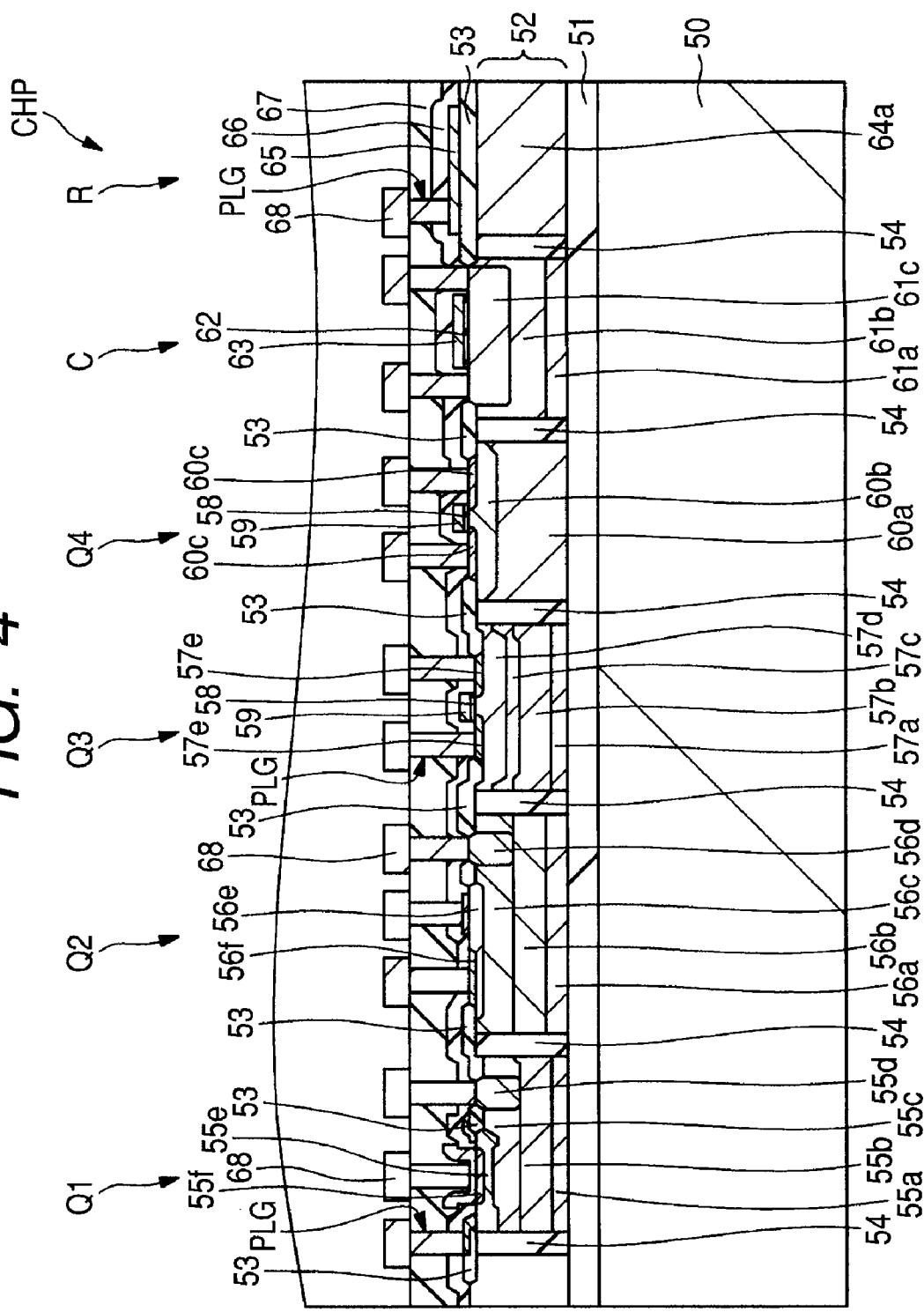
FIG. 4 is a sectional view showing a typical section of a semiconductor chip.

While the integrated circuit for realizing the functions of the RFIC 5 is formed in the semiconductor chip CHP, elements that configure the integrated circuit will next be explained. FIG. 4 is a sectional view showing a typical section of the semiconductor chip CHP. As shown in FIG. 4, for example, an embedded insulating film 51 is formed over a semiconductor substrate 50 with a p-type impurity implanted therein. A silicon layer 52 is formed over the embedded insulating film 51. The respective elements are formed in the silicon layer 52. Namely, in the first embodiment of the present application, the elements are formed over an SOI (Silicon On Insulator) substrate comprised of the semiconductor substrate 50, embedded insulating film 51 and silicon layer 52. As the elements formed in the SOI substrate, for example, an NPN bipolar transistor Q1, a PNP bipolar transistor Q2, a p channel type MISFET (Metal Insulator Semiconductor Field Effect Transistor) Q3, an n channel type MISFET Q4, a capacitive element C and a resistive element R are formed from left to right in FIG. 4. The respective elements are separated by a device or element isolation region 53 comprised of LOCOS (Local Oxidation of Silicon), for example. Further, trenches 54 that extend from the element isolation region 53 to the embedded insulating film 51 are formed. An insulating film is embedded into the trenches 54, whereby respective element forming areas are electrically separated from one another.

The configuration of each element will be explained below. The configuration of the NPN bipolar transistor Q1 will first be explained. As shown in FIG. 4, an n-type semiconductor region 55a obtained by introducing an n-type impurity such as phosphorus (P) or arsenic (As) into the silicon layer 52 formed over the embedded insulating film 51 is formed in an area for forming the NPN bipolar transistor Q1. An $n^+$-type semiconductor region 55b is formed over the n-type semiconductor region 55a. The $n^+$-type semiconductor region 55b is implanted with the n-type impurity in a concentration higher than that of the n-type semiconductor region 55a. Subsequently, an n-type semiconductor region 55c is formed over the $n^+$-type semiconductor region 55b. An $n^+$-type semiconductor region 55d is formed so as to extend from part of the surface of the n-type semiconductor region 55c to the $n^+$-type semiconductor region 55b. At this time, the $n^+$-type semiconductor region 55b becomes a collector region of the NPN bipolar transistor Q1, and the $n^+$-type semiconductor region 55d becomes a collector lead-out region. Further, a p-type semiconductor region 55e is formed over part of the n-type semiconductor region 55c, and an $n^+$-type semiconductor region 55f is formed over the surface of the p-type semiconductor region 55e. The p-type semiconductor region 55e becomes a base region of the NPN bipolar transistor Q1, and the $n^+$-type semiconductor region 55f becomes an emitter region of the NPN bipolar transistor Q1. The NPN bipolar transistor Q1 is formed in the silicon layer 52 in this way. An interlayer insulating film comprised of a laminated or stacked film of a silicon nitride film 66 and a silicon oxide film 67 is formed over the silicon layer 52. Plugs PLG are formed so as to extend through the interlayer insulating film. The plugs PLG include one electrically coupled to the $n^+$-type semiconductor region 55d used as the collector lead-out region, and one electrically coupled to the p-type semiconductor region 55e used as the base region. Further, a plug PLG electrically coupled to the $n^+$-type semiconductor region 55f used as the emitter region also exists. Wirings 68 are formed over the interlayer insulating film. The wirings 68 are electrically coupled to their corresponding plugs PLG. Thus, the collector, base and emitter regions of the NPN bipolar transistor Q1 can be electrically coupled to other elements by the wirings 68.

The configuration of the PNP bipolar transistor Q2 will subsequently be explained. As shown in FIG. 4, an n-type semiconductor region 56a obtained by introducing the n-type impurity such as phosphorus (P) or arsenic (As) into the silicon layer 52 formed over the embedded insulating film 51 is formed in an area for forming the PNP bipolar transistor Q2. A $p^+$-type semiconductor region 56b is formed over the n-type semiconductor region 56a. The $p^+$-type semiconductor region 56b is implanted with a p-type impurity such as boron (B) in a high concentration. Subsequently, a p-type semiconductor region 56c is formed over the $p^+$-type semiconductor region 56b. The p-type semiconductor region 56c is smaller than the $p^+$-type semiconductor region 56b in the concentration of the p-type impurity. A $p^+$-type semiconductor region 56d is formed so as to extend from part of the surface of the p-type semiconductor region 56c to the $p^+$-type semiconductor region 56b. At this time, the $p^+$-type semiconductor region 56b becomes a collector region of the PNP bipolar transistor Q2, and the $p^+$-type semiconductor region 56d becomes a collector lead-out region. Further, an n-type semiconductor region 56e is formed over part of the p-type semiconductor region 56c, and a p-type semiconductor region 56f is formed over the surface of the n-type semiconductor region 56e. The n-type semiconductor region 56e becomes a base region of the PNP bipolar transistor Q2, and the p-type semiconductor region 56f becomes an emitter region of the PNP bipolar transistor Q2. The PNP bipolar transistor Q2 is formed in the silicon layer 52 in this way. The interlayer insulating film comprised of the laminated or stacked film of the silicon nitride film 66 and silicon oxide film 67 is formed over the silicon layer 52. Plugs PLG are formed so as to extend through the interlayer insulating film. The plugs PLG include one electrically coupled to the $p^+$-type semiconductor region 56d used as the collector lead-out region, and one electrically coupled to the n-type semiconductor region 56e used as the base region. Further, a plug PLG electrically coupled to the p-type semiconductor region 56f used as the emitter region also exists. Wirings 68 are formed over the interlayer insulating film. The wirings 68 are electrically coupled to their corresponding plugs PLG. Thus, the collector, base and emitter regions of the PNP bipolar transistor Q2 can be electrically coupled to other elements by the wirings 68.

The configuration of the p channel type MISFET Q3 will next be explained. As shown in FIG. 4, an n-type semiconductor region 57a obtained by introducing the n-type impurity such as phosphorus (P) or arsenic (As) into the silicon layer 52 formed over the embedded insulating film 51 is formed in an area for forming the p channel type MISFET Q3. An $n^+$-type semiconductor region 57b is formed over the n-type semiconductor region 57a. The $n^+$-type semiconductor region 57b is implanted with the n-type impurity in a concentration higher than that of the n-type semiconductor region 57a. An n-type semiconductor region 57c is formed over the $n^+$-type semiconductor region 57b. An n-type semiconductor region 57d is formed over the n-type semiconductor region 57c. The n-type semiconductor region 57d becomes, for example, a well region of the p channel type MISFET Q3. A pair of p-type semiconductor regions 57e spaced a predetermined distance from each other is formed in the surface of the n-type semiconductor region 57d. The pair of p-type semiconductor regions 57e becomes source and drain regions of the p channel type MISFET Q3. A channel region is formed between the source and drain regions. A gate insulating film 58 comprised of, for example, a silicon oxide film is formed over the channel region. A gate electrode 59 comprised of, for example, a polysilicon film is formed over the gate insulating film 58. The p channel type MISFET Q3 is formed in the silicon layer 52 in this way. The interlayer insulating film comprised of the laminated or stacked film of the silicon nitride film 66 and the silicon oxide film 67 is formed over the silicon layer 52. Plugs PLG are formed so as to extend through the interlayer insulating film. The plugs PLG include one electrically coupled to the p-type semiconductor region 57e used as the drain region and one electrically coupled to the p-type semiconductor region 57e used as the source region. Wirings 68 are formed over the interlayer insulating film. The wirings 68 are electrically coupled to their corresponding plugs PLG. Thus, the source and drain regions of the p channel type MISFET Q3 can electrically be coupled to other elements by the wirings 68.

The configuration of the n channel type MISFET Q4 will subsequently be explained. As shown in FIG. 4, an n-type semiconductor region 60a obtained by introducing the n-type impurity such as phosphorus (P) or arsenic (As) into the silicon layer 52 formed over the embedded insulating film 51 is formed in an area for forming the n channel type MISFET Q4. A p-type semiconductor region 60b is formed over the n-type semiconductor region 60a. The p-type semiconductor region 60b is implanted with the p-type impurity such as boron (B) and becomes a well region of the n channel type MISFET Q4. A pair of n-type semiconductor regions 60c spaced a predetermined distance from each other is formed in the surface of the p-type semiconductor region 60b. The pair of n-type semiconductor regions 60c becomes source and drain regions of the n channel type MISFET Q4. A channel region is formed between the source and drain regions. A gate insulating film 58 comprised of, for example, an oxide silicon film is formed over the channel region. A gate electrode 59 comprised of, for example, a polysilicon film is formed over the gate insulating film 58. The n channel type MISFET Q4 is formed in the silicon layer 52 in this way. The interlayer insulating film comprised of the laminated or stacked film of the silicon nitride film 66 and the silicon oxide film 67 is formed over the silicon layer 52. Plugs PLG are formed so as to extend through the interlayer insulating film. The plugs PLG include one electrically coupled to the n-type semiconductor region 60c used as the drain region and one electrically coupled to the n-type semiconductor region 60c used as the source region. Wirings 68 are formed over the interlayer insulating film. The wirings 68 are electrically coupled to their corresponding plugs PLG. Thus, the source and drain regions of the n channel type MISFET Q4 can electrically be coupled to other elements by the wirings 68.

The configuration of the capacitive element C will next be explained. As shown in FIG. 4, an n-type semiconductor region 61a obtained by introducing the n-type impurity such as phosphorus (P) or arsenic (As) in the silicon layer 52 formed over the embedded insulating film 51 is formed in an area for forming the capacitive element C. An n-type semiconductor region 61b is formed over the n-type semiconductor region 61a. Further, an n-type semiconductor region 61c is formed over the n-type semiconductor region 61b. The n-type semiconductor region 61c functions as a lower electrode of the capacitive element C. A capacitive insulating film 62 comprised of, for example, the silicon oxide film is formed over the n-type semiconductor region 61c used as the lower electrode. An upper electrode 63 comprised of, for example, the polysilicon film is formed over the capacitive insulating film 62. The capacitive element C comprising the upper electrode, capacitive insulating film and lower electrode is formed in this way. The interlayer insulating film comprised of the laminated or stacked film of the silicon nitride film 66 and the silicon oxide film 67 is formed over the silicon layer 52. Plugs PLG are formed so as to extend through the interlayer insulating film. The plugs PLG include one electrically coupled to the n-type semiconductor region 61c used as the lower electrode and one (not shown) electrically coupled to the upper electrode 63. Wirings 68 are formed over the interlayer insulating film. The wirings 68 are electrically coupled to their corresponding plugs PLG. Thus, the upper electrode 63 and lower electrode (n-type semiconductor region 61c) of the capacitive element C can be electrically coupled to other elements by the wirings 68.

The configuration of the resistive element R will further be explained. As shown in FIG. 4, an n-type semiconductor region 64a obtained by introducing the n-type impurity such as phosphorus (P) or arsenic (As) into the silicon layer 52 formed over the embedded insulating film 51 is formed in an area for forming the resistive element R. The element isolation region 53 is formed over the n-type semiconductor region 64a. A polysilicon film 65 is formed over the element isolation region 53. The polysilicon film 65 becomes the resistive element R. The interlayer insulating film comprised of the laminated or stacked film of the silicon nitride film 66 and the silicon oxide film 67 is formed over the silicon layer 52. Plugs PLG are formed so as to extend through the interlayer insulating film. The plugs PLG include one electrically coupled to the polysilicon film 65 used as the resistive element R. A wiring 68 is formed over the interlayer insulating film. The wiring 68 is electrically coupled to its corresponding plug PLG. Thus, the polysilicon film 65 that configures the resistive element R can electrically be coupled to other elements by the corresponding wirings 68.

While the typical elements formed in the semiconductor chip CHP have been described above using FIG. 4 (sectional view), these elements are actually combined to form the integrated circuit. That is, the typical elements shown in FIG. 4 are combined thereby to form the integrated circuit for realizing the functions of the RFIC 5 in the semiconductor chip CHP.

The RFIC 5 corresponding to one example of a semiconductor device according to the first embodiment of the present application has the functions of modulating and demodulating transmit/receive signals. A modem circuit for realizing the functions and the like are formed in the semiconductor chip CHP. The semiconductor chip CHP is packaged thereby to complete the RFIC 5 as a product. The packaging of the RFIC 5 results in, for example, a BGA (Ball Grid Array) or a half ball LGA (Land Grid Array). Each of the BGA and the half ball LGA is a sort of IC package, which represents such a form that a metal such as solder is made spherical to dispose external coupling electrodes from the package in the back surface (surface opposite to a chip mounting surface) of a wiring board or substrate in lattice form. This is a sort of surface-mounted package. A mounting configuration of the RFIC 5 will be explained below.

Figure 5:
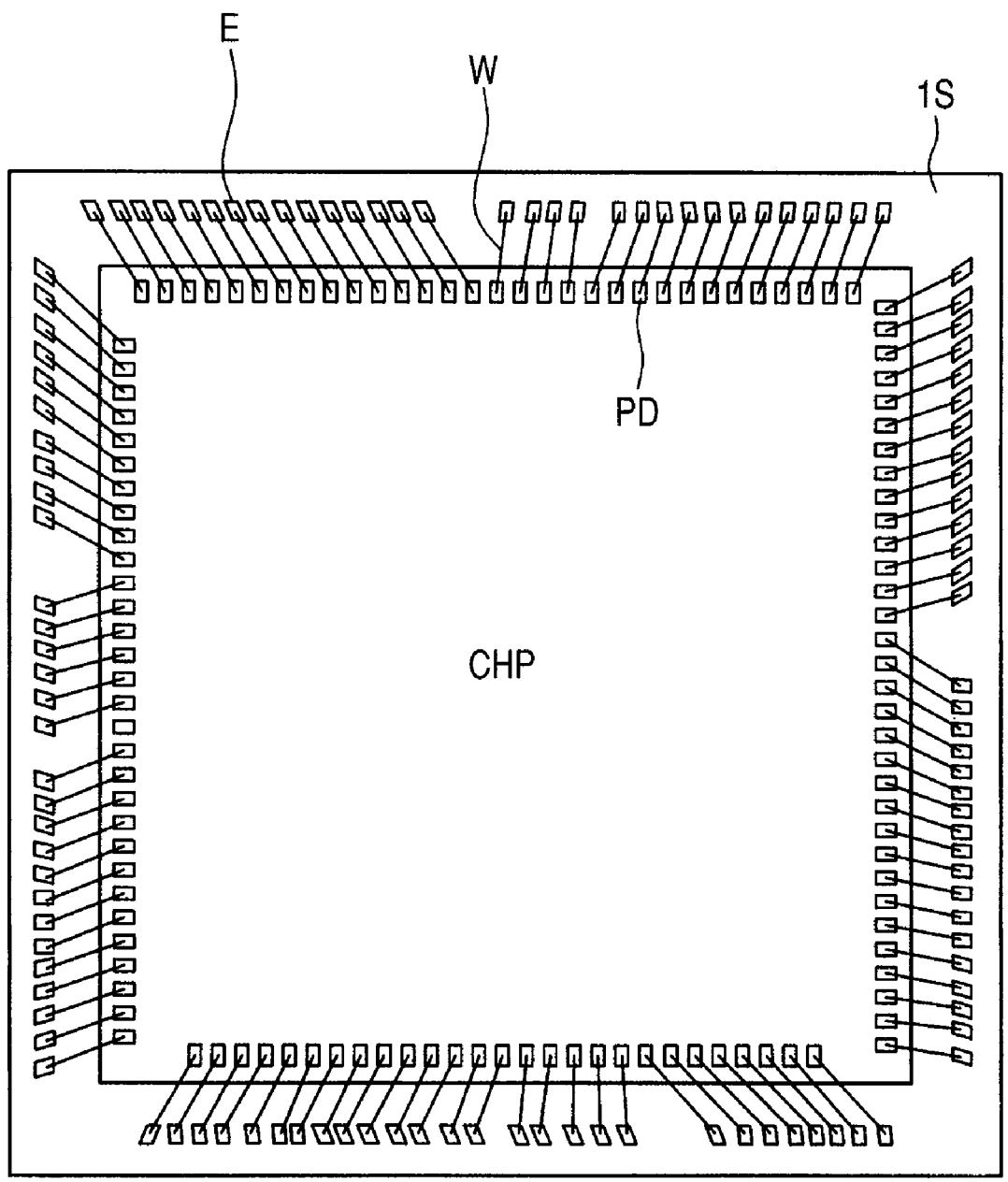
FIG. 5 is a diagram-depicting a package of a semiconductor device according to a first embodiment of the present application.

FIG. 5 is a diagram showing a package of the semiconductor device according to the first embodiment of the present application. As shown in FIG. 5, the semiconductor device according to the first embodiment of the present application has a semiconductor chip CHP mounted over a rectangular wiring board or substrate 1S. The semiconductor chip CHP is shaped in rectangular form and formed with the integrated circuit for realizing the functions of the RFIC. Electrodes E shaped in rectangular form are formed along the four sides of the wiring board. The electrodes E are electrically coupled to pads PD formed along the four sides of the semiconductor chip CHP by wires W respectively. Thus, the semiconductor chip CHP and the wiring board 1S are electrically coupled to each other.

Figure 6:
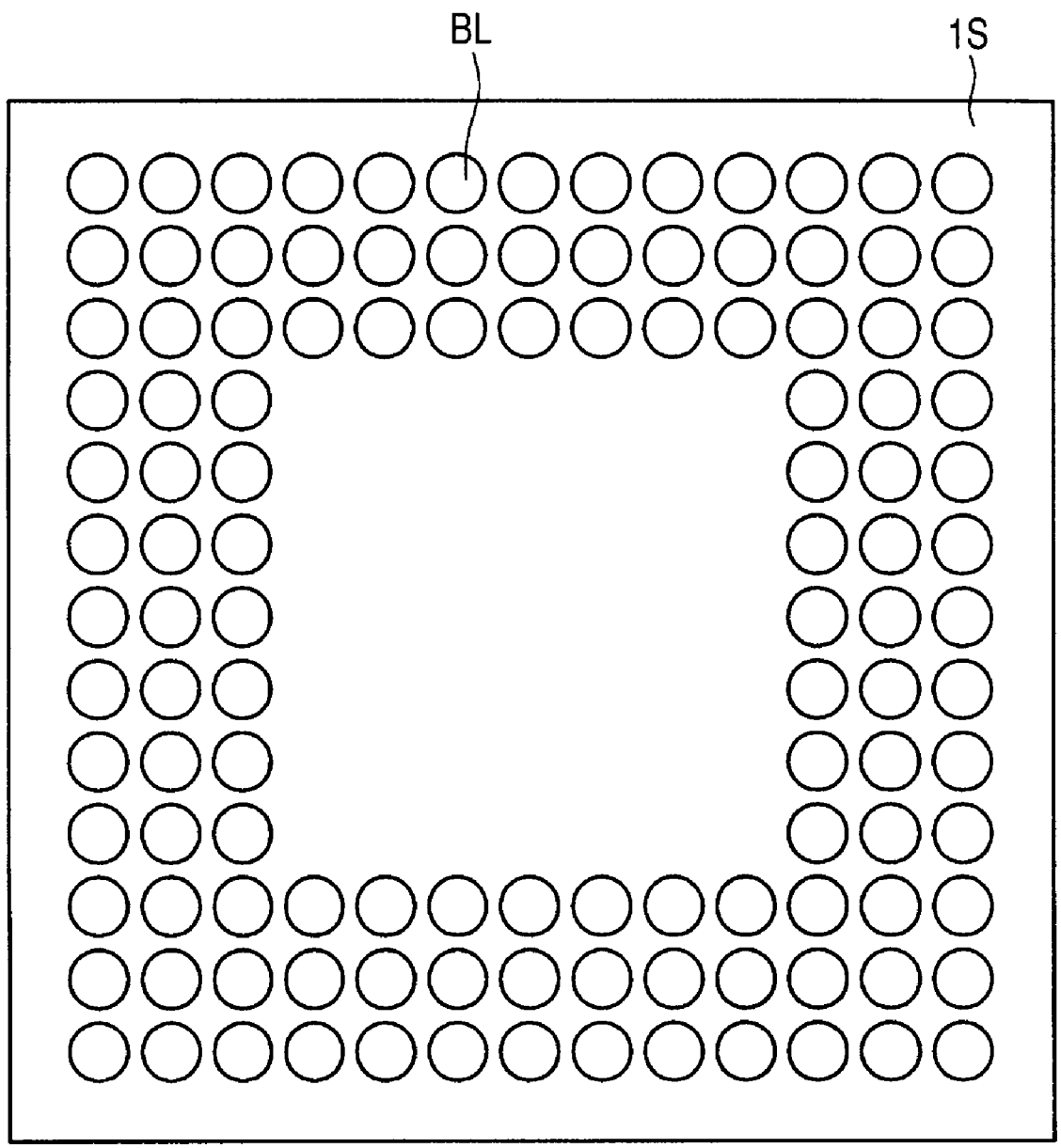
FIG. 6 is a diagram showing a back surface of a wiring board.

Then, FIG. 6 is a diagram showing the back surface of the wiring board 1S. Namely, FIG. 6 is a diagram showing the back surface lying on the side opposite to the surface (chip mounting surface) of the wiring board with the semiconductor chip CHP mounted thereon. As shown in FIG. 6, a plurality of external coupling terminals BL are formed at the back surface of the wiring board 1S. The external coupling terminals BL are disposed in the back surface of the wiring board 1S in lattice form. The external coupling terminals BL shown in FIG. 6 are electrically coupled to their corresponding electrodes E formed at the surface of the wiring board 1S shown in FIG. 5. Thus, input/output signals to the integrated circuit formed in the semiconductor chip CHP are transferred from the pads PD formed at the surface of the wiring board 1S to the electrodes E formed at the surface of the wiring board 1S via the wires W. The input/output signals transferred to the electrodes E formed at the surface of the wiring board 1S are respectively transferred to the external coupling terminals BL formed at the back surface of the wiring board 1S through the electrodes E and, for example, vias that penetrate through the wiring board 1S. That is, the input/output signals to the semiconductor chip CHP are transferred to the outside via the external coupling terminals BL formed at the wiring board 1S.

Figure 7:
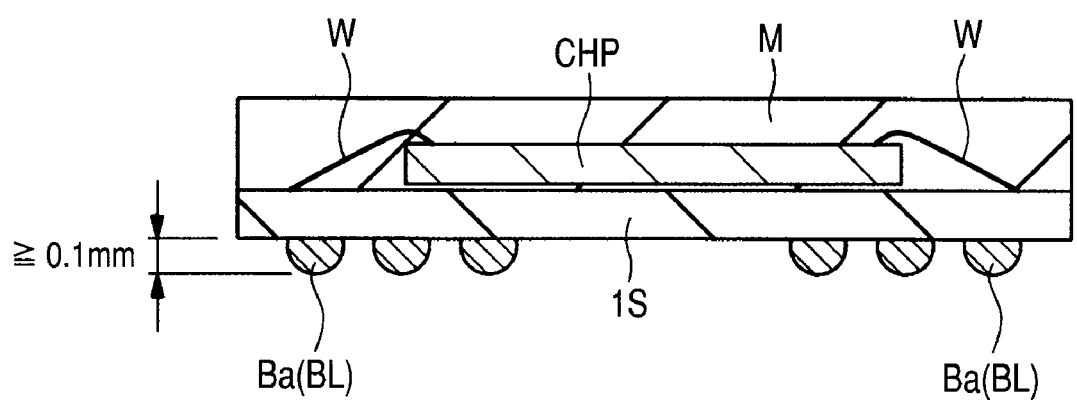
FIG. 7 is a diagram for describing in section one example of a package configuration of the semiconductor device shown in FIGS. 5 and 6.

While the external coupling terminals BL are formed at the back surface of the wiring board 1S in the first embodiment of the present application, a plurality of different package forms are realized depending on the states of the external coupling terminals BL. FIG. 7 is a diagram for describing in section one example of a package form of the semiconductor device shown in FIGS. 5 and 6. As shown in FIG. 7, a semiconductor chip CHP is mounted onto the surface (upper surface) of a wiring board 1S. The semiconductor chip CHP and the wiring board 1S are coupled to each other by wires W. A chip mounting surface (surface) of the wiring board 1S is sealed with a resin M. On the other hand, external coupling terminals BL are formed at the back surface (surface opposite to the chip mounting surface) of the wiring board 1S. In the package form shown in FIG. 7, the external coupling terminals BL are formed of solder balls Ba. The package form shown in FIG. 7 is called BGA (Ball Grid Array). The characteristic of the BGA resides in that the solder balls Ba are formed in such a manner that the height of the solder ball Ba becomes higher than 0.1 mm.

Figure 8:
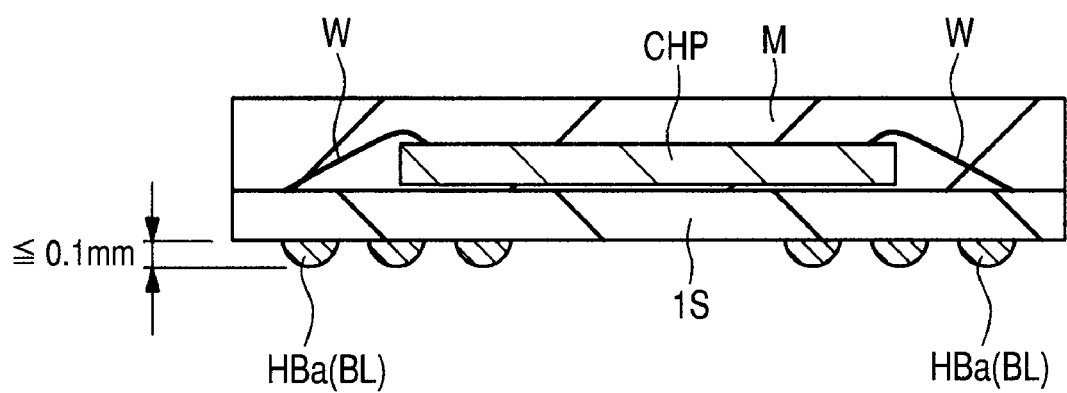
FIG. 8 is a diagram for describing in section one example of a package configuration of the semiconductor device shown in FIGS. 5 and 6.

In contrast, FIG. 8 is also a diagram for describing in section one example of a package form of the semiconductor device shown in FIGS. 5 and 6. Even in the case of the package of the semiconductor device shown in FIG. 8, a semiconductor chip CHP is mounted over the surface (upper surface) of a wiring board 1S. The semiconductor chip CHP and the wiring board 1S are coupled to each other by wires. A chip mounting surface (surface) of the wiring board 1S is sealed with a resin M. On the other hand, external coupling terminals BL are formed at the back surface (surface opposite to the chip mounting surface) of the wiring board 1S. In the package form shown in FIG. 8, the external coupling terminals BL are formed of half balls HBa comprised of solder. The package form shown in FIG. 8 is called half ball LGA (Land Grid Array). The characteristic of the half ball LGA resides in that the half balls HBa are formed in such a manner that the height of each half ball HBa becomes less than or equal to 0.1 mm.

Thus, the package form of the semiconductor device can be divided into the BGA and half ball LGA by the configurations of the external coupling terminals BL. The first embodiment of the present application to be described below will explain the half ball LGA taken by way of example.

Figure 9:
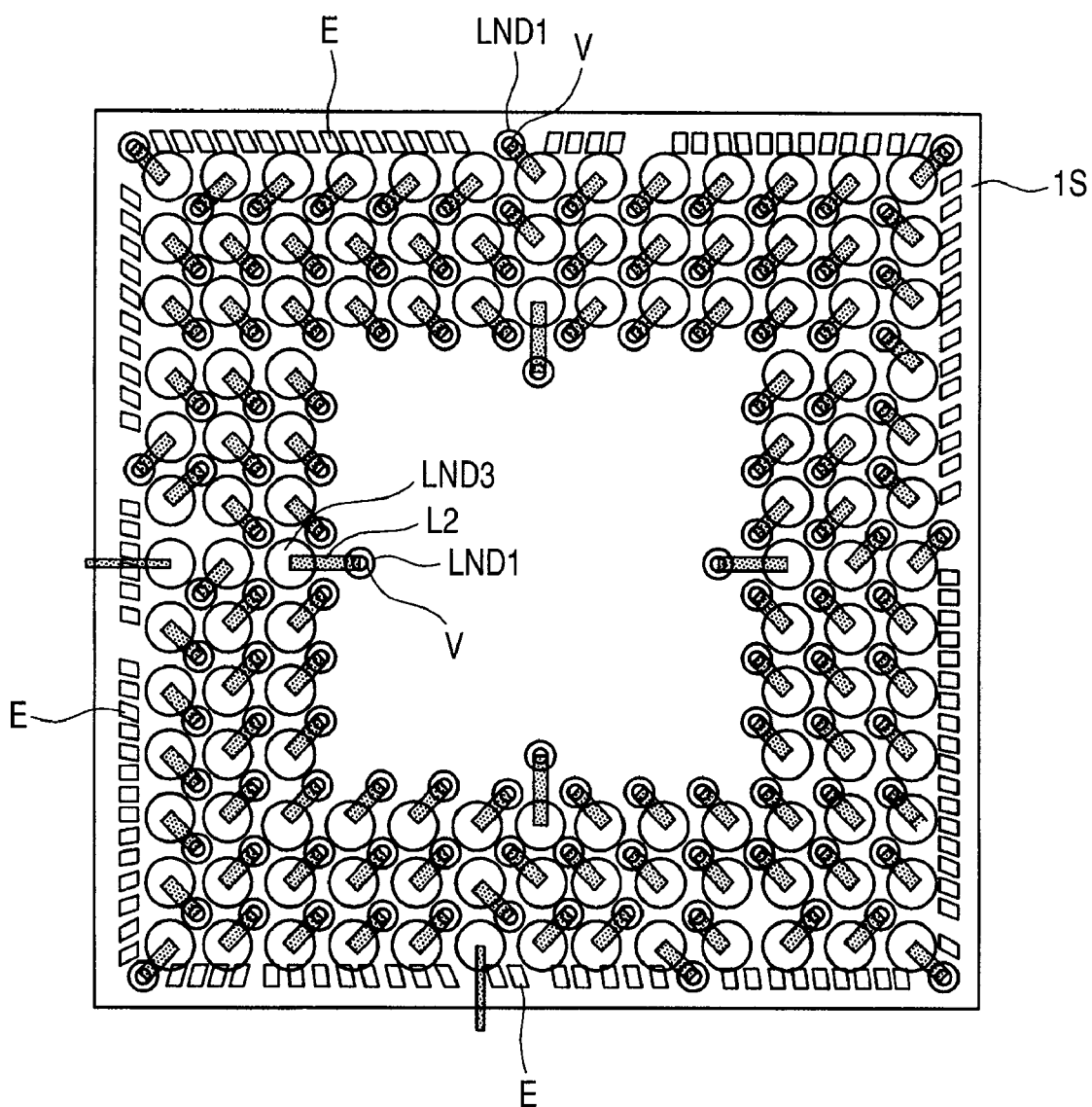
FIG. 9 is a diagram showing a configuration of a wiring board at a half ball LGA discussed by the present inventors et al.

FIG. 9 is a diagram showing a configuration of a wiring board 1S at a half ball LGA discussed by the present inventors. FIG. 9 illustrates, in superimposed form, a configuration of a chip mounting surface (surface) of the wiring board 1S and a configuration of the surface (back surface) opposite to the chip mounting surface of the wiring board 1S. That is, in FIG. 9, electrodes E disposed along the four sides of the wiring board 1S and lands LND1 disposed in an area lying inside the electrodes E in lattice form are components formed at the surface of the wiring board 1S. Since the electrodes E and lands LND1 formed at the surface of the wiring board 1S become complicated in FIG. 9 although coupled to one another by wirings herein, the illustration of the wirings for coupling the electrodes E and the lands LND1 is omitted.

On the other hand, in FIG. 9, wirings L2 and lands LND3 disposed in lattice form are components formed at the back surface of the wiring board 1S. Vias V that penetrate the surface of the wiring board 1S and the back surface of the wiring board 1S are illustrated. It is understood from the above components that the lands LND1 formed at the surface of the wiring board 1S are coupled to the vias V formed directly below the lands LND1. The vias V having reached the back surface of the wiring board 1S are respectively coupled to the wirings L2 formed at the back surface of the wiring board 1S. The wirings L2 are respectively coupled to the lands LND3 formed at the back surface of the wiring board 1S. Although half balls comprised of solder are mounted over the lands LND3 formed at the back surface of the wiring board 1S, the half balls are not illustrated in FIG. 9.

Here, emphasis is placed on the relationship of positions between the vias V and the lands LND3 formed at the back surface of the wiring board 1S in the technology discussed by the present inventors. That is, as shown in FIG. 9, the vias V and the lands LND3 formed at the back surface of the wiring board 1S are disposed with being shifted so as not to overlap in plan view. The vias V and the lands LND3 are formed at the back surface of the wiring board 1S and coupled to one another by the wirings L2. This relationship of positions between the vias V and the lands LND3 is general in the technology discussed by the present inventors.

Although the lands LND3 are formed at the back surface of the wiring board 1S as described above, there are a plurality of forms as the configuration forms of the lands LND3. A description will be made below of the configuration form of each land LND3 formed at the back surface of the wiring board 1S.

Figure 10:
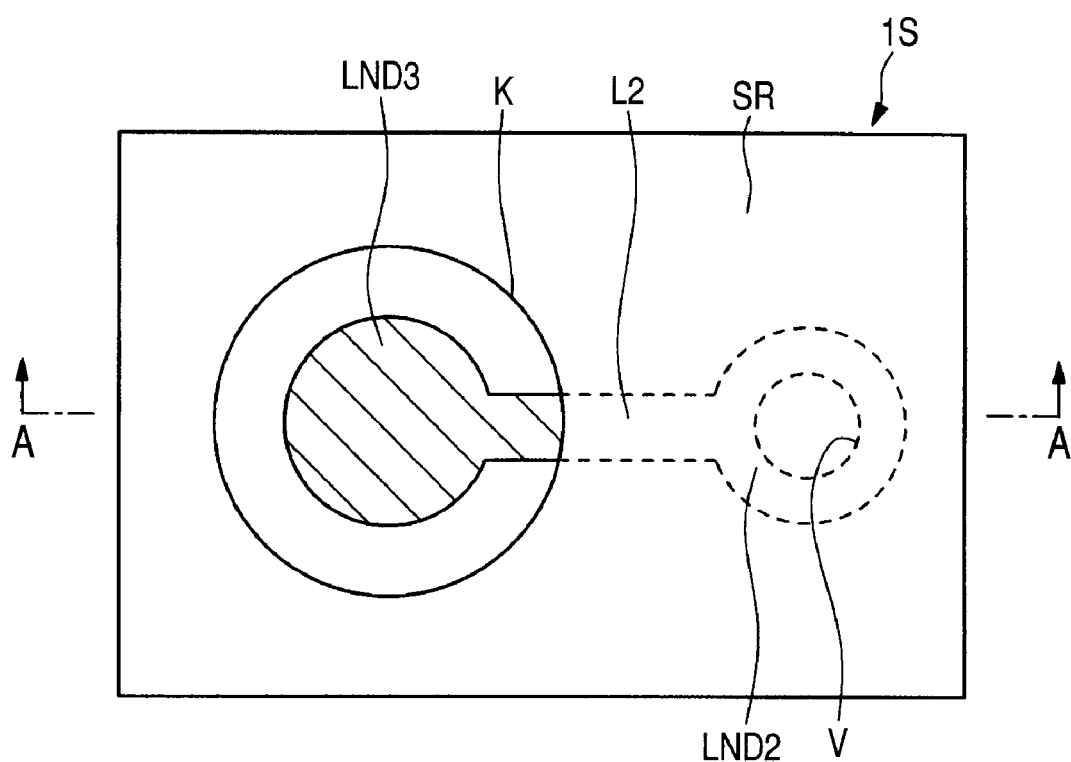
FIG. 10 is a diagram illustrating one example of a configuration form of a land formed at the back surface of a wiring board.

FIG. 10 is a diagram showing one example of a configuration form of a land LND3 formed at the back surface of a wiring board 1S. One land LND3 and one via V formed at the back surface of the wiring board 1S are shown in FIG. 10 in enlarged form. As shown in FIG. 10, the back surface of the wiring board 1S is covered with a solder resist SR. An opening K is defined or formed in the solder resist SR. The land LND3 is disposed so as to be internally included in the opening K. That is, while the opening K and the land LND3 are shaped in circular form, the diameter of the opening K is formed so as to be larger than that of the land LND3. The configuration form of such a land LND3 is called NSMD (Non Solder Mask Defined). It can be said that the NSMD is taken as such a configuration form that the diameter of the land LND3 is smaller than that of the opening K formed in the solder resist SR and the land LND3 is exposed with the entire land LND3 being internally included in the opening K. A wiring L2 is coupled to the land LND3 exposed from the opening K and coupled to its corresponding via V. Described concretely, a land LND2 that internally includes the via V so as to overlap with the via V in plan view is formed at the back surface of the wiring board 1S. The land LND2 and the land LND3 are coupled to each other by the wiring L2. The via V, the land LND2 and part of the wiring L2 are covered with the solder resist SR. On the other hand, since the land LND3 is formed so as to be internally included in the opening K formed in the solder resist SR, the land LND3 and part of the wiring L2 coupled to the land LND3 are exposed from the opening K.

Figure 11:
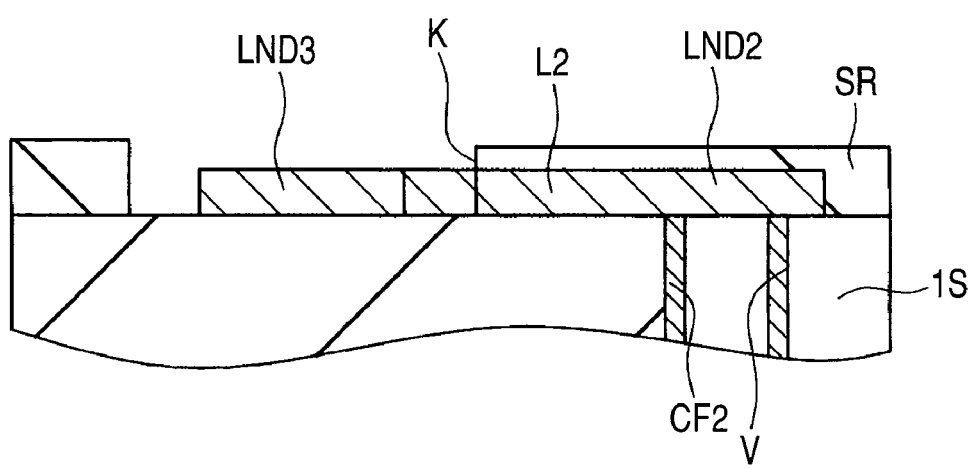
FIG. 11 is a sectional view cut along line A-A of FIG. 10.

FIG. 11 is a sectional view cut along line A-A of FIG. 10. As shown in FIG. 11, the via V is formed in the wiring board 1S, and a conductive film CF2 is formed at the side surface of the via V. The land LND2, the wiring L2 and the land LND3 are integrally formed over the via V formed with the conductive film CF2. It is understood that some of the integrally formed land LND2 and wiring L2 are covered with the solder resist SR, whereas part of the wiring L2 and the land LND3 are exposed from the opening K formed in the solder resist SR. The configuration form of such a land LND3 corresponds to the NSDM.

Figure 12:
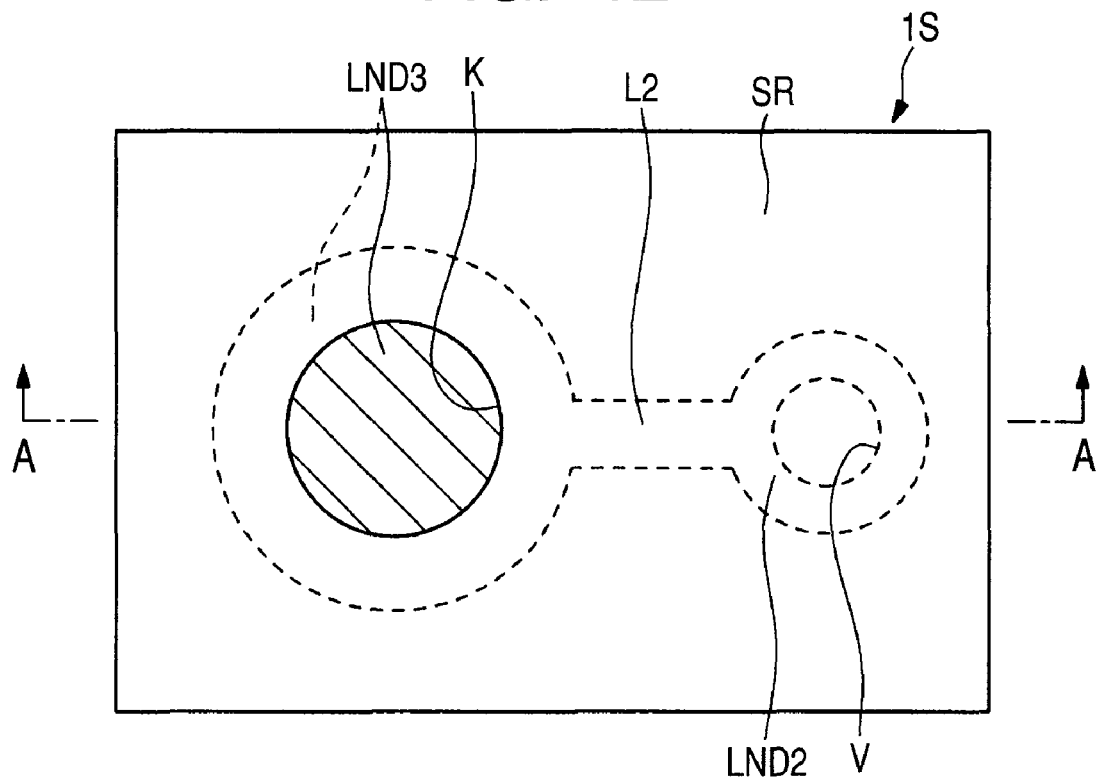
FIG. 12 is a diagram showing one example of a configuration form of a land formed at the back surface of a wiring board.

Another configuration form of the land LND3 will subsequently be explained. FIG. 12 shows in enlarged form, one land LND3 and one via V formed at the back surface of the wiring board 1S. As shown in FIG. 12, the back surface of the wiring board 1S is covered with a solder resist SR, and an opening K is defined or formed in the solder resist SR. The land LND3 is exposed from the opening K. The land LND3 shown in FIG. 12 is formed larger than the opening K defined in the solder resist SR. An outer peripheral area of the land LND3 is covered with the solder resist SR. Namely, the land LND3 and the opening K are shaped in circular form, and the diameter of the land LND3 is larger than that of the opening K. The configuration form of such a land LND3 is referred to as SMD (Solder Mask Defined). Unlike the NSMD in which the diameter of the land LND3 becomes smaller than that of the opening K, the SMD is one in which the diameter of the land LND3 becomes larger than that of the opening K. Thus, in the SMD, the entire land LND3 is not exposed from the opening K defined in the solder resist SR, but only the central area of the land LND3 is exposed. The peripheral area of the land LND3 is covered with the solder resist SR. Namely, it can be said that the SMD takes the configuration form in which the diameter of the land LND3 is larger than that of the opening K formed in the solder resist SR and some of the land LND3 is exposed with the opening K being internally included in the land LND3.

A wiring L2 is coupled to the land LND3. The wiring L2 is coupled to the via V. Described concretely, a land LND2 that internally includes the via V so as to overlap with the via V in plan view is formed at the back surface of the wiring board 1S. The land LND2 and the land LND3 are coupled to each other by the wiring L2. The via V, land LND2 and wiring L2 are covered with the solder resist SR. Namely, in the SMD, only part of the land LND3 is exposed from the opening K, and the wiring L2, land LND2 and via V coupled to the land LND3 are all covered with the solder resist SR.

Figure 13:
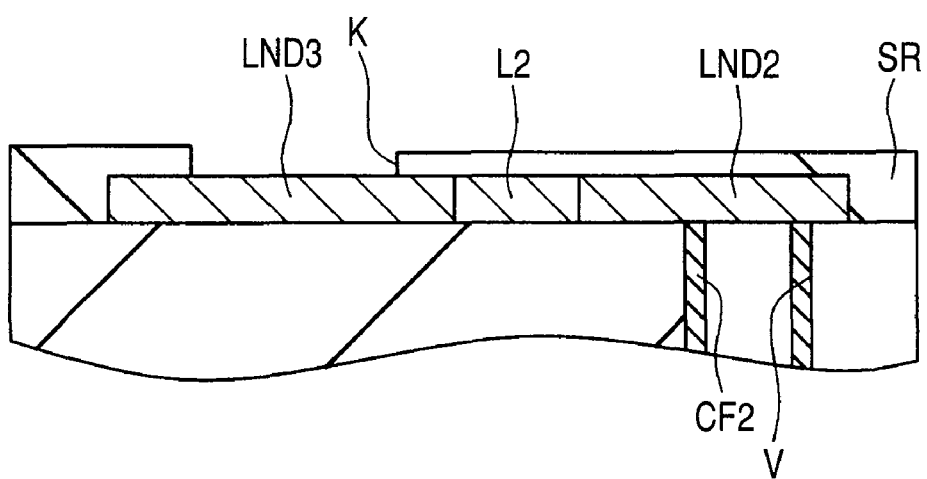
FIG. 13 is a sectional view cut along line A-A of FIG. 12.

FIG. 13 is a sectional view cut along line A-A of FIG. 12. As shown in FIG. 13, the via V is formed in the wiring board 1S and a conductive film CF2 is formed at the side surface of the via V. The land LND2, wiring L2 and land LND3 are integrally formed over the via V formed with the conductive film CF2 formed thereon. It is understood that the entirety of the land LND2 and wiring L2 and some (outer peripheral area) of the land LND3 three of which are integrally formed, are covered with the solder resist SR, whereas part (central area) of the land LND3 is exposed from the opening K defined in the solder resist SR. The configuration form of such a land LND3 is called SMD.

As described above, the land LND3 formed at the back surface of the wiring board 1S is divided into either of the configuration forms for the NSMD and SMD according to the relationship with the opening K defined in the solder resist SR. It can be said that the NSMD corresponds to the configuration form that the land LND3 is exposed from the opening K formed in the solder resist SR over its entirety and part of the wiring L2 coupled to the land LND3 is also exposed from the opening K. On the other hand, it can be said that the SMD corresponds to the configuration form that only part (central area) of the land LND3 is exposed from the opening K formed in the solder resist SR and the wiring L2 coupled to the land LND3 is covered with the solder resist SR.

According to the technology discussed by the present inventors as described above, the NSMD is superior to the SMD in terms of an improvement in adhesion between the land LND3 and the half ball although there are known the NSMD and the SMD as the configuration forms of the lands LND3 each formed at the back surface of the wiring board 1S.

This reason will be explained. Since the opening K is internally included in the land LND3 in the case of the SMD, the area for the land LND3, which is exposed from the opening K, is only the upper surface of the land LND3 (refer to FIG. 13). On the other hand, since the entirety of the land LND3 is exposed from the opening K in the case of the NSMD, the side surface of the land LND3 as well as its upper surface is exposed from the opening K (refer to FIG. 11). That is, the land LND3 is formed of, for example, a metal film. However, only the surface of the metal film is exposed in the case of the SMD, whereas the side surface of the metal film in its thickness direction as well as the surface of the metal film is exposed in the case of the NSMD. Thus, the NSMD is larger in exposed area than the SMD, and the area of contact of the land LND3 with the half ball mounted onto the land LND3 becomes large. From this point of view, the NSMD can improve the adhesion between the land LND3 and the half ball as compared with the SMD. That is, it can be said that it is desirable to use the NSMD rather than the SMD where an improvement in the strength of adhesion or bonding between the land LND3 and the half ball is taken into consideration.

Figures 14A, 14B, 14C:
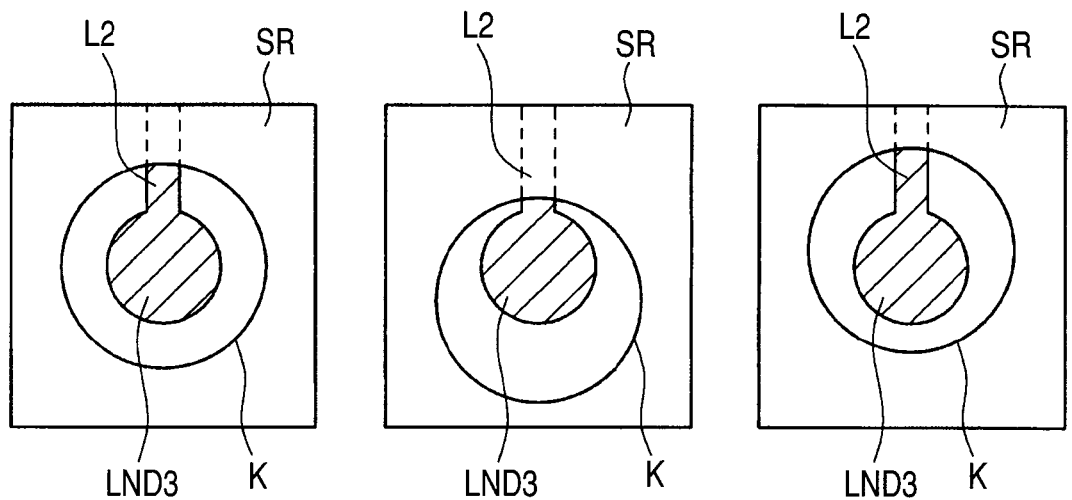
FIG. 14A is a diagram showing an NSMD formed with an opening normally with respect to a land.
FIG. 14B is a diagram showing an NSMD formed with an opening with being shifted downward as viewed on the sheet with respect to a land.
FIG. 14C is a diagram showing an NSMD formed with an opening with being shifted upward as viewed on the sheet with respect to a land.

However, the NSMD involves such problems as mentioned below. This point will be concretely described using FIGS. 14A to 14C. FIG. 14A is a diagram showing an NSMD formed with an opening K normally with respect to a land LND3. In contrast, FIG. 14B shows an NSMD formed with an opening K with being shifted downwardly as viewed on the sheet with respect to a land LND3, and FIG. 14C shows an NSMD formed with an opening K with being shifted upwardly as viewed on the sheet with respect to a land LND3.

As a result of that the diameter of the opening K becomes larger than that of the land LND3 as shown in each of FIGS. 14A through 14C, part of a wiring L2 coupled to the land LND3 as well as the land LND3 is exposed from the opening K in the case of the NSMD. When the openings K each formed with a solder resist SR being made open are respectively formed with being shifted with respect to the lands LND3 as shown in FIGS. 14B and 14C by way of example in this case, the area of each wiring L2 exposed from the opening K changes. When the opening K is shifted downward as viewed on the sheet relative to the land LND3 as shown in FIG. 14B, for example, the area of the wiring L2 exposed from the opening K becomes small. On the other hand, when the opening K is shifted upward as viewed on the sheet relative to the land LND3 as shown in FIG. 14C, the area of the wiring L2 exposed from the opening K becomes large. Consequently, when the opening K is formed with being shifted with respect to the land LND3, an overall area-obtained by adding together the area of the land LND3 exposed from the opening K and the area of the wiring L2 exposed from the opening K changes. Namely, even if a small shift or displacement corresponding to such an extent that the opening K can include the land LND3 internally occurs, the area of each wiring L2 exposed from the opening K changes. In this case, the exposed area of the land brought into contact with the half ball (wetting thereof) changes every opening K. From this viewpoint, the height of the half ball differs every opening K, and a plurality of half balls mounted onto the back surface of the wiring board 1S vary greatly in height. When the variations in the height of each half ball increase, there is a risk of occurrence in mounting failure when the wiring board 1S is mounted onto its corresponding motherboard.

Figures 15A, 15B, 15C:
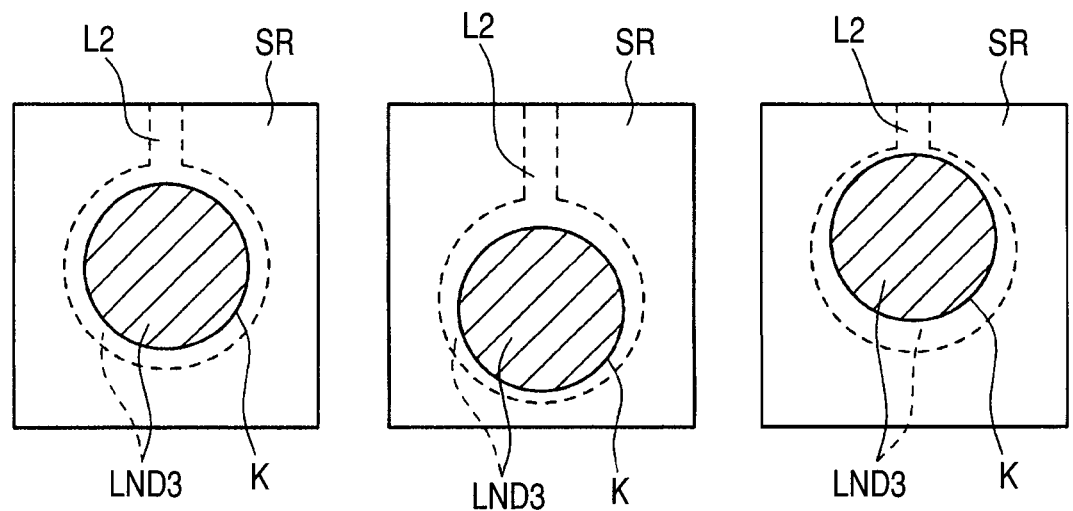
FIG. 15A is a diagram showing an SMD formed with an opening normally with respect to a land.
FIG. 15B is a diagram showing an SMD formed with an opening with being shifted downward as viewed on the sheet with respect to a land.
FIG. 15C is a diagram showing an SMD formed with an opening upward as viewed on the sheet with respect to a land.

Although the above problems are predicted on the occurrence of misalignment between the land LND3 and the opening K, misalignment between the land LND3 and the opening K actually occurs in the manufacturing process of the semiconductor device. Therefore, the variations in the height of the half ball formed over each land LND3 become an important problem in the case of the NSMD. On the other hand, the above problems do not occur in the SMD. FIG. 15A is a diagram showing an SMD formed with an opening K normally with respect to a land LND3. On the other hand, FIG. 15B shows an SMD formed with an opening K with being shifted downward as viewed on the sheet with respect to a land LND3, and FIG. 15C shows an SMD formed with an opening K with being shifted upward as viewed on the sheet with respect to a land LND3.

As a result of that the diameter of the opening K becomes smaller than that of the land LND3 as shown in each of FIGS. 15A through 15C, only the land LND3 is exposed from the opening K. Even though the openings K each formed with a solder resist SR being made open are respectively formed with being shifted with respect to the lands LND3 as shown in FIGS. 15B and 15C by way of example, only parts of the lands LND3 are exposed from the openings K and the exposed area of each land LND3 exposed from the opening K does not change. Therefore, even if the openings K are formed with being shifted with respect to the lands LND3, the exposed area of the land brought into contact with the half ball (wetting thereof) becomes identical at the plural openings K in the SMD. It can be said from this viewpoint that the height of the half ball does not differ every opening K, and a plurality of half balls mounted onto the back surface of the wiring board 1S do not cause a problem about variations in height.

From this point of view, the land LND3 of the SMD other than the NSMD is used to ensure the reliability of mounting of the wiring board 1S and the motherboard under the present situation. Since, however, the strength of adhesion or bonding between the land LND3 and the half ball becomes weak in the SMD, it is not possible to avoid the degradation in coupling life where the half ball LGA is mounted onto the motherboard. Namely, since the strength of bonding between the land LND3 and the half ball can be made strong in the NSMD rather than the SMD, the life of coupling between the half ball LGA and the motherboard can be lengthened in the NSMD rather than the SMD. Thus, if the variations in the height of the half ball corresponding to the problem of the NSMD can be suppressed, then the advantage that the NSMD is used can be obtained. Therefore, the first embodiment of the present application provides a contrivance to make it possible to suppress the variations in the height of the half ball by setting the configuration form of the land LND3 formed at the back surface of the wiring board 1S as the NSMD and using the NSMD as the configuration form of the land LND3. The semiconductor device according to the first embodiment of the present application that realizes suppression of the variations in the height of the half ball while the NSMD is being used as the configuration form of the land LND3, will be explained below.

Figure 16:
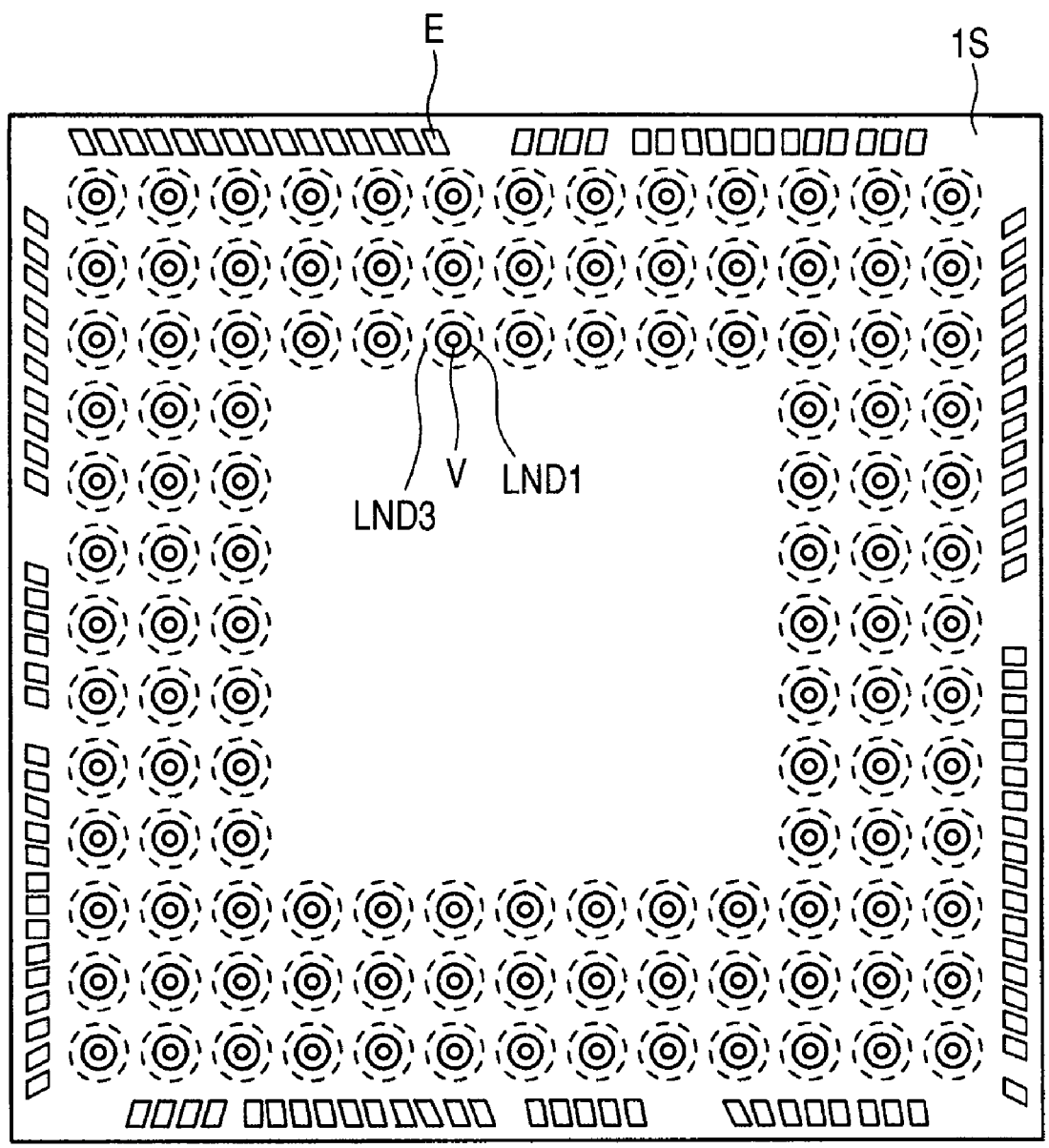
FIG. 16 is a diagram illustrating a typical configuration of a wiring board employed in the first embodiment.

FIG. 16 is a diagram showing a typical configuration of a wiring board 1S employed in the first embodiment of the present application. FIG. 16 illustrates, in superimposed form, a major configuration of a chip mounting surface (surface) of the wiring board 1S and a major configuration of the surface (back surface) opposite to the chip mounting surface of the wiring board 1S. That is, in FIG. 16, electrodes E disposed along the four sides of the wiring board 1S and lands LND1 disposed in an area lying inside the electrodes E in lattice form are components formed at the surface of the wiring board 1S. Since the electrodes E and lands LND1 formed at the surface of the wiring board 1S become complicated in FIG. 16 although coupled to one another by wirings herein, the illustration of the wirings for coupling the electrodes E and the lands LND1 is omitted.

On the other hand, in FIG. 16, lands LND3 (indicated by dotted lines) formed in lattice form are components formed at the back surface of the wiring board 1S. Vias V that penetrate the surface of the wiring board 1S and the back surface of the wiring board 1S are illustrated. It is understood from the above components that the lands LND1 formed at the surface of the wiring board 1S are coupled to the vias V formed directly below the lands LND1. The vias V having reached the back surface of the wiring board 1S are respectively coupled directly to the lands LND3 formed at the back surface of the wiring board 1S. That is, the lands LND3 that contain the vias V in plan view are formed directly on the vias V at the back surface of the wiring board 1S. This point is a point of difference from the technology explained in FIG. 9 and corresponds to one characteristic of the first embodiment of the present application. As shown in FIG. 16, the first embodiment of the present application is characterized in that the lands LND3 are formed directly on the vias V without coupling the vias V and the lands LND3 by the wirings L2, at the back surface of the wiring board 1S. In the present specification, such a structure that each of the lands LND3 formed at the back surface of the wiring board 1S is formed so as to be overlaid on the vias V in plan view, and the land LND3 is formed so as to include the vias V internally in plan view will be called "land on via structure". This land on via structure is referred to as so-called pad on via. That is, the land on via and the pad on via are the same meaning.

Incidentally, while half balls comprised of solder are respectively mounted onto the lands LND3 formed at the back surface of the wiring board 1S, the illustration of the half balls is omitted in FIG. 16.

Figure 17:
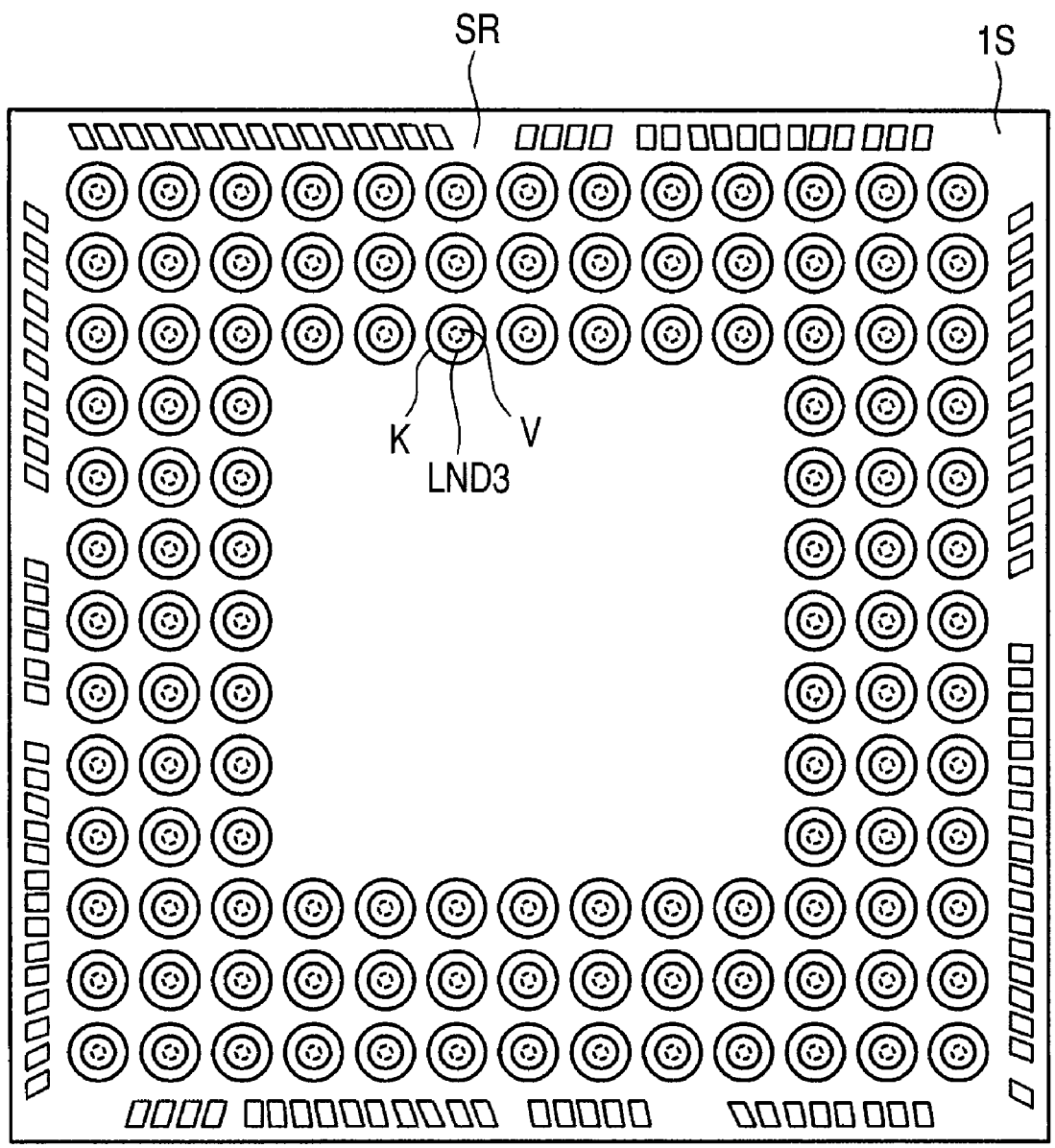
FIG. 17 is a diagram showing the back surface of the wiring board.

Next, FIG. 17 is a diagram showing the back surface of the wiring board 1S. As shown in FIG. 17, a plurality of lands LND3 are formed at the back surface of the wiring board 1S in lattice form. Each of the lands LND3 has the land on via structure that the land LND3 is formed directly on its corresponding via V internally included in the land LND3 in plan view, and the land LND3 is configured as an NSMD. That is, an opening K is defined or formed in a solder resist SR so as to contain each land LND3 internally in plan view. As mentioned above, the lands LND3 are respectively formed so as to be internally included in the openings K in plan view at the back surface of the wiring board 1S employed in the first embodiment of the present application, and the vias V are formed so as to be internally included in the lands LND3 in plan view respectively. In other words, no wirings (wirings L2 shown in FIG. 9, for example) are used for electrical coupling between the lands LND3 and the vias V.

Figure 18:
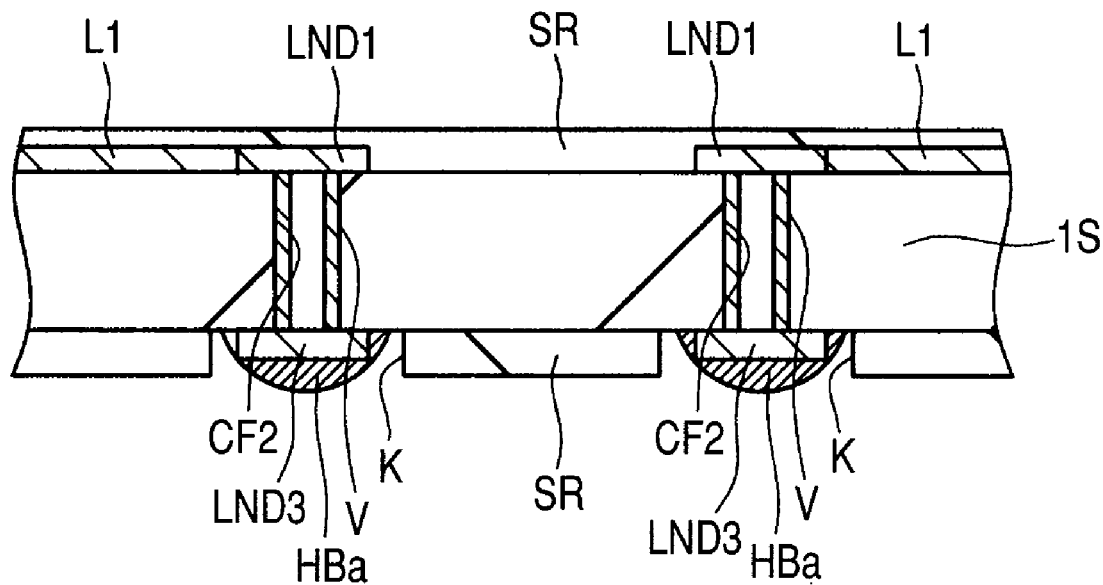
FIG. 18 is a sectional view showing a land on via structure formed in the back surface of a wiring board and a structure in which configuration forms of lands are NSMD.

Subsequently, FIG. 18 is a sectional view showing a land on via structure formed in the back surface of a wiring board 1S and a structure in which configuration forms of lands LND3 are NSMD. In FIG. 18, vias V are formed so as to penetrate the wiring board 1S, and conductive films CF2 are formed at their corresponding side surfaces of the vias V. The lands LND3 are formed so as to be coupled directly to the vias V at the back surface (lower surface in FIG. 18) of the wiring board 1S. That is, the land on via structure in which the vias V is formed directly on the land LND3 is configured. Opening K are respectively formed so as to contain the lands LND3. The openings K are formed so as to open a solder resist SR formed at the back surface of the wiring board 1S. The diameter of each opening K is larger than that of each land LND3 in such a manner that the configuration form of the land LND3 is brought to the NSMD. Half balls HBa are respectively disposed over the lands LND3 each brought to the NSMD.

On the other hand, lands LND1 are respectively formed at the surface (upper surface in FIG. 18) of the wiring board 1S so as to be coupled to the vias V. Wirings L1 extend so as to be coupled to the lands LND1 respectively. The solder resist SR is formed at the surface of the wiring board 1S. The lands LND1 and the wirings L1 formed at the surface of the wiring board 1S are covered with the solder resist SR.

Figure 19:
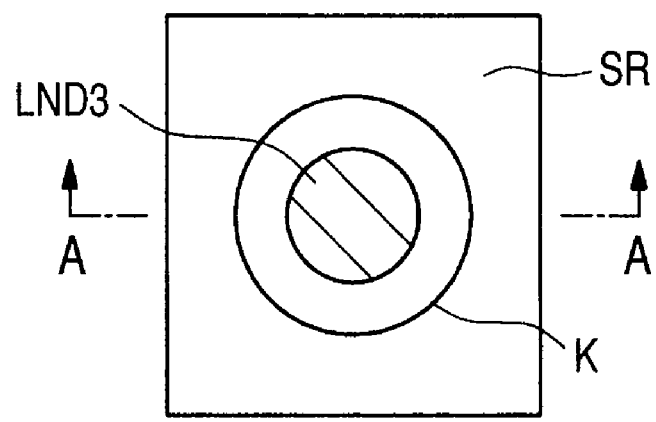
FIG. 19 is a diagram showing in enlarged form a configuration of one land formed in the back surface of a wiring board.

Next, FIG. 19 is a diagram showing in enlarged form, a configuration of one land LND3 formed at the back surface of a wiring board 1S. As show in FIG. 19, an opening K shaped in circular form is defined in a solder resist SR. The land LND3 shaped in circular form is formed so as to contain the opening K internally. Thus, while the configuration form of the land LND3 employed in the first embodiment of the present application is brought to an NSMD, the entirety of the land LND3 is simply exposed from the opening K and no wiring is exposed, for example. This is because such a land on via structure that the land LND3 is formed directly on its corresponding via without coupling the land LND3 and the via using the wiring is taken in the first embodiment of the present application. That is, the feature of the first embodiment of the present application resides in that only the entire area of the land LND3 is exposed from the opening K despite that the configuration form of the land LND3 is brought to the NSMD.

FIG. 20 is a sectional view cut along line A-A of FIG. 19. As shown in FIG. 20, the via V that extends through the wiring board 1S is formed in the wiring board 1S, and a conductive film CF2 is formed at its corresponding side surface of the via V. The land LND3 is formed so as to be coupled directly to the via V. Namely, the land LND3 is disposed directly on the via V thereby to electrically couple the via V and the land LND3 to each other using without using a wiring. Therefore, only the land LND3 is exposed from the opening K even where the NSMD in which the diameter of the opening K is set larger than that of the land LND3 is provided at the back surface (upper surface in FIG. 20) of the wiring board 1S. On the other hand, a land LND1 is formed at the surface (lower surface in FIG. 20) of the wiring board 1S so as to be coupled to the via V as explained even in FIG. 18. A wiring L1 extends so as to be coupled to the land LND1. The solder resist SR is formed at the surface of the wiring board 1S. The land LND1 and the wiring L1 formed at the surface of the wiring board 1S are covered with the solder resist SR.

As described above, the feature of the first embodiment of the present application resides in that the land on via structure that the land LND3 formed at the back surface of the wiring board 1S is formed directly on the via V is adopted, and the configuration form of the land LND3 is taken as the NSMD. Thus, the component (member) exposed from the opening K defined in the solder resist SR can be set as only the land LND3 shaped in circular form while the configuration form of the land LND3 is being taken as the NSMD. Advantageous effects based on the feature of the first embodiment of the present application will be explained below with reference to the drawings.

FIG. 21A is a diagram showing an NSMD formed with an opening K normally with respect to a land LND3 in the land on via structure according to the first embodiment of the present application. On the other hand, FIG. 21B is a diagram showing an NSMD formed with an opening K with being shifted downward as viewed on the sheet with respect to a land LND3 in the land on via structure according to the first embodiment of the present application, and FIG. 21C is a diagram showing an NSMD formed with an opening K with being shifted upward as viewed on the sheet with respect to a land LND3 in the land on via structure according to the first embodiment of the present application. Only the land LND3 shaped in circular form is exposed from the opening K formed in its corresponding solder resist SR even in any of FIGS. 21A through 21C. Namely, as shown in each of FIGS. 21A through 21C, only the land LND3 shaped in circular form is exposed from the opening K in the land on via structure according to the first embodiment of the present application even if the formation of the opening K relative to the land LND3 is slightly shifted or displaced. This means that even though the formation of the opening K relative to the land LND3 of the NSMD is shifted, the exposed area of a metal film exposed from the corresponding opening K remains unchanged. That is, when the position to form the opening K with respect to each land LND3 is shifted, a change in the exposed area of the wiring L2 coupled to the land LND3 occurs inevitably in the normal NSMD shown in each of FIGS. 14A through 14C. On the other hand, since the land on via structure that the land LND3 formed at the back surface of the wiring board 1S and the via V are directly coupled to each other is adopted in the first embodiment of the present application, the wiring for coupling the land LND3 and the via V becomes unnecessary. Therefore, even though the configuration form of the land LND3 is taken as the NSMD, the metal film exposed from the opening K becomes only the land LND3 shaped in circular form. Thus, in the first embodiment of the present application, even when the shift of the opening K with respect to the land LND3 occurs, the exposed area of the land LND3 exposed from the opening K can be uniformized at the plural openings K. From this viewpoint, even though the configuration form of each land LND3 is taken as the NSMD, the area (wet area) of contact of the land LND3 with each half ball formed on the land LND3 can be made uniform at the respective lands LND3. As a result, even if the configuration form of the land LND3 is taken as the NSMD, variations in the height of the half ball formed on the land LND3 can be suppressed, and the reliability of coupling where a half ball LGA is mounted onto its corresponding motherboard can hence be enhanced.

That is, the configuration of coupling between the land LND3 formed at the back surface of the wiring board 1S and the via V is brought to the land on via structure in the first embodiment of the present application. Thus, even if the configuration form of the land LND3 is taken as the NSMD, it is possible to suppress the variations in the height of the half ball disposed over the land LND3. In other words, a noticeable effect is brought about in that owing to the adaptation of the characteristic configuration of the first embodiment of the present application, the variations in the height of each half ball, which have been a weak point in the NSMD, can be reduced while the NSMD capable of ensuring the strength of coupling between the wiring board 1S (land LND3) and each half ball is being used.

In particular, the adaptation of the land on via structure as in the first embodiment of the present application brings about a noticeable effect assuming that the configuration form of each land LND3 is taken as the NSMD. Even if, for example, the land on via structure is used for the land LND3 of the SMD, no benefit is provided. When the configuration form of each land LND3 is taken as the SMD as shown in FIG. 15, the wiring that couples the land LND3 and the via V is not exposed from the opening K formed in the solder resist SR originally. Therefore, the problem based on the premise of the present invention that the exposed area at which the land LND3 exposed from the opening K and the wiring L2 are aligned changes due to the misalignment of the opening K, does not exist. Thus, even if a technology that adopts the land on via structure assuming that the configuration form of the land LND3 formed at the back surface of the wiring board 1S is taken as the SMD, exists, the motivation that the technology of providing the land on via structure by the land LND3 of the NSMD is easily made as in the first embodiment of the present application, does not exist. Namely, since the NSMD rather than the SMD enables an improvement in the strength of coupling between the land LND3 and the half ball as a premise in the first embodiment of the present application, there is a case where it is desired to adopt the land LND3 of each NSMD as the half ball LGA. There is however a problem (motivation) that after becoming acquainted with the weak point that the land LND3 of the NSMD causes the variations in the height of the half ball, its weak point should be overcome. This motivation does not exist in the technology based on the premise that the configuration form of each land LND3 is taken as the SMD. That is, when the configuration form of the land LND3 is taken as the SMD, a significant advantage does not exist even if the configuration between the land LND3 and the via V is brought to the land on via structure. A noticeable effect can be obtained that takes the advantage of the NSMD that an improvement in the strength of mounting between the land LND3 and the half ball can be achieved while the variations in the height of each half ball corresponding to the weak point of the NSMD can be suppressed first by applying the land on via structure to the land LND3 of the NSMD as in the first embodiment of the present application.

Further, a new advantageous effect is brought about by adopting the land on via structure to the land LND3 of the NSMD. This advantageous effect will be explained. For example, when each land LND3 and its corresponding via V are coupled using the wiring without using the land on via structure, the land LND3 and part of the wiring are exposed from the opening defined in the solder resist SR. Thus, the half ball is formed so as to cover the exposed land LND3 and the exposed part of wiring. Since the land LND3 is shaped in circular form and also large in area at this time, the strength of bonding between the land LND3 and the half ball is enhanced. Since, however, the wiring is thin and also small in area, stress applied to each half ball makes it easier to cause the peeling off of the half ball from the wiring board 1S every wiring at each portion where the wiring and the half ball are bonded to each other. In this case, the half ball is peeled off from the half ball LGA, thus resulting in a mounting failure.

As to this respect, the configuration of the land LND3 and the via V is set to the land on via structure in the first embodiment of the present application. Therefore, even when the configuration form of the land LND3 is taken as the NSMD, the metal film exposed from the opening defined in the solder resist SR becomes only the land LND3. From this point of view, the half ball is adhered or bonded only to the land LND3 shaped in circular form in the first embodiment of the present application. Namely, since the wiring for coupling each Land LND3 and its corresponding via V does not exist in the first embodiment of the present application even though the configuration form of the land LND3 is taken as the NSMD, each wiring and its corresponding half ball are not bonded to each other. Thus, since the half ball is adhered only to the land LND3 large in area and fixedly secured to the wiring board, the half ball can be prevented from being peeled off from the wiring board 1S.

With the adoption of the land on via structure to the land LND3 of the NSMD, another advantageous effect is also brought about in the first embodiment of the present application. For example, the semiconductor chip CHP mounted onto the half ball LGA is formed with an integrated circuit which has realized the function of the RFIC that deals with a high-frequency signal. Increasing a wiring length at this time results in the cause that in the case of this high-frequency signal, a rise in the impedance (inductance) occurs and the electrical characteristic of a high-frequency circuit is degraded. From this point, a rise in impedance (inductance) due to each wiring presents a problem where, for example, each land LND3 and its corresponding via V are coupled using the wiring. On the other hand, the configuration of the land LND3 and the via V is taken as the land on via structure in the first embodiment of the present application. Therefore, the wiring for coupling each land LND3 and its corresponding via V can be omitted. This means that the wiring length at the half ball LGA becomes short. In particular, the degradation of the electrical characteristic of the high-frequency circuit can be suppressed. Namely, the first embodiment of the present application can obtain an advantageous effect in that, for example, when the semiconductor chip CHP with the high-frequency circuit such as RFIC built therein is mounted onto the half ball LGA, the degradation of the electrical characteristic of the high-frequency circuit can be suppressed as well as an improvement in mounting reliability of the half ball LGA.

Figure 22:
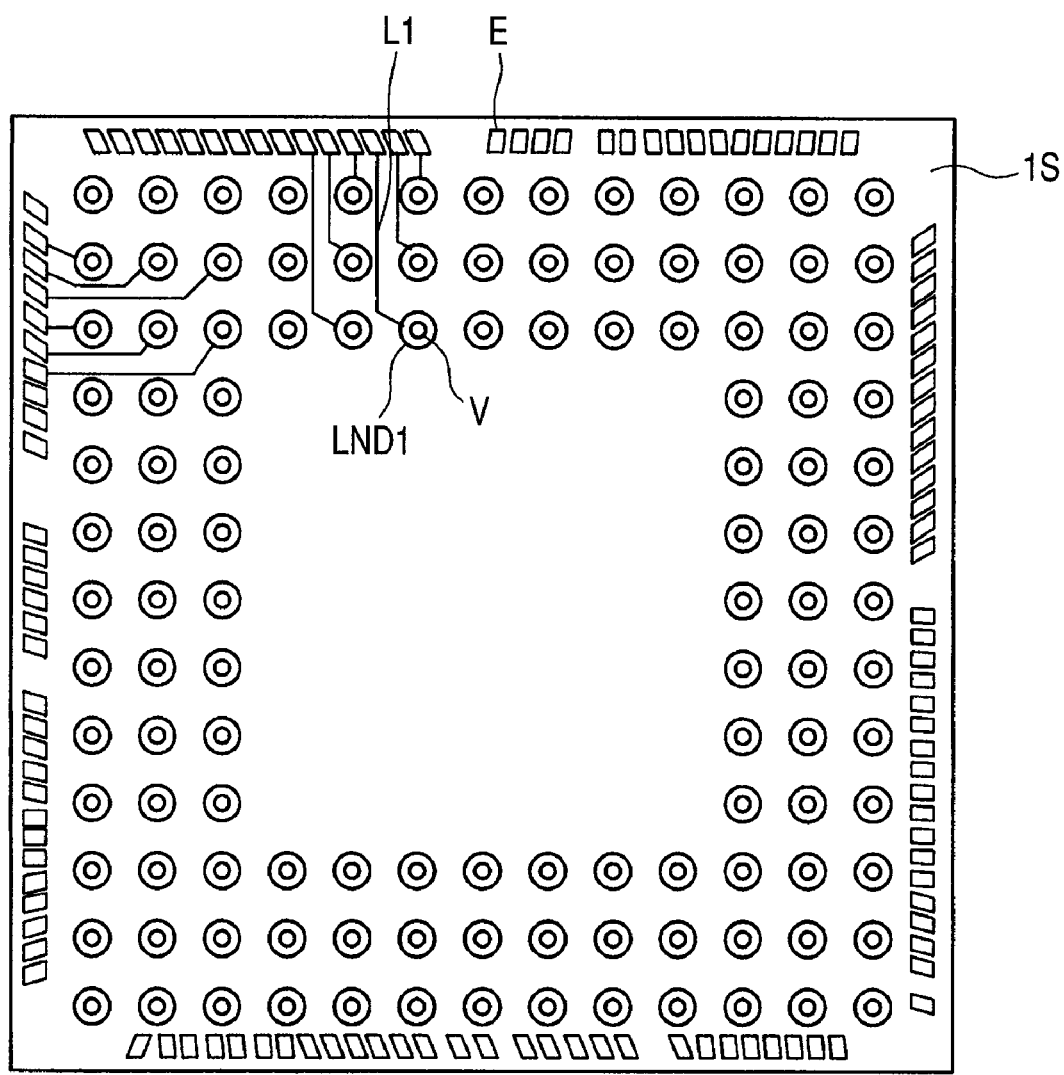
FIG. 22 is a diagram showing the wiring board employed in the first embodiment as viewed from the chip mounting surface (front surface) side.

A layout of each wiring at the surface (chip mounting surface) of the wiring board 1S will next be explained. FIG. 22 is a diagram showing the wiring board 1S employed in the first embodiment of the present application as viewed from the chip mounting surface (front surface) side. As shown in FIG. 22, electrodes E shaped in rectangular form are disposed side by side along the four sides of the wiring board 1S shaped in rectangular form. Lands LND1 and vias V are disposed in an area lying inside the electrodes E. The lands LND1 and the vias V are formed plural in lattice form at the surface of the wiring board 1S. These electrodes E and lands LND1 are components formed at the surface of the wiring board 1S. The vias V are formed so as to extend through the wiring board 1S. At this time, the electrodes E formed along the four sides of the wiring board 1S are coupled to a semiconductor chip (not shown) mounted over the surface of the wiring board 1S by, for example, wires. The electrodes E are coupled to their corresponding lands LND1 formed at the surface of the wiring board 1S. Thereafter, the lands LND1 are coupled to their corresponding external coupling terminals (half balls, for example) formed at the back surface of the wiring board 1S via the vias V.

A wiring layout for coupling the electrodes E and the lands LND1 at the surface of the wiring board 1S will be explained below. As shown in FIG. 22, the electrodes E and the lands LND1 are electrically coupled to one another by wirings L1 formed at the surface of the wiring board 1S. Although only the wirings L1 are partly illustrated for simplification in FIG. 22, the wirings L1 are actually coupled to all the electrodes E and lands LND1. Since the lands LND1 are disposed inside the electrodes E in lattice form herein, the wirings L1 that couple the innermost-disposed lands LND1 and the electrodes E, for example, are formed so as to pass through space defined between the lands LND1 in avoidance of the outer lands LND1 disposed in lattice form. Thus, it is necessary to ensure space for causing each wiring L1 to extend.

Here, the first embodiment of the present application has a feature in that each of lands LND3 (not shown in FIG. 22) formed at the back surface of the wiring board 1S and its corresponding via V are configured as the land on via structure. Setting them in the form of the land on via structure in this way results in the placement of each via V over the land (land LND3) formed at the back surface of the wiring board 1S. In other words, since half balls corresponding to external coupling terminals are mounted over the lands (lands LND3) disposed at the back surface of the wiring board 1S, the placement position of each land (land LND3) formed at the back surface of the wiring board 1S is defined corresponding to the mounting position of each half ball. Since the via V is disposed on its corresponding land (land LND3) formed at the back surface of the wiring board 1S in the land on via structure, the placement position of each via V is defined to be the mounting position of the half ball. Namely, in the first embodiment of the present application, the placement position of the via V is defined to be a position which is overlaid on the placement position of the half ball in plan view. As a result of that the position of each via V is defined in this way, at the surface of the wiring board 1S, the land LND1 formed over the via V is disposed at the position overlaid on the placement position of each half ball in plan view. Namely, since the placement position of the via V is defined to be overlaid on the placement position of each half ball in plan view in the first embodiment of the present application, each land LND1 formed at the surface of the wiring board 1S is also defined corresponding to the placement position of each half ball. Thus, the lands LND1 formed at the surface of the wiring board 1S cannot be freely disposed in such a manner that the wirings L1 used for coupling to the electrodes E formed at the surface of the wiring board 1S can be easily routed. Thus, in the first embodiment of the present application, a side effect that the degree of freedom of the layout of each wiring L1 for coupling the land LND1 and electrode E formed at the surface of the wiring board 1S is reduced occurs due to the definition of the placement position of the via V.

Figure 23:
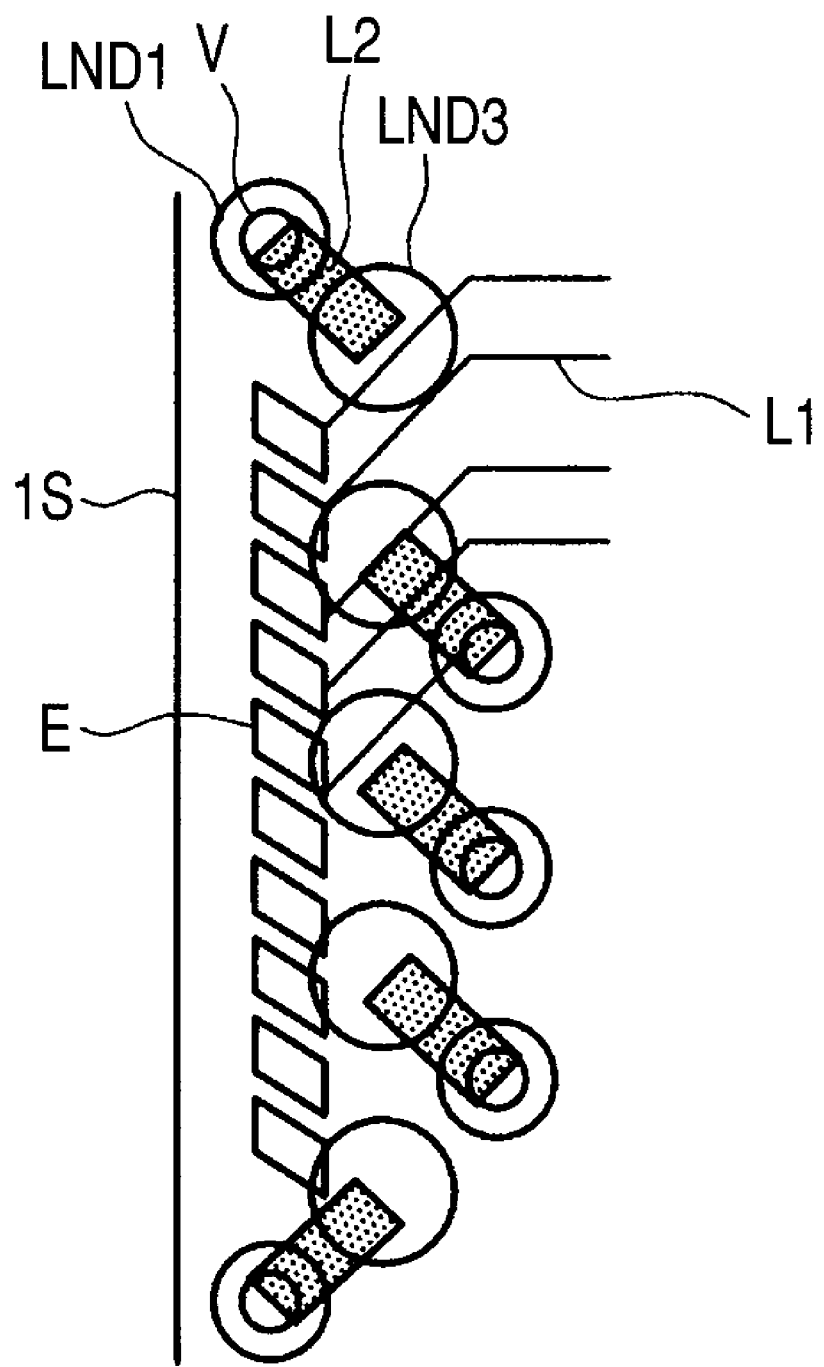
FIG. 23 is an enlarged view illustrating a layout configuration of wirings for coupling electrodes and lands where the land on via structure is not used.

For example, FIG. 23 shows a layout configuration of wirings for coupling electrodes E and lands LND1 where no land on via structure is used. Described concretely, FIG. 23 shows the electrodes E, lands LND1 and wirings L1 formed at the surface of a wiring board 1S and shows lands LND3 and wirings L2 formed at the back surface of the wiring board 1S. Namely, as shown in FIG. 23, the lands LND3 are disposed at the back surface of the wiring board 1S in association with the placement positions of half balls. Since, however, the land on via structure is not adopted in FIG. 23, no vias V are provided corresponding to the positions of the lands LND3 formed at the back surface of the wiring board 1S. That is, as to the placement positions of the vias V, the vias V can be freely disposed without the vias being defined to the placement positions of the lands LND3 with the half balls mounted thereon. Since the lands LND3 and vias V formed at the back surface of the wiring board 1S are respectively coupled to one another by the wirings L2 formed at the back surface of the wiring board 1S, it is not necessary to provide the vias V in association with the positions of the lands LND3 formed at the back surface of the wiring board 1S. The positions of the vias V can be freely provided corresponding to the lands LND1 formed at the surface of the wiring board 1S. This means that the degree of freedom of placement of the lands LND1 formed at the surface of the wiring board 1S is improved. As shown in FIG. 23, for example, the lands LND1 can be disposed at the surface of the wiring board 1S. Therefore, the wirings L1 for coupling the electrodes E and the lands LND1 formed at the surface of the wiring board 1S can be routed relatively easily.

Since, however, the land on via structure is adopted in the first embodiment of the present application, the placement positions of vias V are defined so as to overlap with the mounting positions of half balls in plan view. Defining the placement positions of the vias V in this way means that the placement positions of lands LND1 formed at the surface of a wiring board 1S are also defined. That is, as a result of that the placement positions of the lands LND1 formed at the surface of the wiring board 1S are defined, the degree of freedom of a layout of the wirings L1 for coupling electrodes E and their corresponding lands LND1 at the surface of the wiring board 1S is reduced.

Thus, the first embodiment of the present application provides a contrivance to make it possible to lighten the reduction in the degree of freedom of the layout of the wirings L1 for coupling the electrodes E and the lands LND1 at the surface of the wiring board 1S. This point will be explained using FIG. 25. FIG. 25 shows a layout configuration of wirings L1 for coupling electrodes E and lands LND1 where the land on via structure is used. Described concretely, FIG. 25 illustrates the electrodes E, lands LND1 and wirings L1 formed at the surface of the wiring board 1S. In FIG. 25, vias V are provided corresponding to the mounting positions of half balls mounted onto the back surface of the unillustrated wiring board 1S. Thus, even in the case of the lands LND1 formed at the surface of the wiring board 1S in association with the vias V, their placement positions are defined corresponding to the mounting positions of the half balls. Here, a point of difference between FIG. 24 and FIG. 25 resides in that the distance between the outer peripheral line of the wiring board 1S and the outermost column at which the lands LND1 are arranged differs therebetween. That is, in FIG. 24, the distance between the outer peripheral line of the wiring board 1S and the outermost column at which the lands LND1 are arranged is a distance "a", whereas in FIG. 25, the distance between the outer peripheral line of the wiring board 1S and the outermost column at which the lands LND1 are arranged, is a distance "b". The distance "b" is larger than the distance "a". Described specifically, the distance "a" shown in FIG. 24 is smaller than the pitch (also called the pitch of each land LND3) of each land LND1, whereas the distance "b" shown in FIG. 25 is larger than the pitch (also called the pitch of each land LND 3) of the land LND1.

Figure 24:
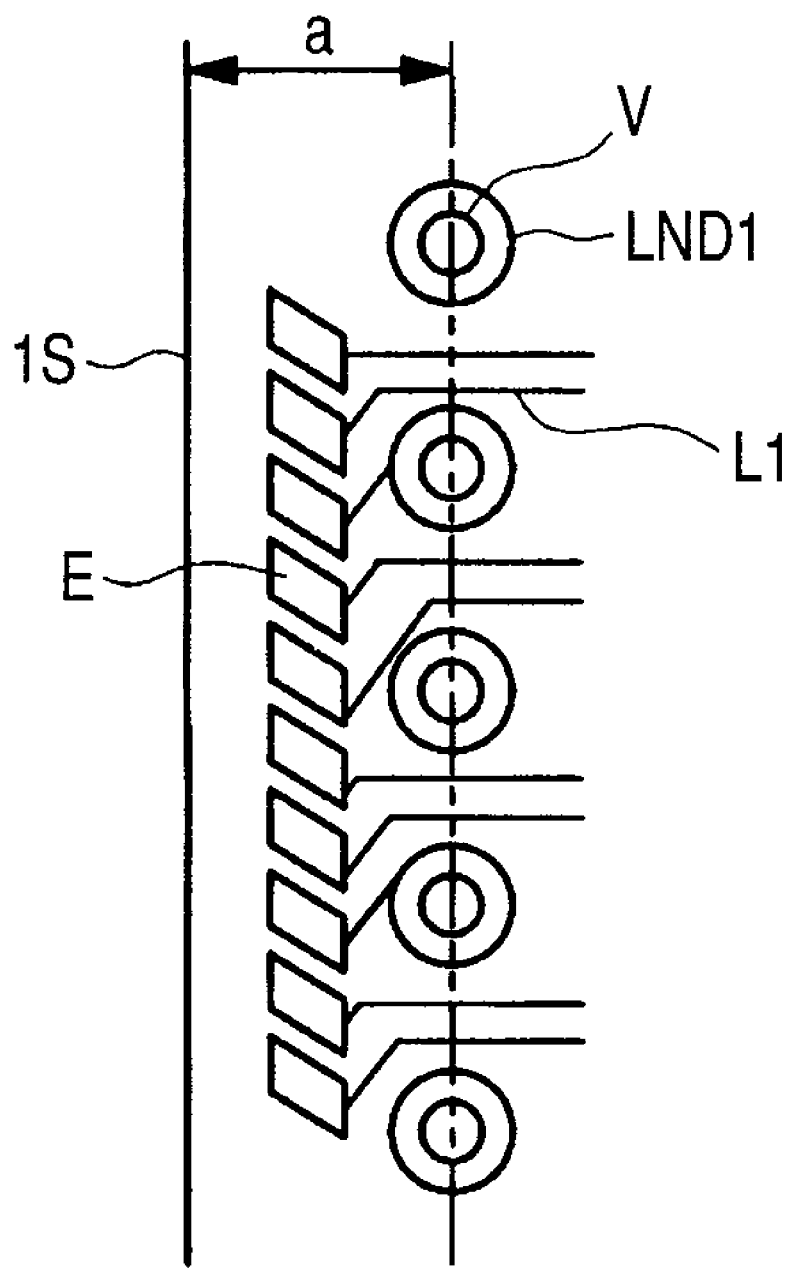
FIG. 24 is an enlarged view showing a layout configuration of wirings for coupling electrodes and lands where the land on via structure is used.
Figure 25:
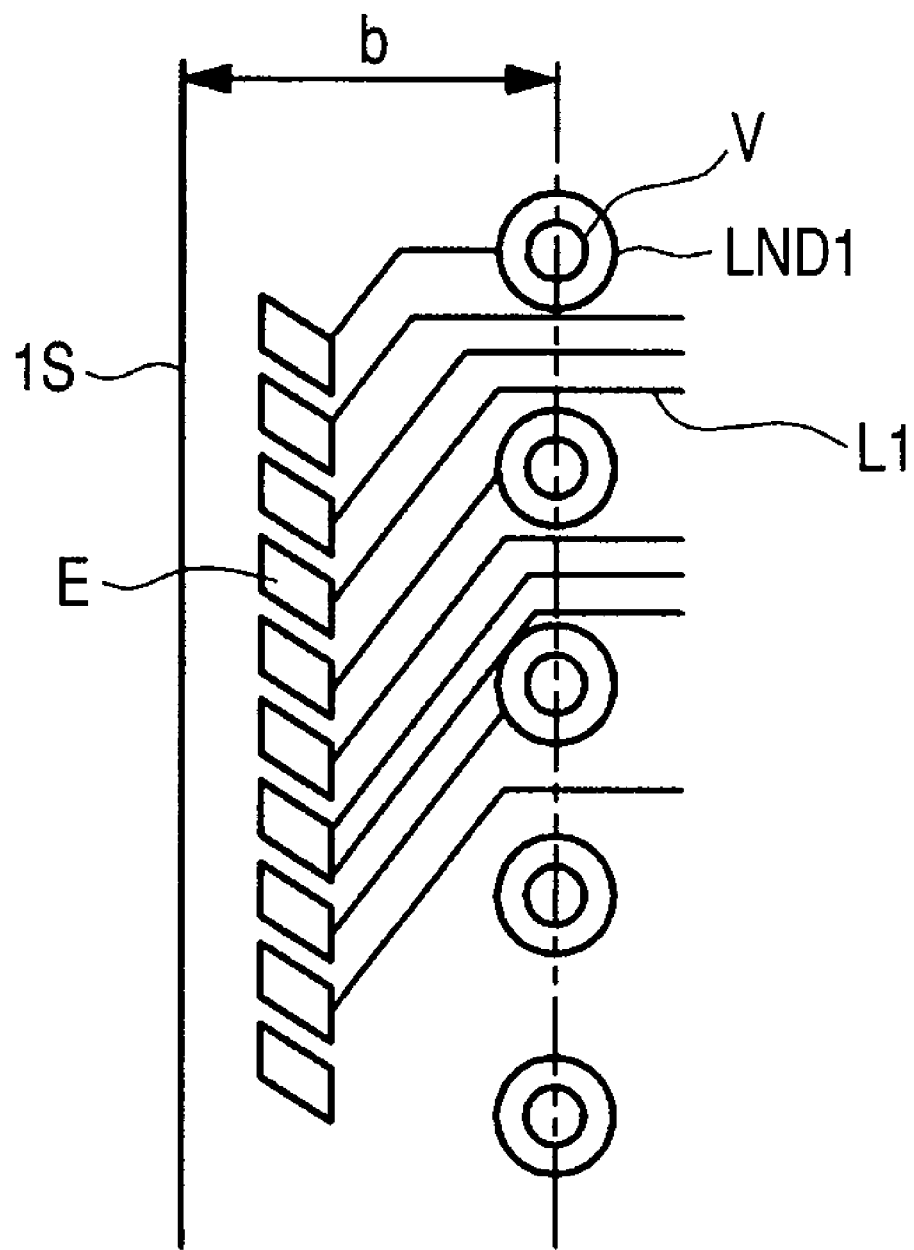
FIG. 25 is an enlarged view depicting a layout configuration of wirings for coupling electrodes and lands where the land on via structure is used.

Therefore, space from the electrodes E to the outermost column at which the lands LND1 are arranged, is ensured in FIG. 25 in which the contrivance according to the first embodiment of the present application has been made, as compared with FIG. 24. From this point of view, the degree of freedom of the layout of the wirings L1 formed at the surface of the wiring board 1S can be enhanced in FIG. 25 as compared with FIG. 24. Since the space from the electrodes E and the outermost column at which the lands LND1 are arranged is ensured, an area for routing the wirings L1 can be ensured sufficiently. While, for example, the number of the wirings L1 that pass between the lands LND1 is two in FIG. 24, the number of the wirings L1 that pass between the lands LND1 can be set to three in FIG. 25. Thus, the wirings L1 can be easily routed up to the lands LND1 disposed in an area more inside the wiring board 1S.

With the sufficient ensuring of the space from the electrodes E and the outermost column at which the lands LND1 are arranged as mentioned above, the first embodiment of the present application is capable of reducing the side or adverse effect that the degree of freedom of each wiring L1 formed at the surface of the wiring board 1S is reduced due to the adoption of the land on via structure.

Although the first embodiment of the present application has explained the half ball LGA as the semiconductor device by way of example, the present invention is not limited to the half ball LGA, but can be applied even to, for example, the BGA. This is because the BGA and the half ball LGA are similar in configuration except for the difference in the height of each external coupling terminal. When, however, the present invention is applied particularly to the half ball LGA as in the first embodiment of the present application, useful effects shown below are brought about.

Firstly, the height of each external coupling terminal (half ball) in the half ball LGA is lower than the height of each external coupling terminal (solder ball) of the BGA. Therefore, the total thickness where the half ball LGA is mounted onto the motherboard (mounting substrate or board) can be made thinner than the total thickness where the BGA is mounted onto the mounted motherboard. This means that the use of the half ball LGA makes it possible to realize the thinning of the semiconductor device.

Secondly, an impact strength against an impact force where the half ball LGA is mounted onto the motherboard becomes strong as compared with the BGA. The configuration of coupling between the land LND3 formed at the back surface of the wiring board 1S and its corresponding via V is set as the land on via structure in the first embodiment of the present application. Thus, even though the configuration form of the land LND3 is taken as the NSMD, it is possible to suppress the variations in the height of each half ball disposed on its corresponding land LND3. This advantageous effect can be obtained at both the half ball LGA and the BGA. Further, in the half ball LGA, the impact strength is enhanced as compared with the BGA by taking the configuration form of the land LND3 formed at the back surface of the wiring board 1S as the NSMD. This will be explained with reference to FIG. 26.

FIG. 26 is a table showing a result of measurements of resistance to impact forces of the half ball LGA and the BGA. The measurements are done under the condition that an impact force of 1500 G is applied for 0.5 ms. The BGA of the NSMD and the half ball LGA of the NSMD are targeted for measurement. An evaluation result for the BGA of the NSMD will first be explained. In the BGA of the NSMD as shown in FIG. 26, the failure that the BGA is detached or demounted from the motherboard where the number of evaluations is 30 times and 50 times does not occur. When, however, the number of evaluations reaches 100 times, one failure exists. Further, when the number of evaluations reaches 150 times, two failures exist. When the number of evaluations reaches 200 times, three failures exist in the BGA. On the other hand, even when the number of evaluations is any of 30 times, 50 times, 100 times, 150 times and 200 times as shown in FIG. 26, the failure that the half ball LGA is detached or demounted from the motherboard does not occur in the half ball LGA of the NSMD. This shows that the half ball LGA is higher than the BGA in resistance to the impact force. Thus, it is understood that the land on via structure is adopted and the configuration that the configuration form of each land LND3 is taken as the NSMD is applied to the half ball LGA as in the first embodiment of the present application, thereby making it possible to make compatible both an improvement in mounting strength of each half ball and suppression of variations in the height of the half ball disposed on each land LND3 and enhancing resistance to the impact force of the half ball LGA.

The semiconductor device according to the first embodiment of the present application is configured in the above-described manner. A method for manufacturing the semiconductor device will be explained below. A process for manufacturing a wiring board 1S that configures a half ball LGA will first be described.

Figure 27:
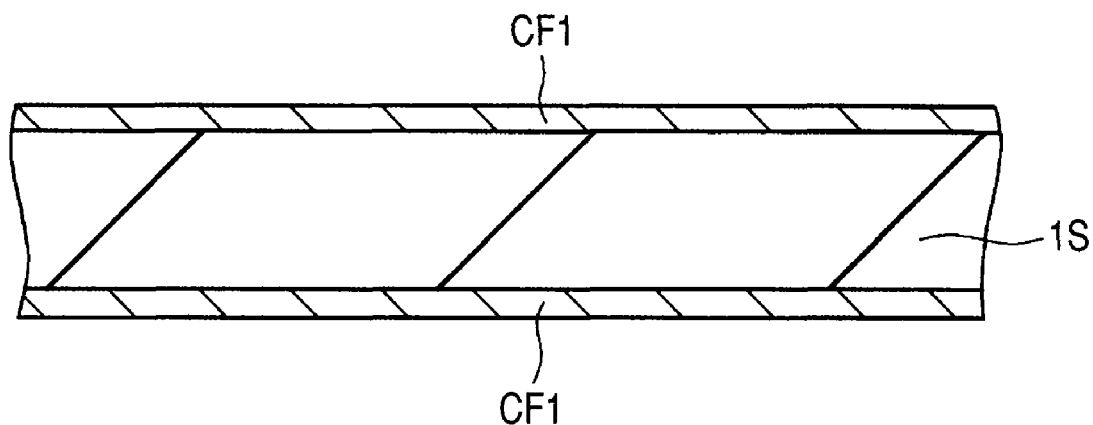
FIG. 27 is a sectional view showing a process for manufacturing the wiring board employed in the first embodiment.
Figure 28:
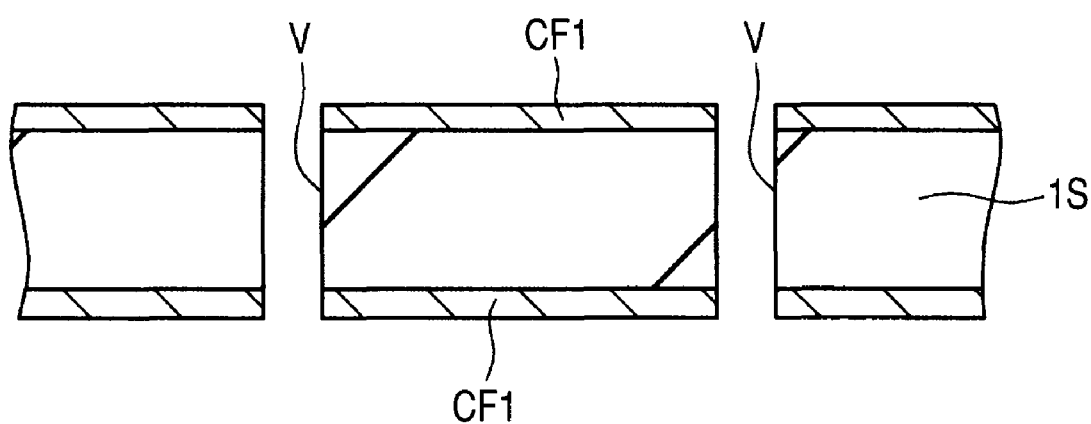
FIG. 28 is a sectional view following FIG. 27, showing the manufacturing process of the wiring board.

A wiring substrate or board 1S having both surfaces on which conductive films CF1 each comprised of, for example, a copper foil are attached or affixed, is prepared as shown in FIG. 27. At this time, a base material that forms the wiring board is comprised of, for example, a glass BT material or a glass heat-resistance epoxy material. Subsequently, vias V are defined in via forming areas as shown in FIG. 28. The vias V are made by boring by a drill and formed so as to extend through the wiring board 1S with the conductive films CF1 being affixed to both surfaces thereof.

Figure 29:
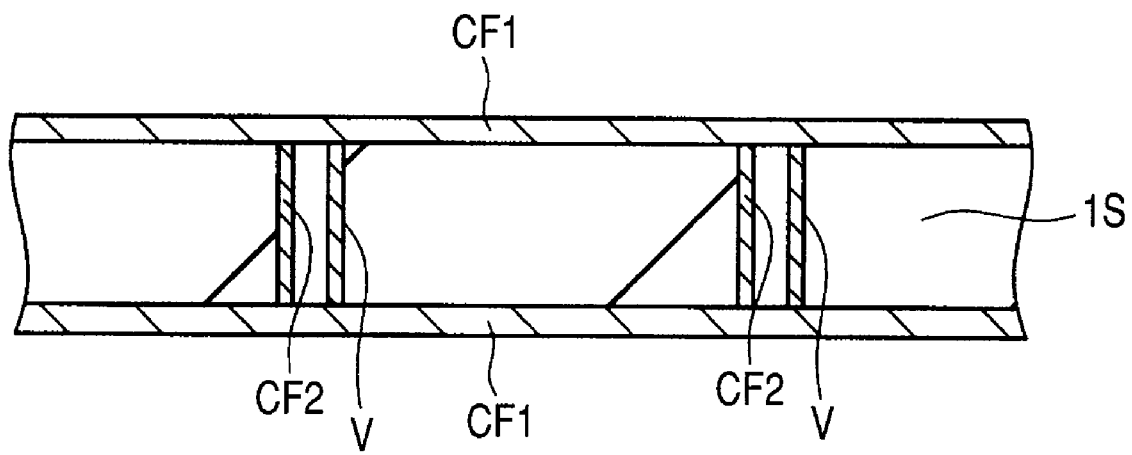
FIG. 29 is a sectional view following FIG. 28, showing the manufacturing process of the wiring board.

Next, as shown in FIG. 29, conductive films CF2 each comprised of a copper plating film are respectively formed at both surfaces of the conductive films CF1 attached to the wiring board 1S. The conductive films CF2 each comprised of the copper plating film can be formed by, for example, an electroless plating method or an electrolytic plating method. The conductive films CF2 each comprised of the copper plating film are respectively formed even over the side surfaces of the vias V that penetrate the wiring board 1S. Incidentally, while the conductive films CF2 are formed even over the conductive films CF1 formed at both surfaces of the wiring board 1S, the conductive films CF1 and CF2 will be described as the conductive films CF1 integrally in the drawings subsequent to FIG. 29.

Figure 30:
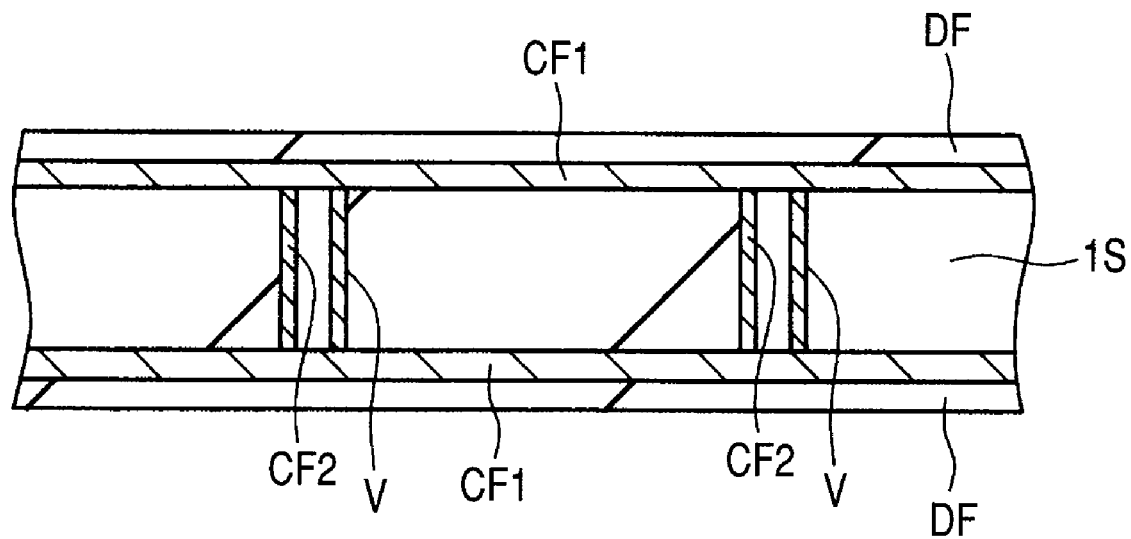
FIG. 30 is a sectional view following FIG. 29, showing the manufacturing process of the wiring board.

Subsequently, as shown in FIG. 30, the surface of each conductive film CF1 is ground or polished and thereafter dry films DF are affixed onto the double-sided conductive films CF1. The dry film DF is a film cured when irradiated with ultraviolet light. The dry films DF are used to form masks upon patterning the conductive films CF1.

Figure 31:
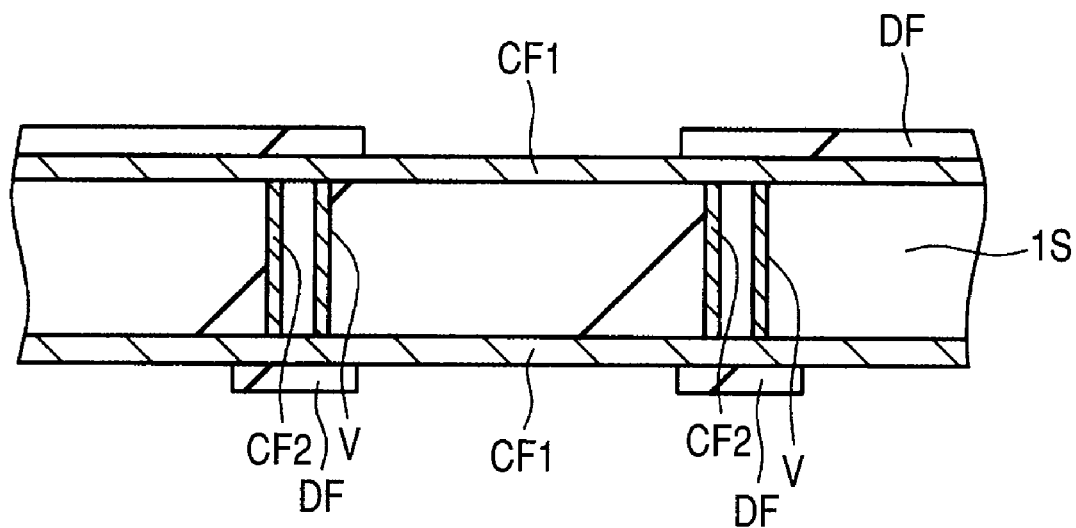
FIG. 31 is a sectional view following FIG. 30, showing the manufacturing process of the wiring board.

Thereafter, as shown in FIG. 31, masks (not shown) are placed on both sides of the wiring board 1S, and the ultraviolet light is applied via the masks. Consequently, each pattern formed in each of the masks is transferred to the corresponding dry film DF. The dry film DF with the pattern transferred thereto is developed, so that the dry film DF is patterned. For example, an area unirradiated with the ultraviolet light, of each dry film DF is removed by development.

Figure 32:
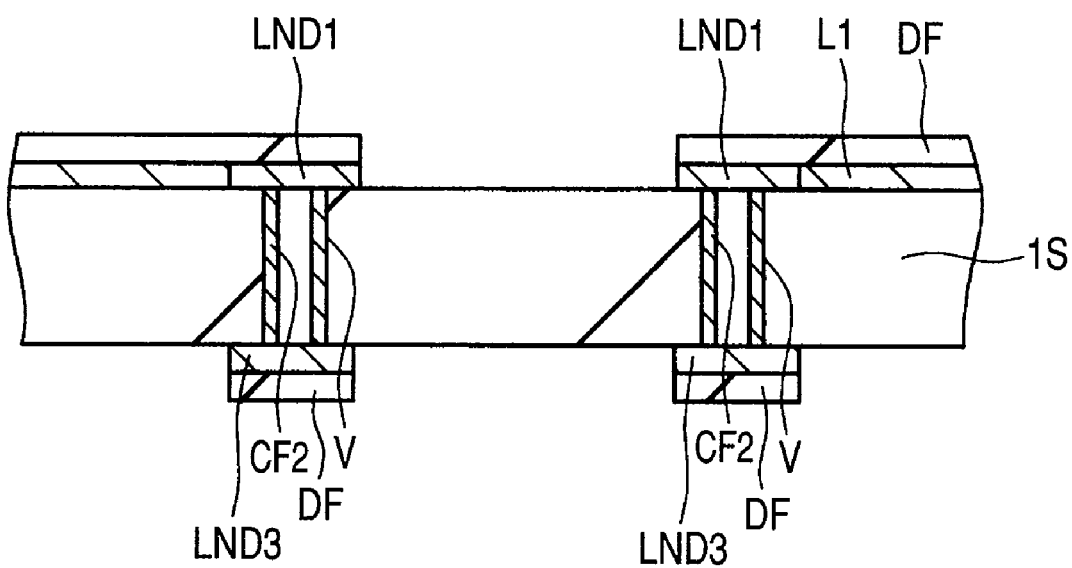
FIG. 32 is a sectional view following FIG. 31, showing the manufacturing process of the wiring board.

Next, as shown in FIG. 32, the conductive films CF1 are etched with the patterned dry films DF as masks. Thus, the patterns formed in the dry films DF are reflected onto the conductive films CF1. Described specifically, lands LND1 respectively coupled to the vias V, and wirings L1 that extend with being respectively coupled to the lands LND1 are formed at the surface (upper surface) of the wiring board 1S. On the other hand, lands LND3 respectively coupled to the vias V are formed at the back surface (lower surface) of the wiring board 1S. Thus, a land on via structure is formed wherein the via V is disposed over its corresponding land LND3 formed at the back surface of the wiring board 1S.

Figure 33:
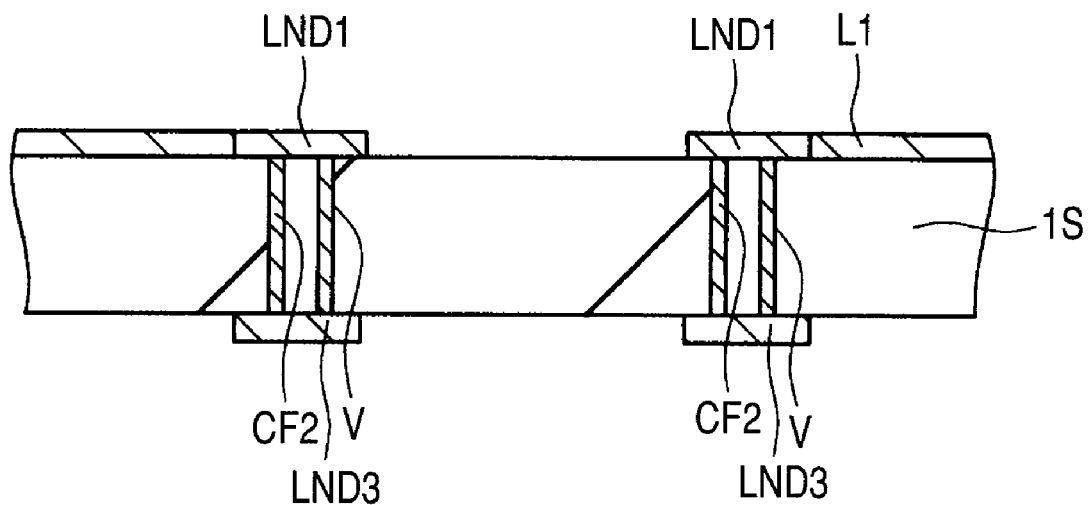
FIG. 33 is a sectional view following FIG. 32, showing the manufacturing process of the wiring board.

Thereafter, as shown in FIG. 33, the patterned dry films DF are eliminated. Thus, the lands LND1 respectively coupled to the vias V and the wirings L1 that extend with being coupled to the lands LND1 are exposed onto the surface (upper surface) of the wiring board 1S. The lands LND3 respectively coupled to the vias V are exposed onto the back surface (lower surface) of the wiring board 1S. An inspection as to whether each pattern is normally formed is performed in this stage. For example, an optical inspection apparatus or the like is used for the inspection.

Figure 34:
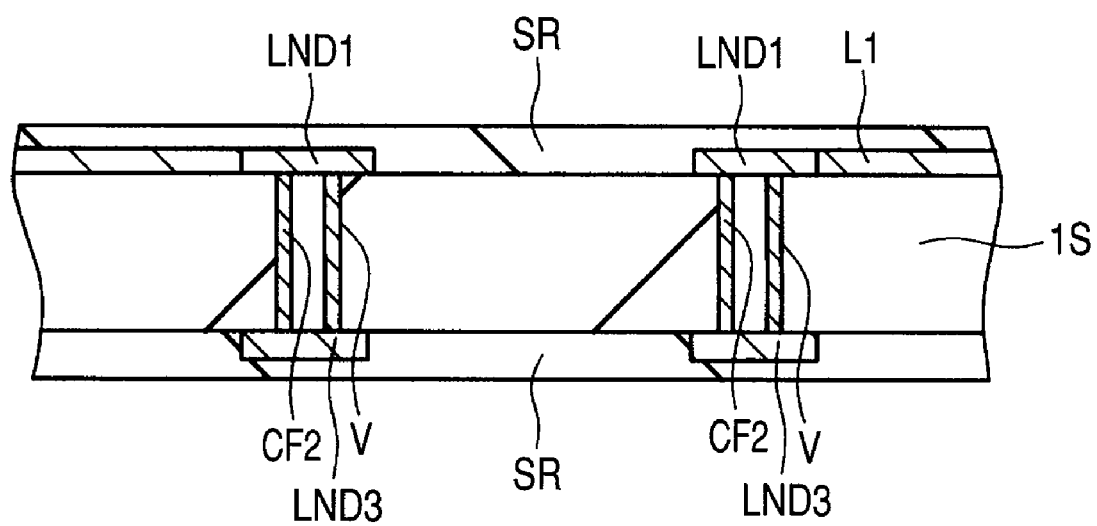
FIG. 34 is a sectional view following FIG. 33, showing the manufacturing process of the wiring board.

Subsequently, as shown in FIG. 34, a solder resist SR is applied onto both surfaces of the wiring board 1S. In order to apply the solder resist SR onto both surfaces of the wiring board 1S, the solder resist SR is first applied onto one surface of the wiring board 1S and temporarily dried. After the solder resist SR has been temporarily dried, the solder resist SR is applied onto the other surface of the wiring board 1S and temporarily dried. Thus, the solder resist SR can be formed over both surfaces of the wiring board 1S. At this time, the lands LND1 and the wirings L1 are covered with the solder resist SR at the surface (upper surface) of the wiring board 1S. Similarly, the lands LND3 are covered with the solder resist SR at the back surface (lower surface) of the wiring board 1S.

Figure 35:
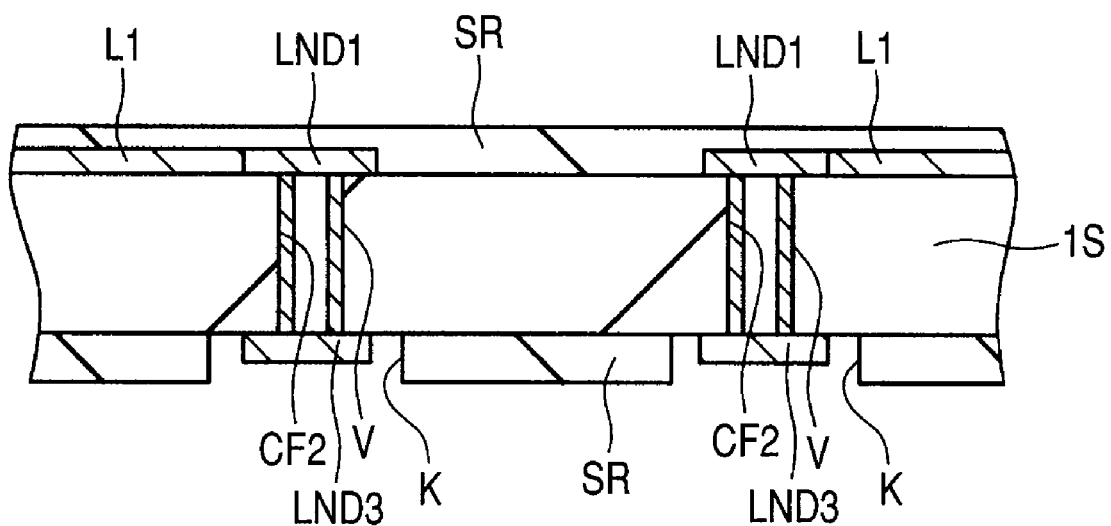
FIG. 35 is a sectional view following FIG. 34, showing the manufacturing process of the wiring board.

Next, as shown in FIG. 35, openings K are defined in the solder resist SR by using photolithography technology.

Namely, the openings K are defined in the back surface (lower surface) of the wiring board 1S. The openings K are defined so as to expose the lands LND3 formed at the back surface (lower surface) of the wiring board 1S. Described specifically, the diameter of each opening K becomes larger than that of each land LND3. And the openings K are formed so as to include the lands LND3 internally in plan view. Thus, a configuration form of the land LND3 formed at the back surface (lower surface) of the wiring board 1S can be taken as an NSMD. After the solder resist SR has been main-cured (main-dried), a nickel/gold plating film is formed over each land LND3 exposed from the opening K. Terminals each formed with the nickel/gold plating film can be formed over the lands LND3 in this way. Thereafter, the wiring board 1S is cleaned and a visual inspection is done, thereby leading to the completion of the wiring board 1S. The wiring board 1S employed in the first embodiment of the present application can be manufactured in the above-described manner.

Figure 36:
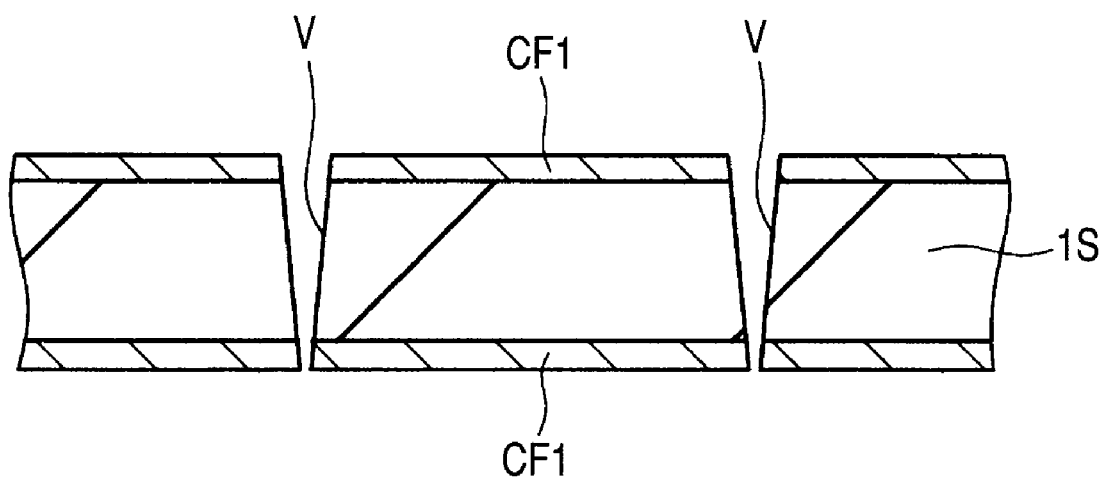
FIG. 36 is a sectional view following FIG. 35, showing the manufacturing process of the wiring board.

Incidentally, although the vias V are formed by boring by the drill as the method of forming the vias V that penetrate the wiring board 1S as shown in FIG. 28 in the first embodiment of the present application, the vias V can also be formed by laser irradiation. The vias V formed by the laser irradiation are shown in FIG. 36. As shown in FIG. 36, each of the vias V formed by the laser irradiation has the feature that the diameter thereof on the back (lower surface) side of the wiring board 1S becomes smaller than the diameter thereof on the surface (upper surface) side of the wiring board 1S. Namely, when laser is applied from the surface side of the wiring board 1S, the diameter of the via formed at the surface of the wiring board 1S becomes maximum and thereafter the diameter thereof gradually becomes smaller as the back surface of the wiring board 1S proceeds. And the diameter of each via becomes minimum at the back surface of the wiring board 1S. As a result, a recess or depression in each land LND3 formed over the via V at the back surface of the wiring board 1S can be reduced. That is, since the diameter of the via at the back surface of the wiring board 1S can be reduced upon the formation of each via V by the laser irradiation, the recess produced in each land LND3 that blocks or closes the surface of the via V can be made small. This means that variations in the height of the half ball formed over its corresponding land LND3 can be reduced. Namely, the first embodiment of the present application can obtain a synergistic effect that the variations in the height of each half ball with the reduction in the recess produced in the land LND3 formed on the via V can be reduced by application of the method for forming each via V by the laser irradiation, in addition to the advantageous effect that the variations in the height of the half ball based on the land on via structure can be reduced.

Figure 37:
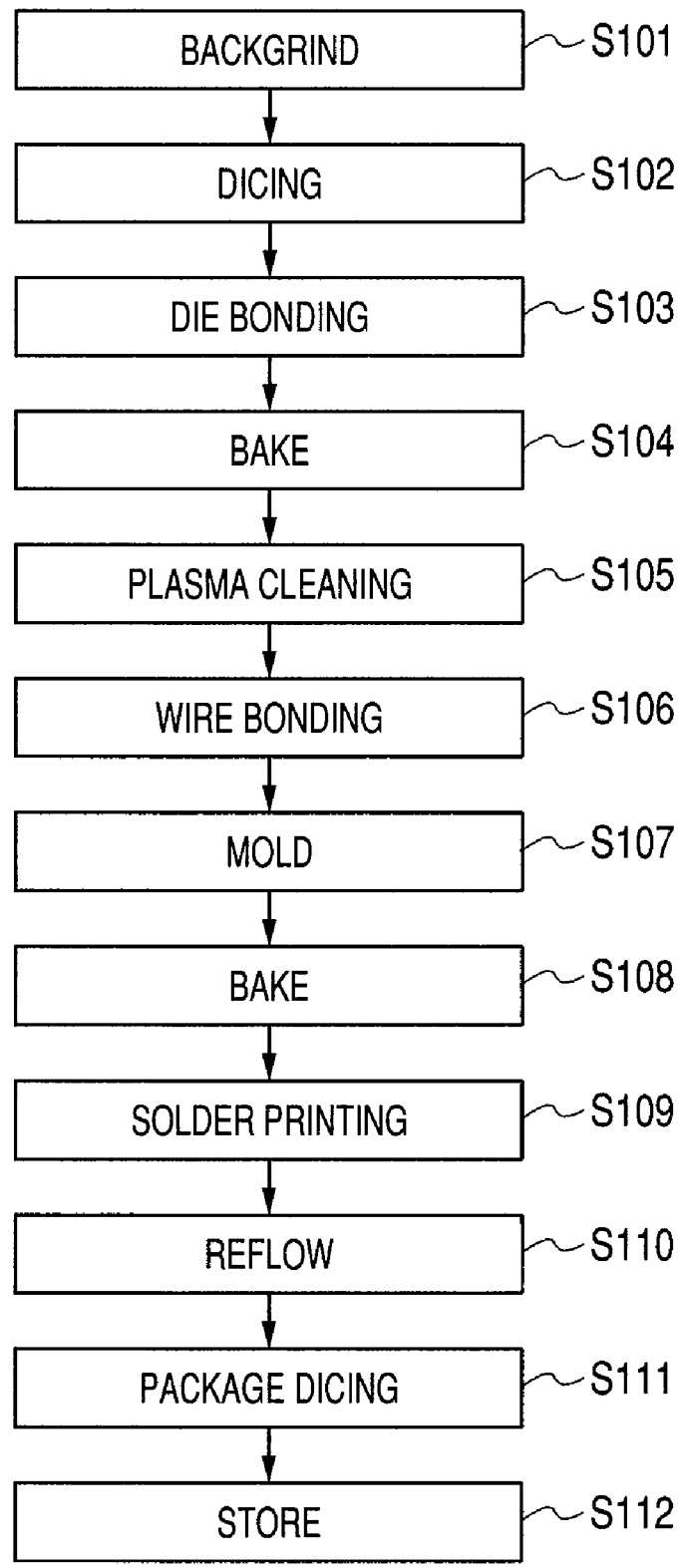
FIG. 37 is a flowchart illustrating the flow of a process for manufacturing a half ball LGA.

A manufacturing process for forming the half ball LGA (semiconductor device) by using the wiring board 1S referred to above will subsequently be explained with reference to the drawings. FIG. 37 is a flowchart showing the flow of the manufacturing process for forming the half ball LGA. Transistors (MISFETs (Metal Insulator Semiconductor Field Effect Transistors) and a multilayered wiring are formed over a semiconductor wafer using a normal semiconductor manufacturing technology, thereby forming an integrated circuit that configures an RFIC.

Figure 38:
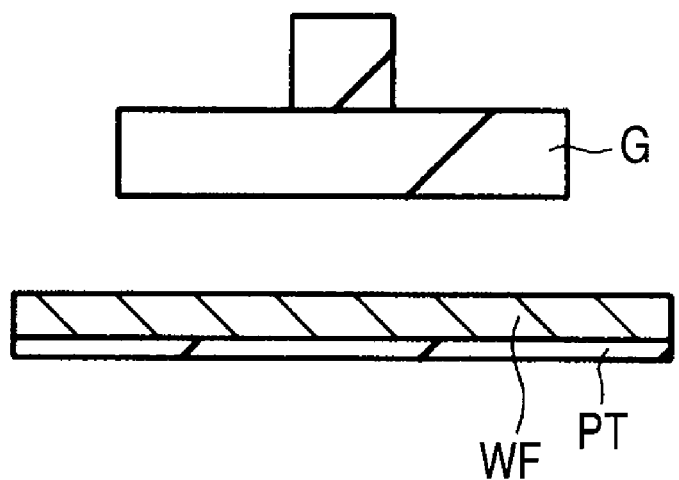
FIG. 38 is a sectional view showing the manufacturing process of the half ball LGA.

Thereafter, as shown in FIG. 38, the back surface of a semiconductor wafer WF is background (S101 in FIG. 37). The grinding of the back surface of the semiconductor wafer WF is carried out as shown below. Namely, an element forming surface (front surface) of the semiconductor wafer WF is covered with a protection tape PT and thereafter the semiconductor wafer is placed on its corresponding stage with the back surface lying on the side opposite to the element forming surface (front surface) of the semiconductor wafer WF being turned upward. And the back surface of the semiconductor wafer WF is ground by a grinder G thereby to make thin the thickness of the semiconductor wafer WF. Thus, the grinding of the semiconductor wafer WF can be performed.

Figure 39:
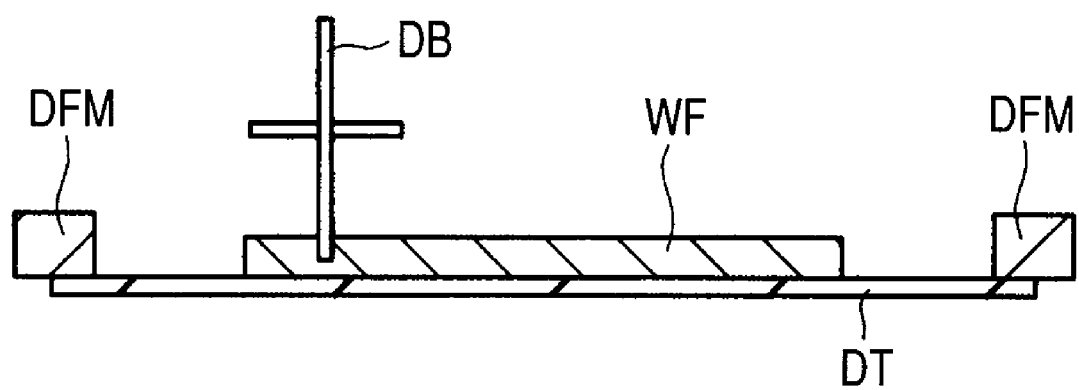
FIG. 39 is a sectional view following FIG. 38, showing the manufacturing process of the half ball LGA.

Next, as shown in FIG. 39, the semiconductor wafer WF is subjected to dicing thereby fractionizing it into individual semiconductor chips (S102 in FIG. 37). The dicing of the semiconductor wafer WF is performed as shown below. A dicing tape DT is first applied onto a concentrically-formed dicing frame DFM and thereafter the semiconductor wafer WF is placed over the dicing tape DT. By using a dicing blade DB, the semiconductor wafer WF is cut along each dicing line thereby to fractionize the semiconductor wafer WF into the semiconductor chips.

Figure 40:
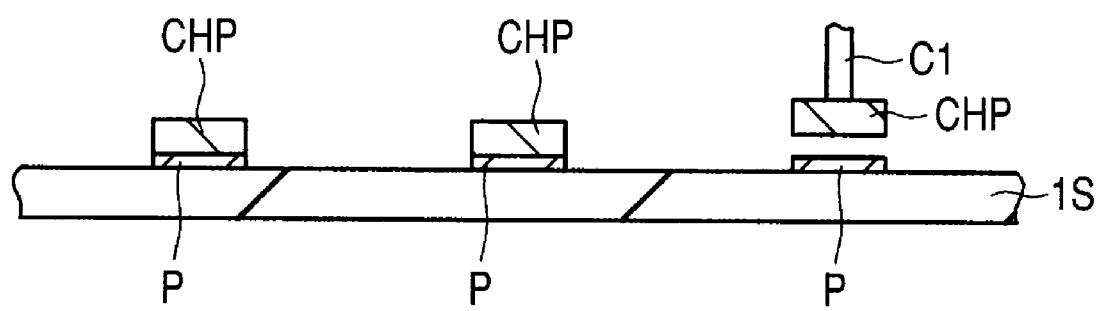
FIG. 40 is a sectional view following FIG. 39, showing the manufacturing process of the half ball LGA.

As shown in FIG. 40, the fractionized semiconductor chips CHP are mounted over the wiring board 1S formed in accordance with the above process (die bonding) (S103 in FIG. 37). The die bonding of each semiconductor chip CHP is performed by adsorbing the semiconductor chip CHP by a collet C1, thereafter placing the semiconductor chip CHP over the wiring board 1S and bonding the semiconductor chip CHP and the wiring board 1S to each other with insulating paste P. At this time, the wiring board 1S is integrated in such a manner that a plurality of half ball LGA can be formed, and the semiconductor chips CHP are respectively mounted to individual half ball LGA acquisition areas. Thereafter, heat treatment (bake) is done to enhance the strength of bonding between each semiconductor chip CHP and the wiring board 1S (S104 in FIG. 37).

Subsequently, plasma cleaning is performed on the surface (chip mounting surface) of the wiring board 1S with the semiconductor chips CHP mounted thereon (S105 in FIG. 37). The plasma cleaning is performed with the aim of enhancing adhesion between a resin and the wiring board 1S in a mold process to be executed subsequently.

Figure 41:
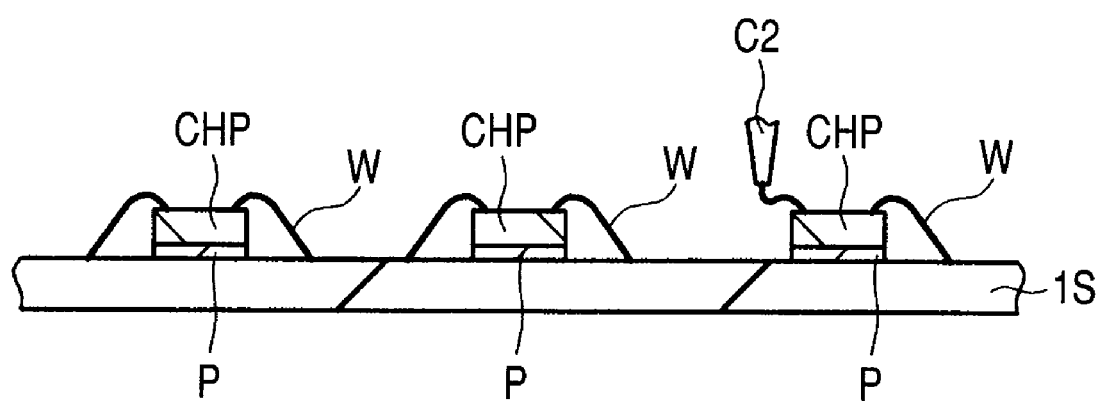
FIG. 41 is a sectional view following FIG. 40, showing the manufacturing process of the half ball LGA.

Thereafter, as shown in FIG. 41, electrodes formed over the wiring board 1S and pads for the semiconductor chips CHP are coupled by wires W (wire bonding)(S106 in FIG. 37). Described concretely, first bonding is performed on the pad for each semiconductor chip CHP by a capillary C2 and thereafter the capillary C2 is moved, thereby performing second bonding on the electrodes of the wiring board 1S. Thus, the electrodes of the wiring board 1S and the pads for the semiconductor chips CHP are electrically coupled to one another by wires W comprised of, for example, a gold line.

Figure 42:
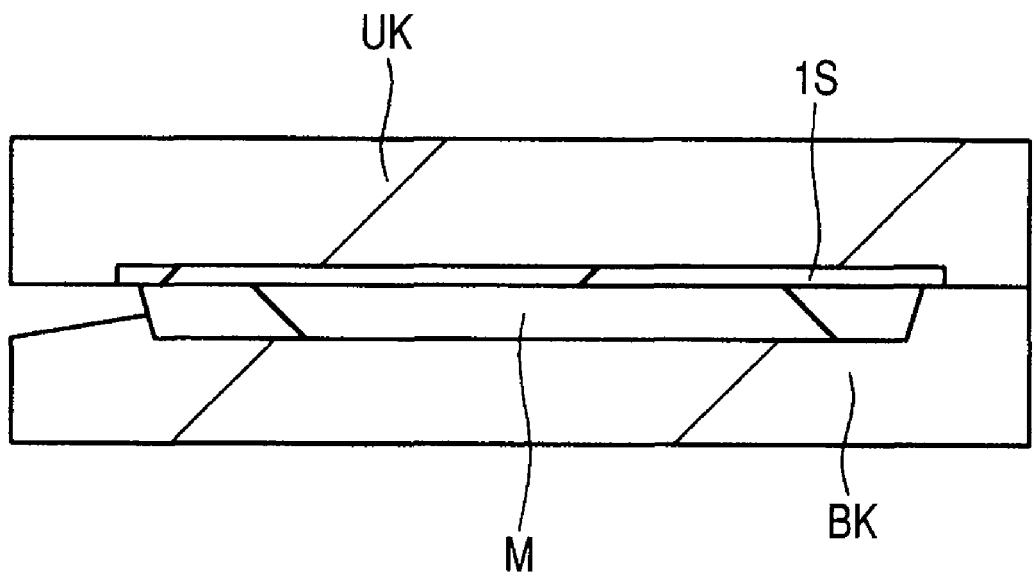
FIG. 42 is a sectional view following FIG. 41, showing the manufacturing process of the half ball LGA.

Next, as shown in FIG. 42, the entire chip mounting surface of the wiring board 1S is sealed with a resin M (mold)(S107 in FIG. 37). Described specifically, the wiring board 1S with the semiconductor chips CHP mounted thereto is nipped with an upper die UK and a lower die BK from above and below, and the resin M is poured into the chip mounting surface of the wiring board 1S through an insertion slot, thereby sealing the chip mounting surface of the wiring board 1S with the resin M. Thereafter, bake is performed on the wiring board 1S to cure the resin M (S108 in FIG. 37).

Figure 43:
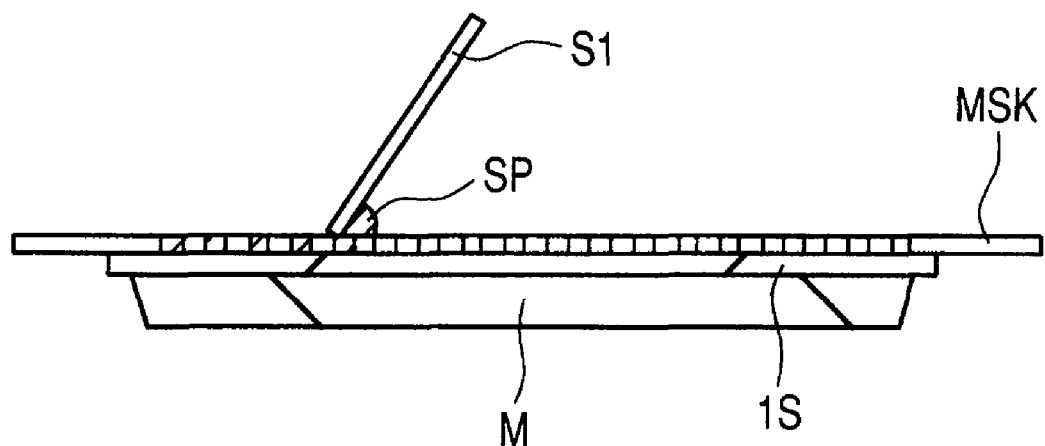
FIG. 43 is a sectional view following FIG. 42, showing the manufacturing process of the half ball LGA.
Figure 44:
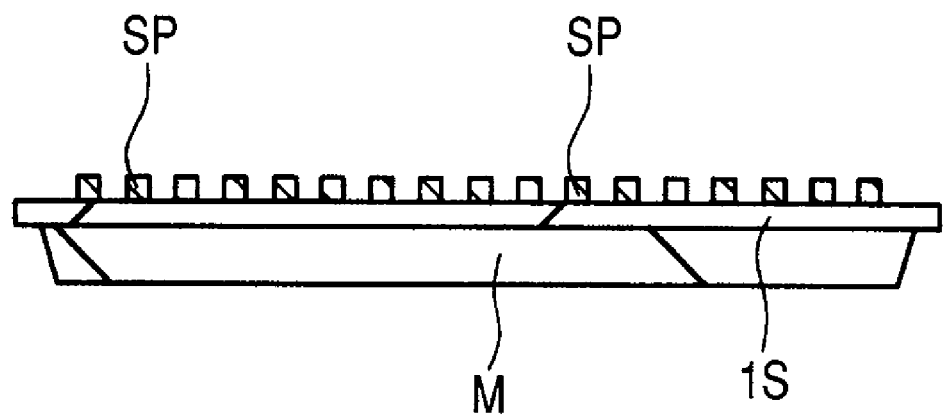
FIG. 44 is a sectional view following FIG. 43, showing the manufacturing process of the half ball LGA.
Figure 45:
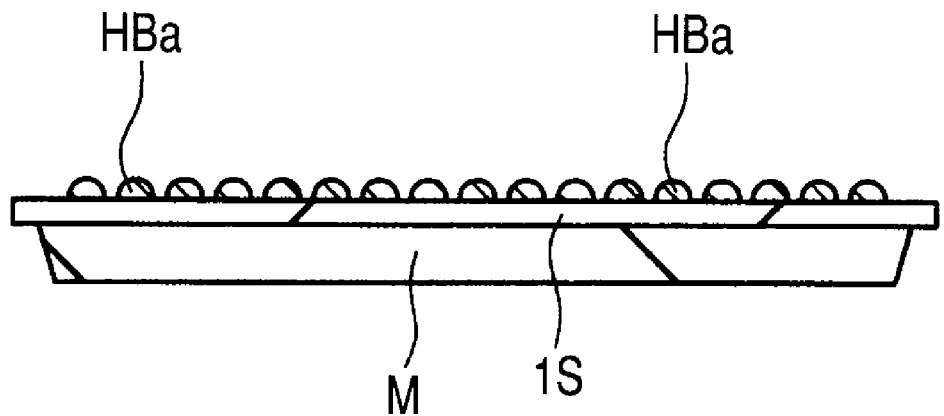
FIG. 45 is a sectional view following FIG. 44, showing the manufacturing process of the half ball LGA.

Subsequently, as shown in FIG. 43, solder paste SP is applied onto the back surface of the wiring board 1S by solder printing (S109 in FIG. 37). Described specifically, a metal mask MSK is placed over the back surface of the wiring board 1S, and the solder paste SP is printed onto the metal mask MSK by a squeegee S1. Thus, as shown in FIG. 44, the solder paste SP is formed on each land (land LND3 (not shown)) of the wiring board 1S. As shown in FIG. 45, reflow is performed on the wiring board 1S (S110 in FIG. 37). Consequently, the solder past SP formed at the back surface of the wiring board 1S becomes each hemispheric half ball HBa. External coupling terminals each comprised of the half ball HBa can be formed over the back surface of the wiring board 1S in this way.

Figure 46:
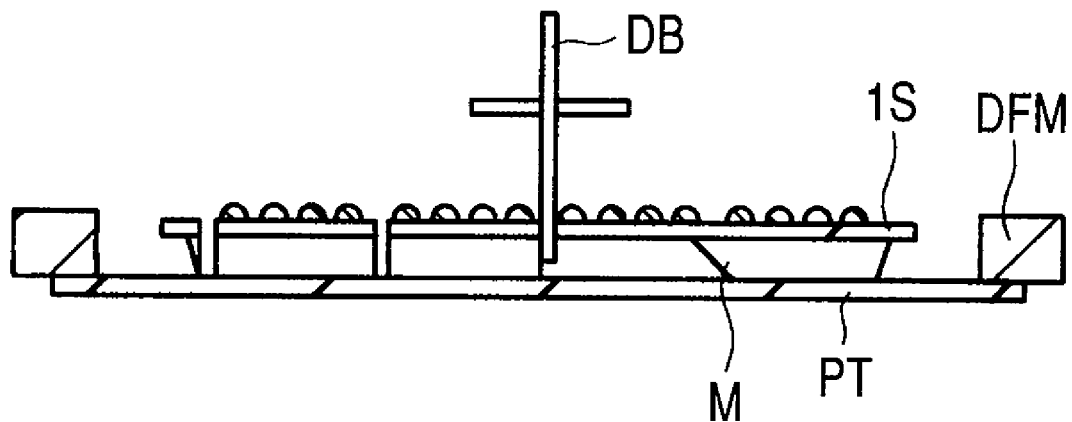
FIG. 46 is a sectional view following FIG. 45, showing the manufacturing process of the half ball LGA.
Figure 47:
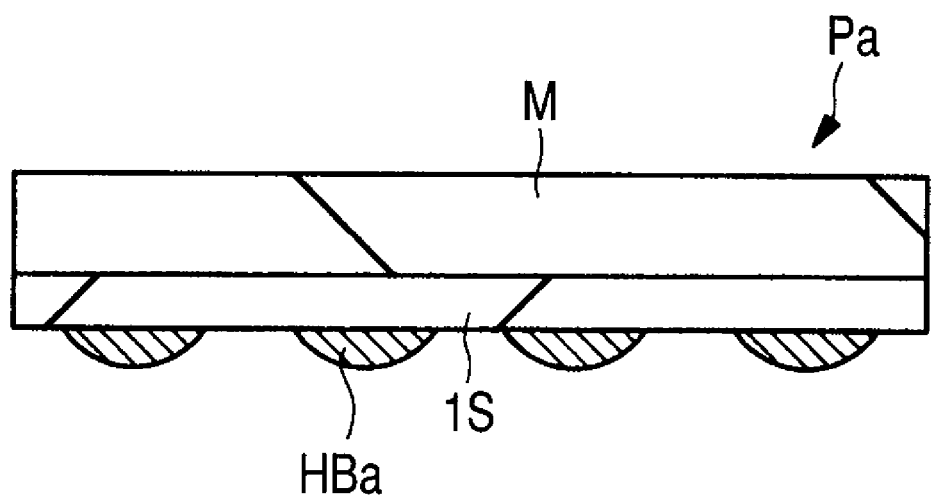
FIG. 47 is a sectional view illustrating a half ball LGA.

Next, as shown in FIG. 46, the wiring board 1S is subjected to dicing (package dicing) (S111 in FIG. 37). The dicing of the wiring board 1S is performed as shown below. A dicing tape DT is first applied or attached onto a concentrically-formed dicing frame DMF and thereafter the wiring board 1S is placed over the dicing tape DT. The wiring board 1S is cut using a dicing blade DB, thereby making it possible to obtain individual packages. FIG. 47 is a sectional view showing a package Pa manufactured through the above process steps. As shown in FIG. 47, the package Pa is a half ball LGA, and a chip mounting surface of the wiring board 1S is sealed with a resin M. On the other hand, external coupling terminals each comprised of a half ball HBa are formed over the surface opposite to the chip mounting surface of the wiring board 1S. The package Pa comprised of the half ball LGA can be manufactured in this way, and the manufactured package Pa is stored and shipmented (S112 in FIG. 37).

Figure 48:
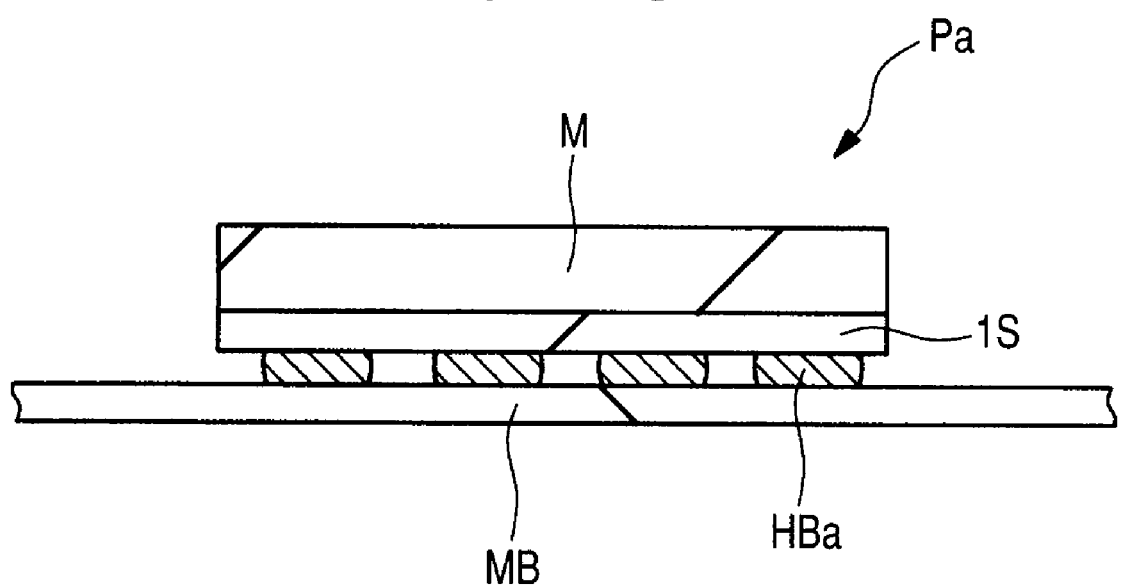
FIG. 48 is a sectional view showing the manner in which a half ball LGA is mounted onto a mother board.

A process for mounting the package Pa comprised of the half ball LGA onto a motherboard (mounting substrate or board) will subsequently be explained. FIG. 48 is a sectional view showing the manner in which a package Pa comprised of a half ball LGA is mounted onto a motherboard MB. It is understood that as shown in FIG. 48, the package Pa comprised of the half ball LGA has been mounted on the motherboard MB via half balls HBa corresponding to external coupling terminals.

Figure 49:
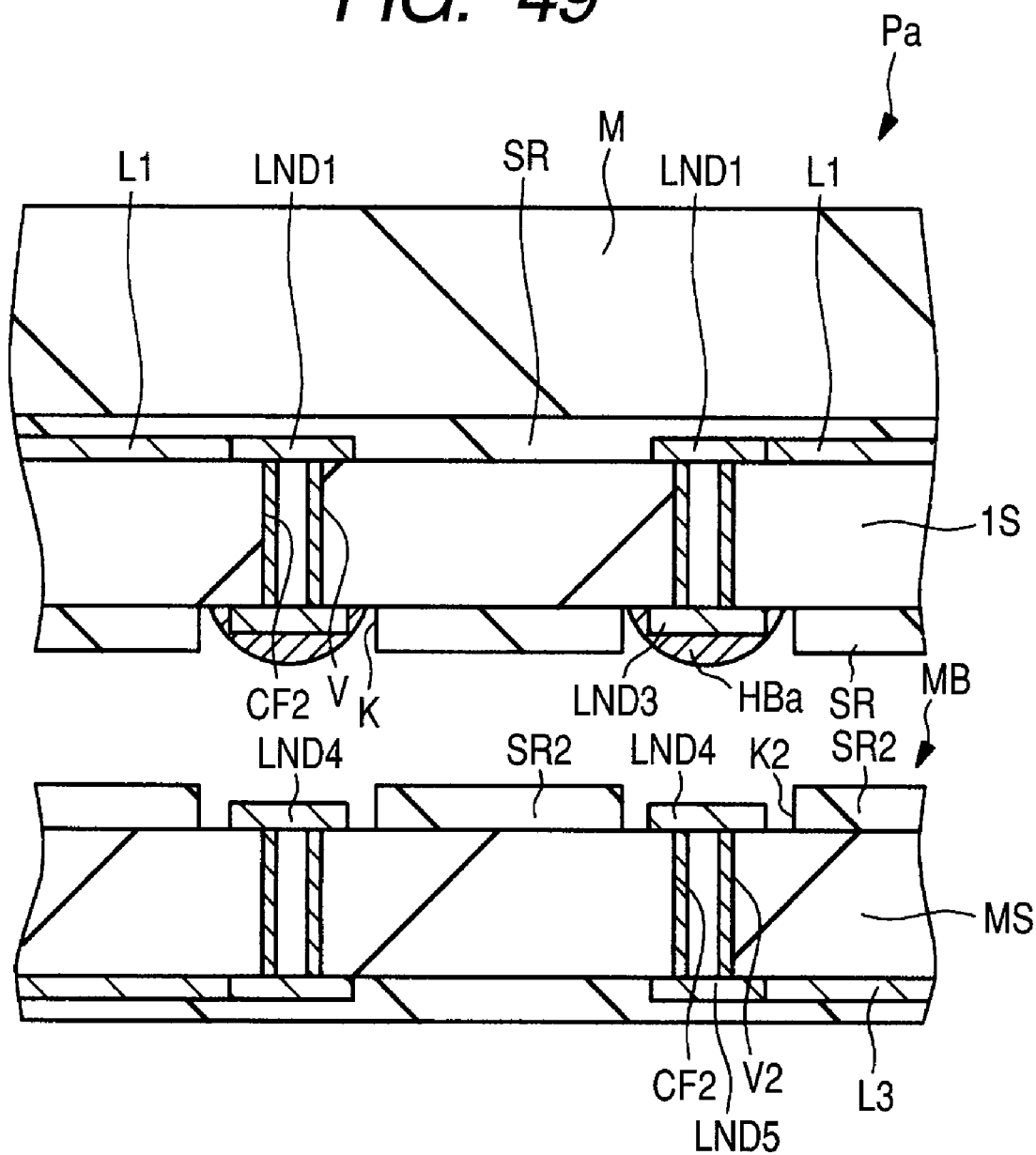
FIG. 49 is a sectional view showing a process for mounting a half ball LGA onto a mother board.

FIG. 49 is an enlarged sectional view for describing the manner in which a package Pa comprised of a half ball LGA is mounted onto a motherboard (mounting substrate or board). In FIG. 49, the package Pa has a wiring board 1S, which is formed with vias V that extend through the wiring board 1S. Conductive films CF2 each comprised of a plating film are formed over the side surfaces of the vias V. Lands LND3 are formed at the back surface (lower surface) of the wiring board 1S so as to be coupled directly to the vias V respectively. Half balls HBa corresponding to external coupling terminals are formed over their corresponding lands LND3. Thus, a land on via structure is formed. A solder resist SR is formed at the back surface (lower surface) of the wiring board 1S, and the lands LND3 are respectively formed inside openings K defined in the solder resist SR. At this time, the diameter of the opening K is formed so as to be larger than that of the land LND3, and the configuration form of the land LND3 is taken as an NSMD. Namely, the package Pa (half ball LGA) according to the first embodiment of the present application is of a land on via structure and corresponds to a package in which the configuration form of the land LND3 is defined as an NSMD. Lands LND1 are formed at the surface (upper surface) of the wiring board 1S so as to be coupled to the vias respectively. Wirings L1 are formed at the surface thereof so as to be coupled to the lands LND1 respectively. The lands LND1 and the wirings L1 formed at the surface of the wiring board 1S are covered with a solder resist SR. A resin M is formed over the solder resist SR. If described in detail, although not illustrated in FIG. 49, each semiconductor chip (not shown) is mounted onto the solder resist SR formed over the surface (upper surface) of wiring board 1S, and the resin M is formed so as to cover each semiconductor chip.

On the other hand, the configuration of a motherboard MB will be explained. The motherboard MB has a substrate MS. Vias V2 that penetrate the substrate MS are defined in the substrate MS. A conductive film CF2 is formed over the side surface of each via V2. Lands LND4 are formed at the surface (upper surface) of the wiring board 1S so as to be coupled to the vias V2. A solder resist SR2 is formed at the surface (upper surface) of the wiring board 1S. Lands LND4 are respectively formed inside openings K defined in the solder resist SR2. Here, the diameter of each opening K2 is larger than that of each land LND4, and the opening K2 is formed so as to include a LND4 internally. Each of the lands LND4 formed at the motherboard MB in this way has a land on via structure formed directly on the via V2 and is defined or taken as an NSMD. In the first embodiment of the present application, the configuration of the land LND4 formed at the motherboard MB is characterized by having the land on via structure and being taken as the NSMD. On the other hand, lands LND5 respectively coupled to the vias V2 and wirings L3 respectively coupled to the lands LND5 are formed at the back surface (lower surface) of the substrate MS. The lands LND5 and the wirings L3 are covered with a solder resist SR.

Figure 50:
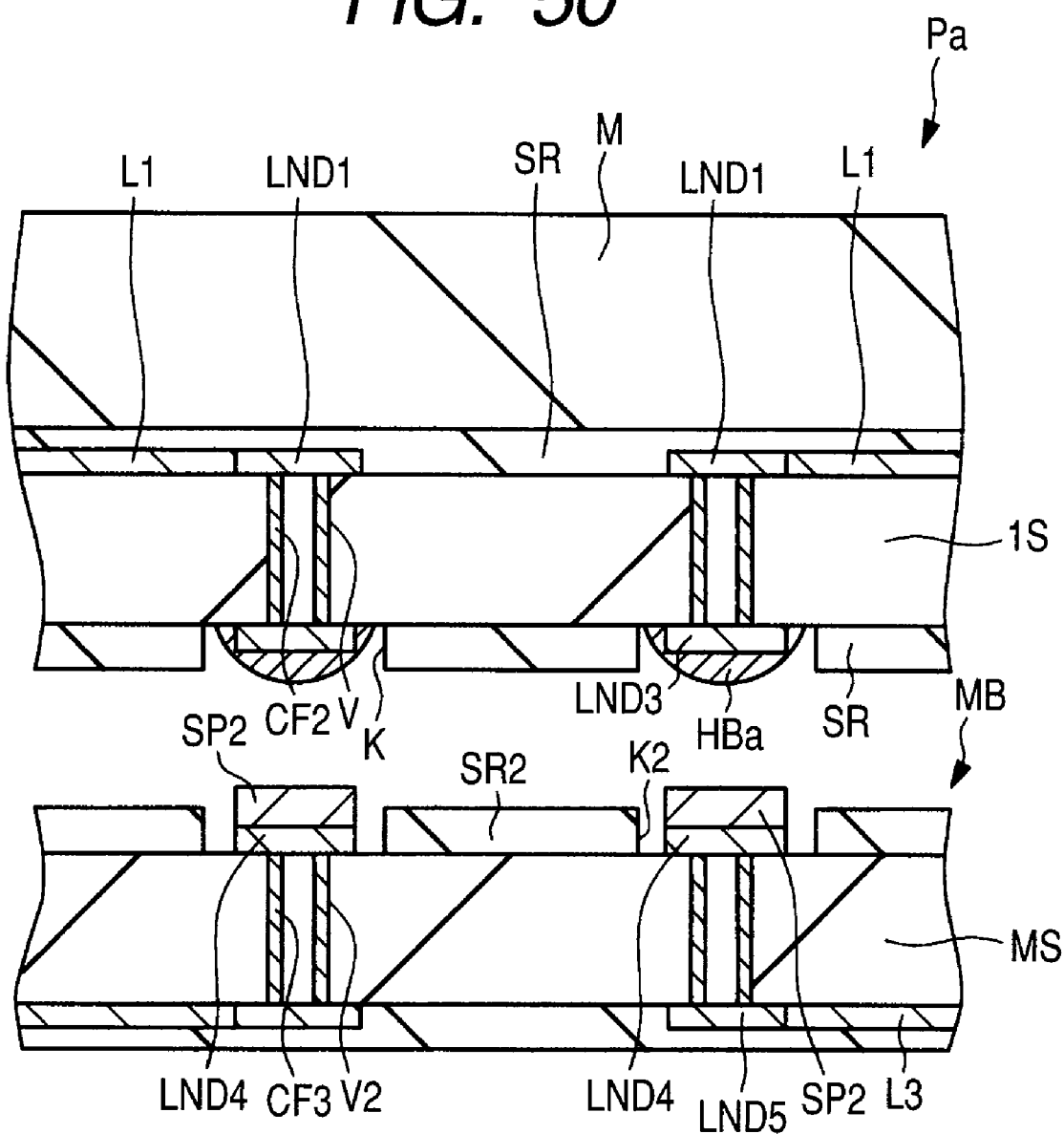
FIG. 50 is a sectional view following FIG. 49, showing the mounting process.
Figure 51:
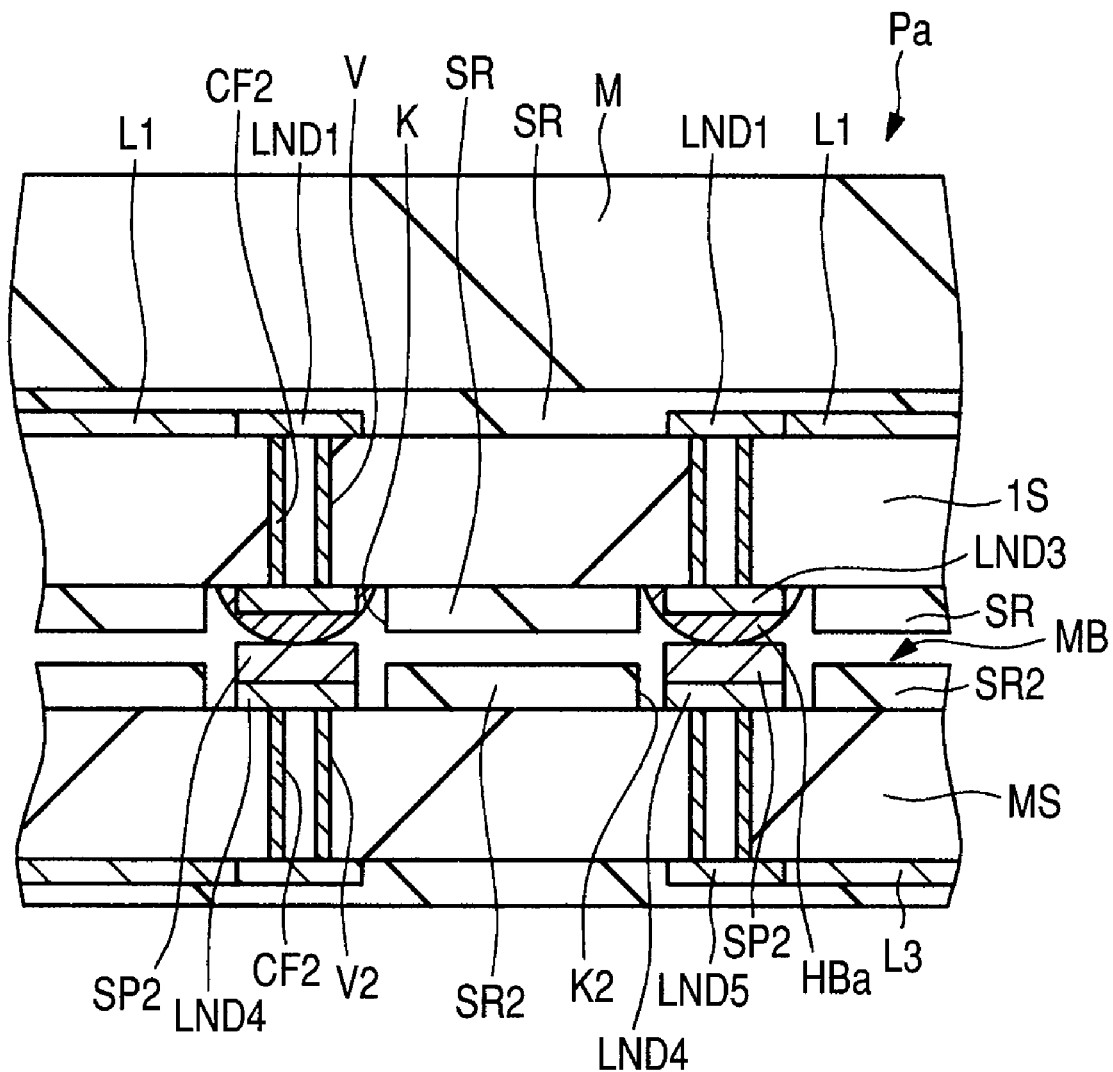
FIG. 51 is a sectional view following FIG. 50, showing the mounting process.
Figure 52:
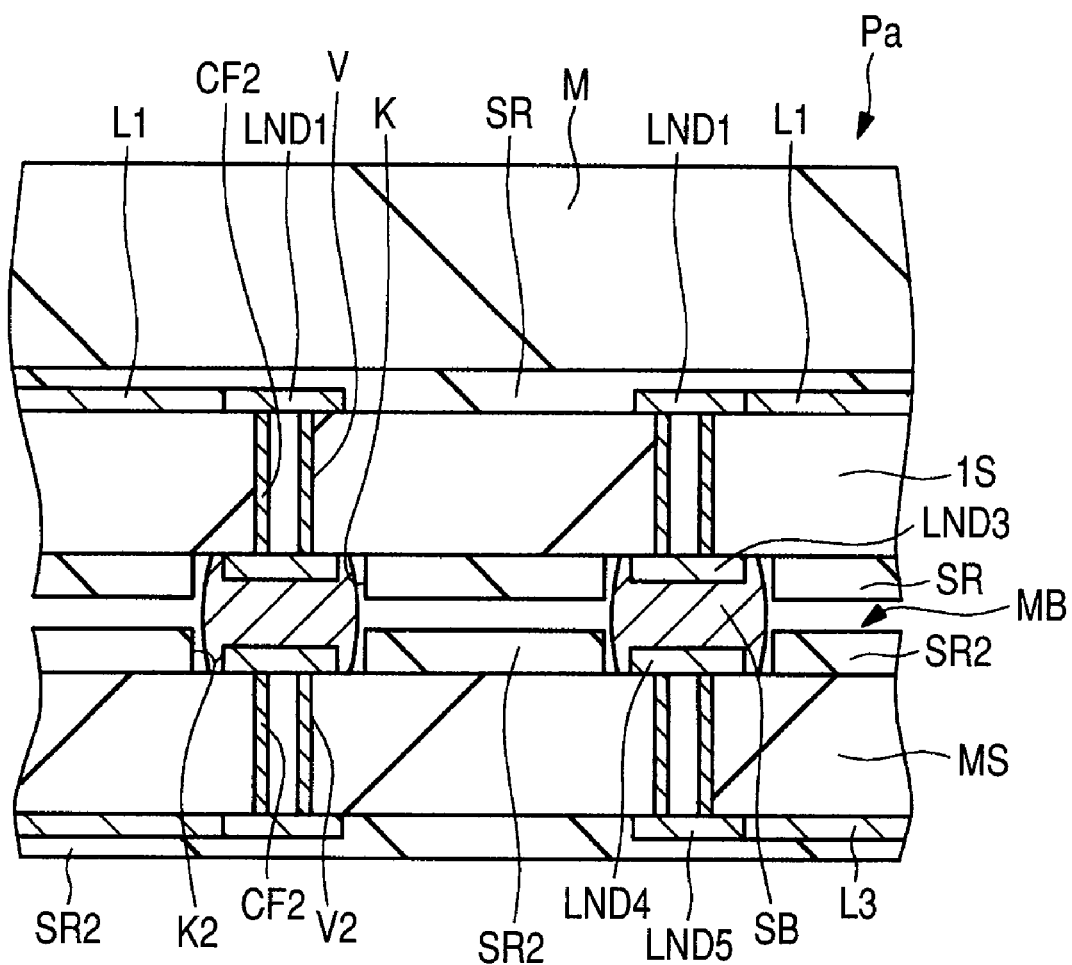
FIG. 52 is a sectional view following FIG. 51, showing the mounting process.

The package Pa and the motherboard MB configured in the above-described manner are bonded to each other. Described concretely, solder paste (opposing solder) SP2 is formed over each land LND4 formed at the motherboard MB as shown in FIG. 50. As shown in FIG. 51, the solder paste SP2 formed at the motherboard MB and its corresponding half ball HBa formed at the package Pa are coupled to each other. Thereafter, as shown in FIG. 52, the motherboard MB and the package Pa are reflowed (baked or heat-treated) to bring each half ball HBa formed at the package Pa and the solder paste SP2 formed at the motherboard MB into integration, thereby forming bonding solder SB. The package Pa and the motherboard MB can be bonded to each other in this way.

Here, the first embodiment of the present application has a feature even in that each of the lands LND4 formed at the motherboard MB is set to the land on via structure and taken as the NSMD. Described specifically, the lands LND4 formed at the motherboard MB are respectively brought into the land on via structure, thereby making it possible to bring the shape of the bonding solder SB that bonds the package Pa and the motherboard MB to each other into a shape at which the diameter of a central part of the bonding solder SB becomes larger than the diameter of its upper portion and the diameter of its lower portion. It is thus possible to enhance the strength of bonding between the package Pa and the motherboard MB. When, for example, each land LND4 formed at the motherboard MB is not taken as the land on via structure, those exposed from the openings K2 are the lands LND4 and parts of the wirings that couple the lands LND4 and the vias V. In this case, the bonding solder SB that bonds the package Pa and the motherboard MB to each other is brought into contact with not only the lands LND4 shaped in circular form but also parts of the wirings for coupling the lands LND4 and the vias V on the motherboard MB side. Therefore, the shape of the bonding solder SB is not brought into such a shape that the diameter of its central part becomes larger than the diameter of its upper portion and the diameter of its lower portion due to the contact of the lands LND4 and the vias V with the parts of the wirings, thus reducing mounting strength. Thus, in the first embodiment of the present application, the lands LND4 formed at the motherboard MB are respectively set to the land on via structure, thereby making it possible to bring each component that contacts the bonding solder SB on the motherboard MB side only to the land LND4 shaped in circular form. As a result, the first embodiment of the present application is capable of bringing the shape of the bonding solder SB into such a shape that the diameter of the central part thereof becomes larger than the diameter of the upper portion thereof and the diameter of the lower portion thereof and achieving an improvement in the strength of bonding between the package Pa and the motherboard MB.

Second Embodiment

A second embodiment of the present application is also targeted for a half ball LGA. The first embodiment of the present application has explained the example in which all of the lands formed at the back surface of the wiring board respectively adopt the land on via structure and the configuration form of each land is taken as the NSMD. On the other hand, the second embodiment of the present application will explain an example wherein only some of lands formed at the back surface of a wiring board adopt a land on via structure and the configuration form of the land is taken as an NSMD, whereas other lands do not adopt the land on via structure and the configuration form of the land is taken as an SMD.

Figure 53:
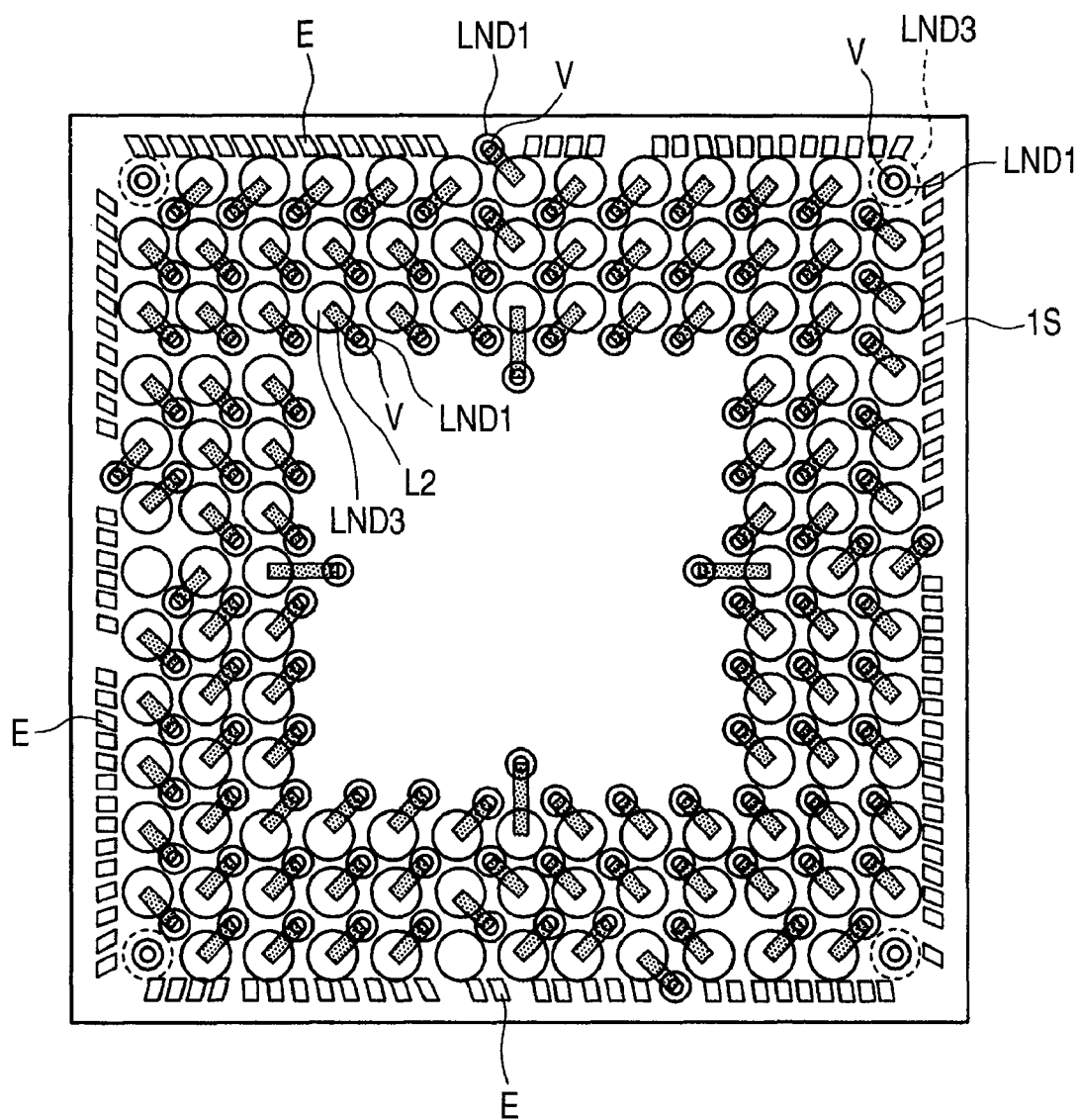
FIG. 53 is a diagram showing a configuration of a wiring board at a half ball LGA according to a second embodiment.

FIG. 53 is a diagram showing a configuration of a wiring substrate or board 1S at a half ball LGA of the second embodiment of the present application. FIG. 53 illustrates, in superimposed form, a configuration of a chip mounting surface (surface) of the wiring board 1S and a configuration of the surface (back surface) opposite to the chip mounting surface of the wiring board 1S. That is, in FIG. 53, electrodes E disposed along the four sides of the wiring board 1S and lands LND1 disposed in an area lying inside the electrodes E in lattice form are components formed at the surface of the wiring board 1S. Since the electrodes E and lands LND1 formed at the surface of the wiring board 1S become complicated in FIG. 53 although coupled to one another by wirings herein, the illustration of the wirings for coupling the electrodes E and the lands LND1 is omitted.

On the other hand, in FIG. 53, wirings L2 and lands LND3 disposed in lattice form are components formed at the back surface of the wiring board 1S. Vias V that penetrate the front surface of the wiring board 1S and the back surface of the wiring board 1S are illustrated.

In FIG. 53, the feature of the second embodiment of the present application resides in the layout relationship between the lands LND1, vias V and lands LND3 formed at the four corners (corner portions) of the wiring board 1S. Namely, in the second embodiment of the present application, the vias V are formed so as to overlap with the lands LND1 formed at the surface (chip mounting surface) of the wiring board 1S in plan view and be internally included within the lands LND1 at the corner portions of the wiring board 1S. The vias V are respectively coupled directly to the lands LND3 formed at the back surface of the wiring board 1S. Namely, the lands LND3 formed at the back surface of the wiring board 1S are respectively formed directly on the vias V and disposed so as to internally include the vias V in plan view. The configuration form of the land LND3 formed at the back surface of the wiring board 1S is adopted as an NSMD. As described above, the land LND3 and via V formed at each corner portion of the wiring board 1S adopt a land on via structure, and the configuration form of each land LND3 is taken as an NSMD. Thus, the strength of coupling between the land LND3 formed at the back surface of the wiring board 1S and its corresponding half ball (not shown) mounted on the land LND3 can be enhanced at each corner portion of the wiring board 1S.

Each of the lands LND3 disposed at the corner portions of the wiring board 1S is brought to the land on via structure and the configuration form of each land LND3 is taken as the NSMD due to the following reasons. Stress applied to the wiring board 1S is liable to concentrate on each corner portion of the wiring board 1S shaped in rectangular form. For example, the repetition of contraction and shrinkage in a temperature cycle applied to the wiring board 1S occurs and stress is produced due to the contraction and shrinkage. It is however known that this stress becomes the largest at the corner portion of the wiring board 1S. From this point of view, the lands LND3 disposed at the corner portions of the wiring board 1S and the half balls respectively mounted on the lands LND3 are easy to be separated from one another due to the stress. Namely, the strength of coupling between each of the lands LND3 and the half ball is reduced at each corner portion of the wiring board 1S due to the concentration of stress. When each of the lands LND3 formed at the back surface of the wiring board 1S and the half ball are separated from each other, a failure occurs.

Thus, it is understood that in terms of a reduction in the failure of the half ball LGA, it is necessary to enhance the strength of coupling between the land LND3 and the half ball at each corner portion of the wiring board 1S on which the stress concentrates. Therefore, the second embodiment of the present application adopts the configuration form of each land LND3 disposed at the corner portion of the wiring board 1S on which the stress concentrates, as the NSMD thereby to enhance the strength of coupling between each land LND3 and its corresponding half ball. When, however, the configuration form of the land LND3 is taken as the NSMD, variations in the height of each half ball mounted on the land LND3 becomes manifest. Therefore, the second embodiment of the present application adopts the land on via structure in which no wiring is used for the coupling between the land LND3 and the via V. In the second embodiment of the present application as described above, the configuration form of the land LND3 disposed at the corner portion of the wiring board 1S is taken as the NSMD to enhance the strength of mounting between each land LND3 and its corresponding half ball at the corner portion of the wiring board 1S. The land LND3 and the via V are coupled to each other by the land on via structure to reduce the variations in the height of each half ball with the adoption of the configuration form of the land LND3 as the NSMD.

The configurations of lands LND3 disposed at other than the corner portions of the wiring board 1S will subsequently be explained. In the second embodiment of the present application as shown in FIG. 53, each of the lands LND3 disposed at other than the corner portions of the wiring board 1S do not adopt the land on via structure, and the configuration form of each land LND3 is taken as an SMD. As shown in FIG. 53, the lands LND3 disposed at other than the corner portions of the wiring board 1S are disposed so as not to overlap with the vias V in plan view. The lands LND3 and the vias V are coupled to one another by wirings L2 formed at the back surface of the wiring board 1S. As mentioned above, no land on via structure is not adopted for the coupling between each land LND3 and each via V disposed at other than the corner portion of the wiring board 1S. Thus, the vias V are not provided corresponding to the positions of the lands LND3 formed at the back surface of the wiring board 1S. Namely, the placement positions of the vias V can be freely set without being defined to the placement positions of the lands LND3 on which the half balls are mounted. Since the lands LND3 and the vias V formed at the back surface of the wiring board 1S are respectively coupled by the wirings L2 formed at the back surface of the wiring board, it is not necessary to provide the vias V in association with the positions of the lands LND3 formed at the back surface of the wiring board 1S. The positions of the vias V can be freely provided corresponding to the lands LND1 formed at the front surface of the wiring board 1S. This means that the degree of layout freedom of each land LND1 formed at the surface of the wiring board 1S is enhanced.

Figure 54:
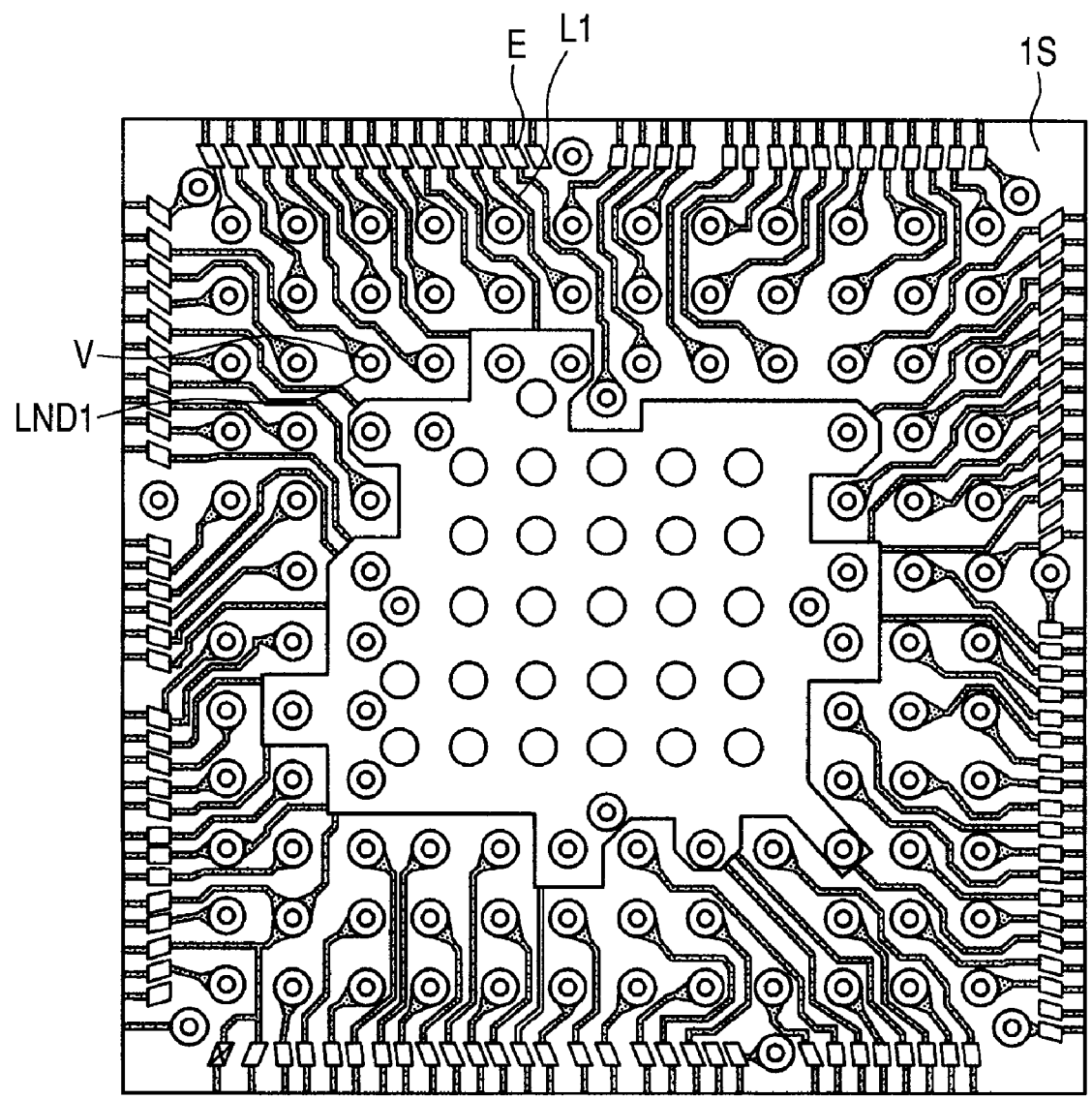
FIG. 54 is a diagram illustrating a layout configuration of wirings for coupling electrodes and lands at the surface of the wiring board.

FIG. 54 is a diagram showing a layout configuration of wirings L1 for coupling electrodes E and lands LND1 at the front surface of the wiring board 1S. Since the positions of vias V can be provided so as to make it easy to route the wirings L1 as shown in FIG. 54, the degree of freedom of the layout of the wirings L1 can be enhanced. Namely, in the second embodiment of the present application, the configuration of coupling between the land LND3 and its corresponding via V disposed in the area other than each corner portion of the wiring board 1S is not taken as a land on via structure as shown in FIG. 53 in terms of an improvement in the degree of freedom of the layout of the wirings L1 disposed at the surface of the wiring board 1S. Assuming, however, that when the land LND3 and its corresponding via V formed at the back surface of the wiring board 1S are not brought to the land on via structure, the configuration form of the land LND3 formed at the back surface of the wiring board 1S is taken as an NSMD, variations in the height of each half ball disposed on the land LND3 become manifest. Thus, in the second embodiment of the present application, the coupling between the land LND3 and its corresponding via V disposed in the area other than each corner portion of the wiring board 1S is not brought to the land on via structure to enhance the degree of freedom of the layout of each wiring L1 disposed at the surface of the wiring board 1S. On the other hand, assuming that when no land on via structure is adopted for the coupling between the land LND3 and its corresponding via V formed at the back surface of the wiring board 1S, the configuration form of the land LND3 is taken as an NSMD, the variations in the height of each half ball mounted onto the land LND3 become a problem. Therefore, the configuration form of the land LND3 formed at the back surface of the wiring board 1S is adopted as an SMD.

When the characteristic configurations of the second embodiment of the present application are summarized, the configuration of coupling between the land LND3 and the via V disposed at each corner portion of the wiring board 1S is brought to the land on via structure, and the configuration form of the land LND3 disposed at the corner portion is taken as the NSMD. On the other hand, the configuration of coupling between the land LND3 and its corresponding via V disposed in the area other than each corner portion of the wiring board 1S is not taken as the land on via structure, and the configuration form of the land LND3 disposed in the area other than the corner portion is taken as the SMD. With such a configuration, the second embodiment of the present application brings about noticeable effects that while the variations in the height of each half ball at each corner portion of the wiring board 1S on which stress is liable to concentrate is being suppressed, the strength of bonding or adhesion between the land LND3 and its corresponding half ball can be enhanced and the degree of freedom of the layout of each wiring L1 formed at the surface of the wiring board 1S can be ensured.

Third Embodiment

A third embodiment of the present application is also targeted for a half ball LGA. The first embodiment of the present application has explained the example in which all of the lands formed at the back surface of the wiring board respectively adopt the land on via structure and the configuration form of each land is taken as the NSMD. On the other hand, the third embodiment of the present application will explain an example wherein only some of lands formed at the back surface of a wiring board adopt a land on via structure and the configuration form of the land is taken as an NSMD, whereas other lands do not adopt the land on via structure and the configuration form of the land is taken as an SMD.

Figure 55:
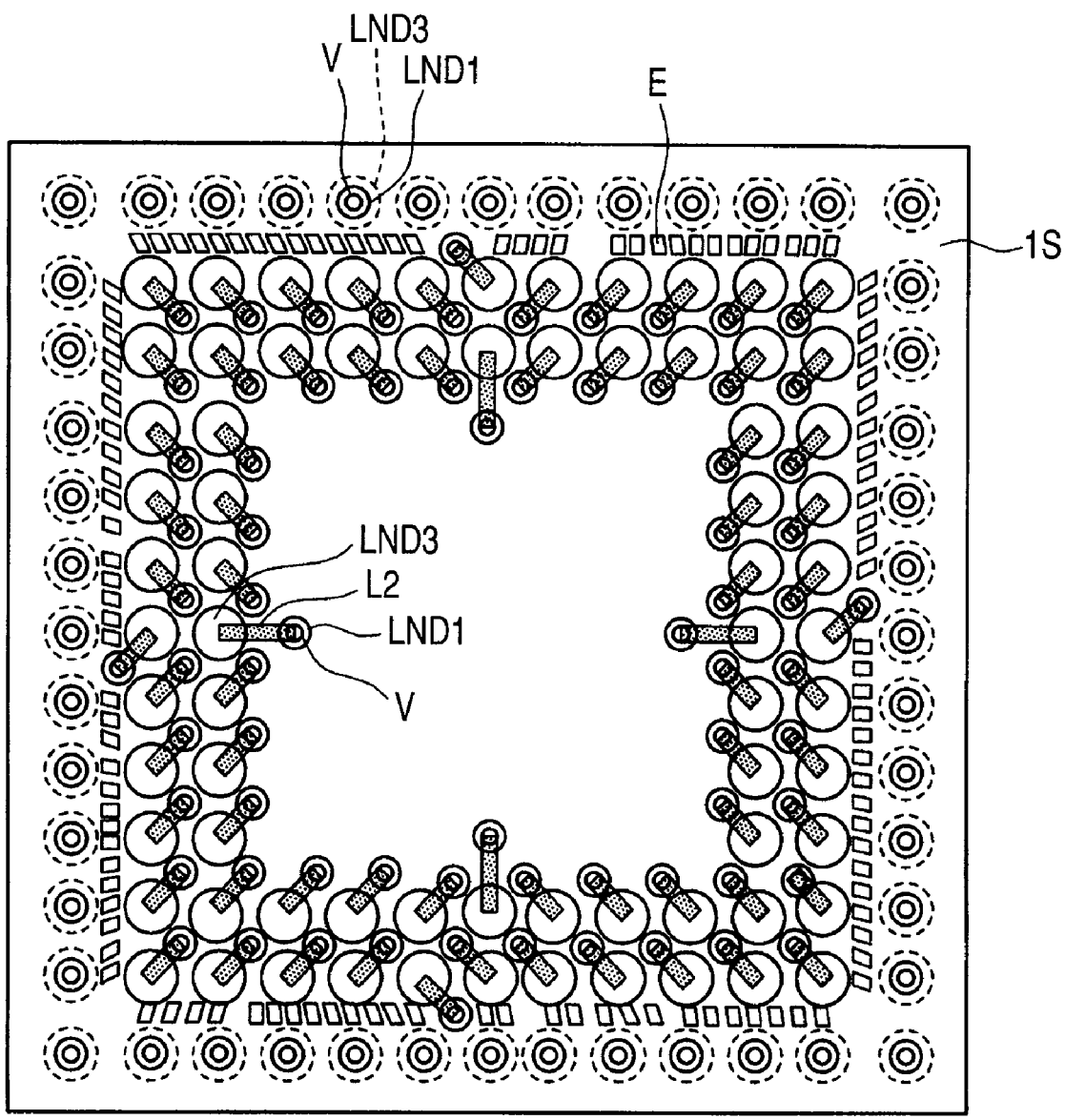
FIG. 55 is a diagram showing a configuration of a wiring board at a half ball LGA according to a third embodiment.

FIG. 55 is a diagram showing a configuration of a wiring substrate or board 1S at a half ball LGA of the third embodiment of the present application. FIG. 55 illustrates, in superimposed form, a configuration of a chip mounting surface (surface) of the wiring board 1S and a configuration of the surface (back surface) opposite to the chip mounting surface of the wiring board 1S. That is, in FIG. 55, electrodes E disposed along the four sides of the wiring board 1S and lands LND1 disposed in an area lying inside the electrodes E in lattice form are components formed at the surface of the wiring board 1S. Since the electrodes E and lands LND1 formed at the surface of the wiring board 1S become complicated in FIG. 55 although coupled to one another by wirings herein, the illustration of the wirings for coupling the electrodes E and the lands LND1 is omitted.

On the other hand, in FIG. 55, wirings L2 and lands LND3 disposed in lattice form are components formed at the back surface of the wiring board 1S. Vias V that penetrate the front surface of the wiring board 1S and the back surface of the wiring board 1S are illustrated.

In FIG. 55, the feature of the third embodiment of the present application resides in the layout relationship between the lands LND1, vias V and lands LND3 formed in the outermost column of the wiring board 1S. Namely, in the third embodiment of the present application, the vias V are formed so as to overlap with the lands LND1 formed at the surface (chip mounting surface) of the wiring board 1S in plan view and be internally included within the lands LND1 at the outermost column of the wiring board 1S. The vias V are respectively coupled directly to the lands LND3 formed at the back surface of the wiring board 1S. Namely, the lands LND3 formed at the back surface of the wiring board 1S are respectively formed directly on the vias V and disposed so as to internally include the vias V in plan view. The configuration form of the land LND3 formed at the back surface of the wiring board 1S is adopted as an NSMD. As described above, the lands LND3 and vias V formed at the outermost column of the wiring board 1S adopt a land on via structure respectively, and the configuration form of the land LND3 is taken as an NSMD. Thus, the strength of coupling between the land LND3 formed at the back surface of the wiring board 1S and its corresponding half ball (not shown) mounted on the land LND3 can be enhanced at the outermost column of the wiring board 1S.

Each of the lands LND3 disposed at the outermost column of the wiring board 1S is brought to the land on via structure and the configuration form of each land LND3 is taken as the NSMD due to the following reasons. Stress applied to the wiring board 1S is most liable to concentrate on each corner portion of the wiring board 1S shaped in rectangular form as described in the second embodiment of the present application. However, the stress becomes large even around the four sides of the wiring board 1S. Namely, there is a possibility that each half ball will be detached from the land LND3 due to the stress concentration even around the four sides of the wiring board 1S.

Thus, in the third embodiment of the present application, the configuration form of the land LND3 disposed at the outermost column of the wiring board 1S is set as the NSMD to enhance the strength of mounting between the land LND3 and its corresponding half ball at the outermost column of the wiring board 1S. Each of the lands LND3 and its corresponding via V are coupled to each other in the land on via structure to reduce variations in the height of each half ball due to the adoption of the configuration form of the land LND3 as the NSMD.

A description will subsequently be made of a configuration of each land LND3 disposed at other than the outermost column of the wiring board 1S. In the third embodiment of the present application, as shown in FIG. 55, each of the lands LND3 disposed at other than the outermost column of the wiring board 1S does not adopt the land on via structure, and the configuration form of the land LND3 is taken as an SMD. As shown in FIG. 55, the lands LND3 disposed at other than the outermost column of the wiring board 1S are placed so as not to overlap with the vias V in plan view. The lands LND3 and the vias V are coupled to one another by wirings L2 formed at the back surface of the wiring board 1S. As described above, no land on via structure is adopted for the coupling between each of the lands LND3 and its corresponding via V disposed at other than the outermost column of the wiring board 1S. Thus, the vias V are not provided corresponding to the positions of the lands LND3 formed at the back surface of the wiring board 1S. Namely, the placement positions of the vias V can be freely set without being defined to the placement positions of the lands LND3 on which the half balls are mounted. Since the lands LND3 and the vias V formed at the back surface of the wiring board 1S are respectively coupled by the wirings L2 formed at the back surface of the wiring board, it is not necessary to provide the vias V in association with the positions of the lands LND3 formed at the back surface of the wiring board 1S. The positions of the vias V can be freely provided corresponding to the lands LND1 formed at the front surface of the wiring board 1S. This means that the degree of layout freedom of the land LND1 formed at the surface of the wiring board 1S is enhanced.

Figure 56:
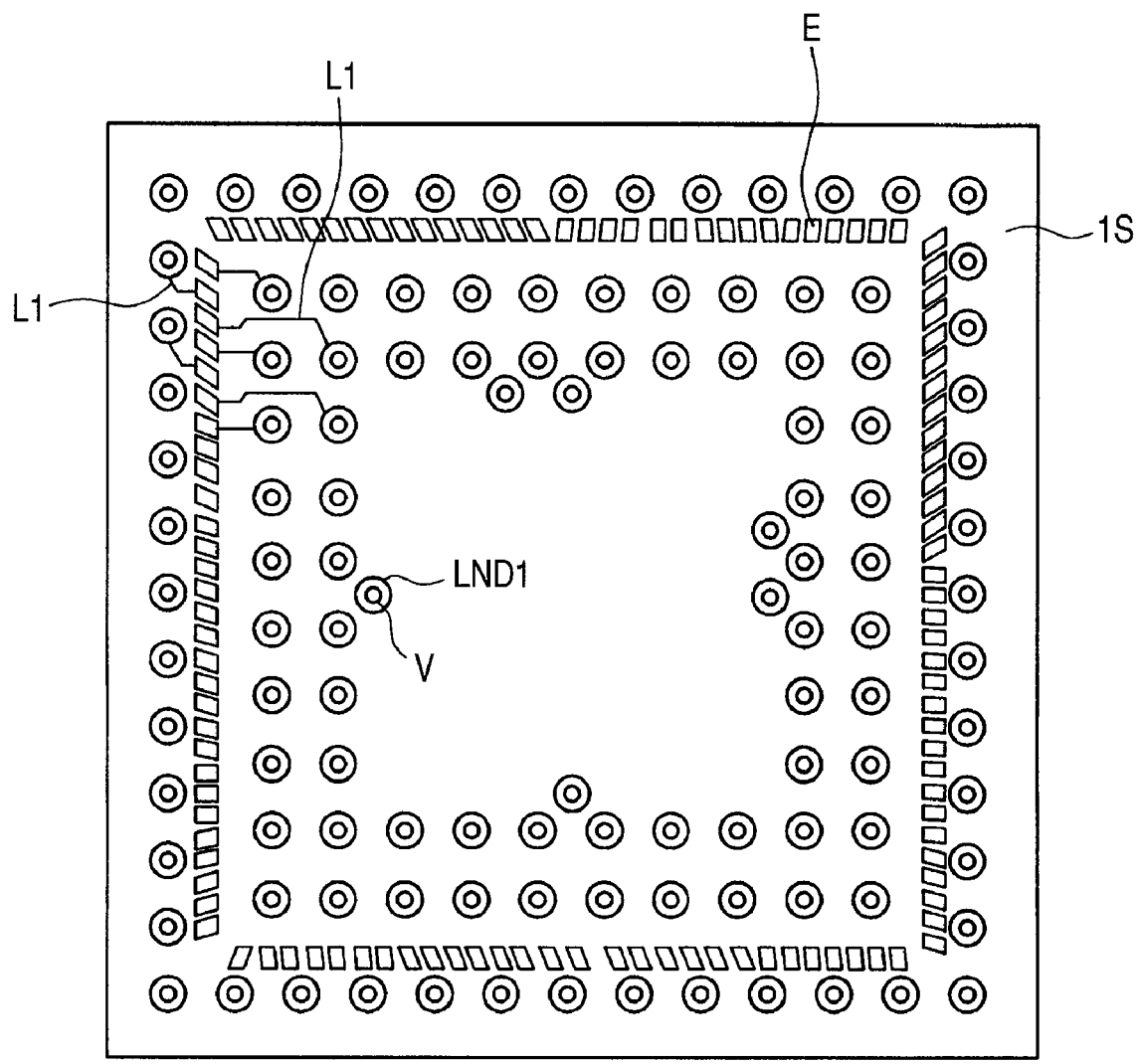
FIG. 56 is a diagram illustrating a layout configuration of wirings for coupling electrodes and lands over the surface of the wiring board.

FIG. 56 is a diagram showing a layout configuration of wirings L1 for coupling electrodes E and lands LND1 at the front surface of the wiring board 1S. The feature of the third embodiment of the present application resides in that the electrodes E disposed at the surface (chip mounting surface) of the wiring board 1S are not placed at the outermost periphery of the wiring board 1S. Namely, while the electrodes E are arranged along the four side of the wiring board 1S shaped in rectangular form as shown in FIG. 56, the lands LND1 and vias V are formed in an area lying outside the electrodes E, and the lands LND1 and vias V are formed even in an area lying inside the electrodes E. The so-provided configuration enables an improvement in the degree of freedom of a layout of the wirings L1 for coupling the lands LND1 and electrodes E formed at the surface of the wiring board 1S. Namely, since the wirings L1 that extend from the electrodes E to the outer area, and the wirings L1 that extend from the electrodes E to the inner area exist, the layout of the wirings L1 is made easier as compared with the case in which all the wirings L1 are disposed in the area lying the inside the electrodes E.

Further, in the third embodiment of the present application, the coupling between each of the lands LND3 and the via V both disposed in the area lying inside the electrodes E is not defined as the land on via structure as shown in FIG. 55 in order to enhance the degree of freedom of the layout of the wirings L1 disposed at the surface of the wiring board 1S. On the other hand, when the configuration form of the land LND3 is taken as the NSMD where no land on via structure is adopted for the coupling between each of the lands LND3 and each of the vias V both formed at the back surface of the wiring board 1S, variations in the height of each half ball mounted onto the land LND3 becomes a problem. Therefore, the configuration form of the land LND3 formed at the back surface of the wiring board 1S is adopted as the SMD.

Summarizing the characteristic configurations of the third embodiment of the present application from above, the configuration of coupling between the land LND3 and the via V disposed at the outermost column of the wiring board 1S is brought to the land on via structure, and the configuration form of the land LND3 disposed at the outermost column of the wiring board 1S is taken as the NSMD. On the other hand, the configuration of coupling between the land LND3 and its corresponding via V disposed in the area other than the outermost column of the wiring board 1S is not taken as the land on via structure, and the configuration form of the land LND3 disposed in the area other than the outermost column is taken as the SMD. Structures are adopted wherein the vias V are provided not only in the area lying inside the electrodes E formed at the surface of the wiring board 1S but also in the area lying thereoutside.

With the so-provided configuration, the third embodiment of the present application brings about noticeable effects that while the variations in the height of each half ball at the outermost column of the wiring board 1S on which stress is liable to concentrate are being suppressed, the strength of bonding or adhesion between the land LND3 and its corresponding half ball can be enhanced and the degree of freedom of the layout of each wiring L1 formed at the surface of the wiring board 1S can be ensured.

Fourth Embodiment

A fourth embodiment of the present application will explain an example in which the present invention is applied to a BGA. Although the first through third embodiments of the present application have explained the half ball LGA, they can be applied even to the BGA according to the fourth embodiment of the present application.

Figure 57:
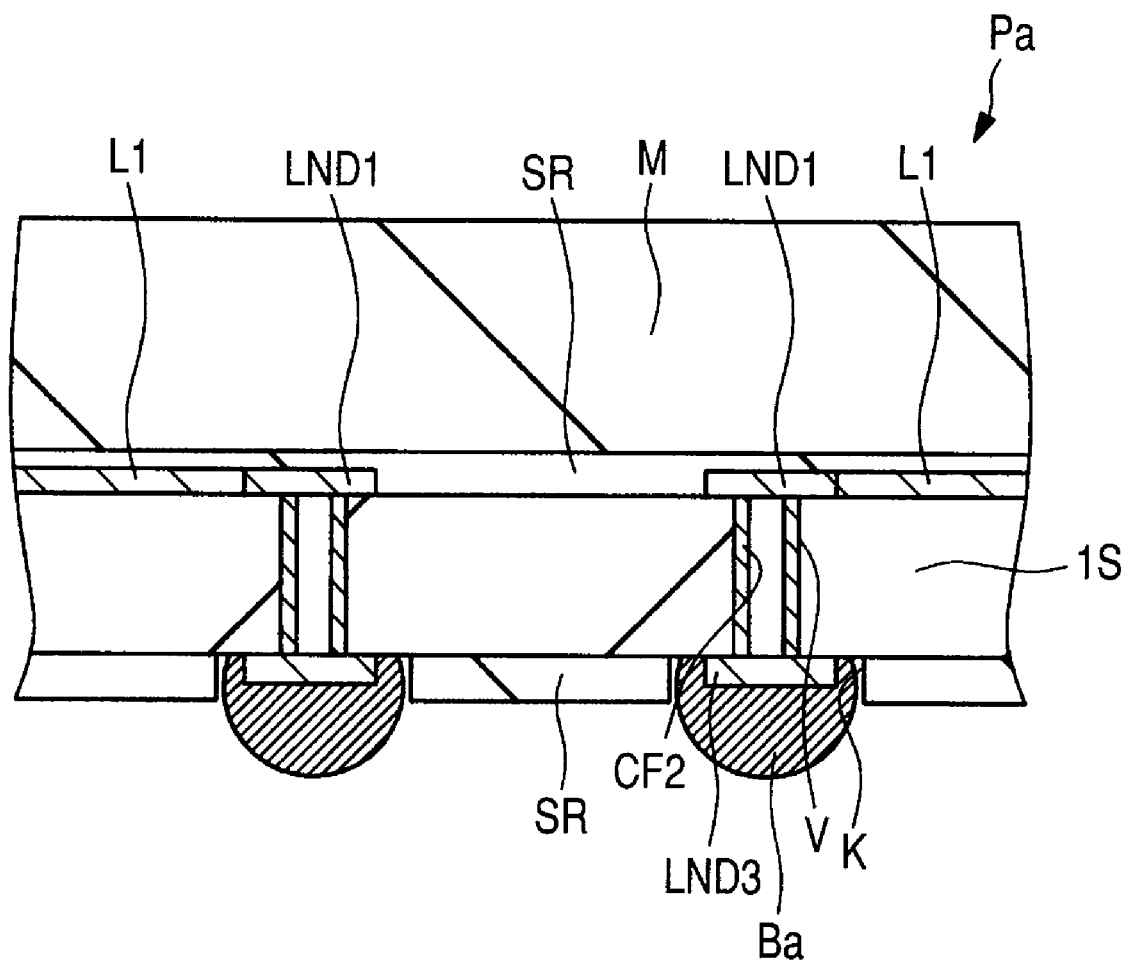
FIG. 57 is a sectional view showing a typical configuration of a package comprised of a BGA according to a fourth embodiment.

FIG. 57 is a sectional view showing a typical configuration of a package Pa comprised of a BGA according to the fourth embodiment of the present application. The package Pa shown in FIG. 57 is approximately similar in configuration to the package Pa comprised of the half ball LGA of the first embodiment of the present application shown in FIG. 49. A point of difference therebetween resides in that in the package Pa shown in FIG. 57, the height of each solder ball Ba is formed to be higher than 0.1 mm, whereas in the package Pa shown in FIG. 49, the height of each half ball HBa is formed to be not greater than 0.1 mm. The configuration of the package Pa shown in FIG. 57 will be explained below. The package Pa shown in FIG. 57 has a wiring substrate or board 1S. Vias V that penetrate the wiring board 1S are defined in the wiring board 1S. Conductive films CF2 each comprised of a plating film are formed at their corresponding side surfaces of the vias V. Lands LND3 are formed at the back surface (lower surface) of the wiring board 1S so as to be coupled directly to the vias V respectively. Solder balls Ba corresponding to external coupling terminals are formed over the lands LND3 respectively. Consequently, a land on via structure is formed. A solder resist SR is formed at the back surface (lower surface) of the wiring board 1S. The lands LND3 are respectively formed inside openings K defined in the solder resist SR. At this time, the diameter of each opening K is formed to be larger than the diameter of the land LND3, and the configuration form of the land LND3 is brought to an NSMD. Namely, the package Pa (BGA) according to the first embodiment of the present application is of a land on via structure and corresponds to a package in which the configuration form of the land LND3 is taken as an NSMD. Lands LND1 are respectively formed to be coupled to the vias V at the surface (upper surface) of the wiring board 1S. Wirings L1 are respectively formed to be coupled to the lands LND1. The lands LND1 and the wirings L1 formed at the surface of the wiring board 1S are covered with a solder resist SR. A resin M is formed over the solder resist SR. If described in detail, although not shown in FIG. 57, each semiconductor chip (not shown) is mounted over the solder resist SR formed over the surface (upper surface) of the wiring board 1S, and the resin M is formed to cover the semiconductor chip.

The BGA according to the fourth embodiment of the present application configured in this way is also taken as the land on via structure in a manner similar to the first embodiment of the present application, and the configuration in which the configuration form of the land LND3 is taken as the NSMD, is applied to the BGA. Consequently, an improvement in the mounting or packaging strength of each solder ball Ba and suppression of variations in the height of each solder ball Ba disposed over the land LND3 can be realized.

Advantages of the BGA according to the fourth embodiment of the present application will be explained. In the BGA, the solder balls Ba are used as the external coupling terminals. The height of each solder ball Ba is higher than 0.1 mm. The solder ball Ba is set higher in height than each of the half balls corresponding to the external coupling terminals. Therefore, the BGA has an advantage in that the standoff (height) of each external coupling terminal can be set large as compared with the half ball LGA. That is, the BGA has a feature that since the height of the solder ball Ba becomes high in height in the BGA, it becomes liable to be mounted onto a motherboard upon its mounting. Described concretely, when parts are mounted onto the motherboard, opposing solder is applied on terminals located on the motherboard to mount parts thereon. Since, however, the height of each solder ball becomes high in the BGA even though the opposing solder is formed thick, the formation (solder bridge) of the opposing solder between the adjacent solder balls is suppressed, so that a short failure between the adjacent solder balls can be prevented. That is, passive parts such as a chip capacitor, a resistor, etc. are mounted onto the motherboard in addition to the semiconductor device such as the BGA. There is a tendency that the thickness of the opposing solder applied onto the motherboard becomes thick to mount the passive parts onto the motherboard reliably. Even in this case, since the height of each external coupling terminal (solder ball Ba) is set high in the BGA, a short failure by the opposing solder between the adjacent solder balls can be reduced. Thus, the BGA has an advantage in that mounting easiness at the mounting to the motherboard is high.

Figure 58:
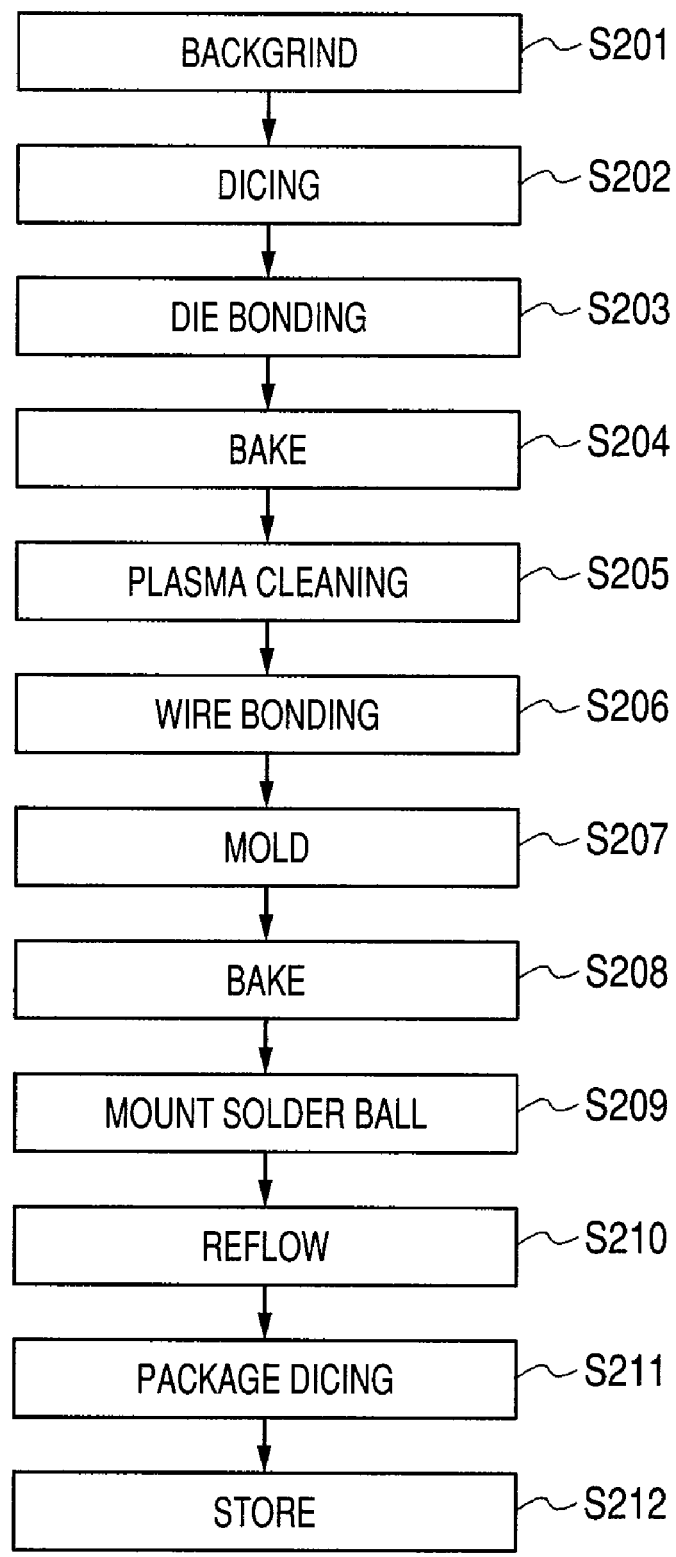
FIG. 58 is a flowchart depicting a process for manufacturing the BGA according to the fourth embodiment.

A process for manufacturing the BGA according to the fourth embodiment of the present application will next be explained. The manufacturing process of the BGA according to the fourth embodiment of the present application is however approximately similar to that for the half ball LGA according to the first embodiment of the present application. That is, FIG. 58 is a flowchart showing the process of manufacturing the BGA according to the fourth embodiment of the present application. S201 through S212 shown in FIG. 58 are however approximately similar to S101 through S112 shown in FIG. 37 respectively. A point of difference therebetween resides in a solder ball mounting step (S209). This solder ball mounting step will be explained.

Figure 59:
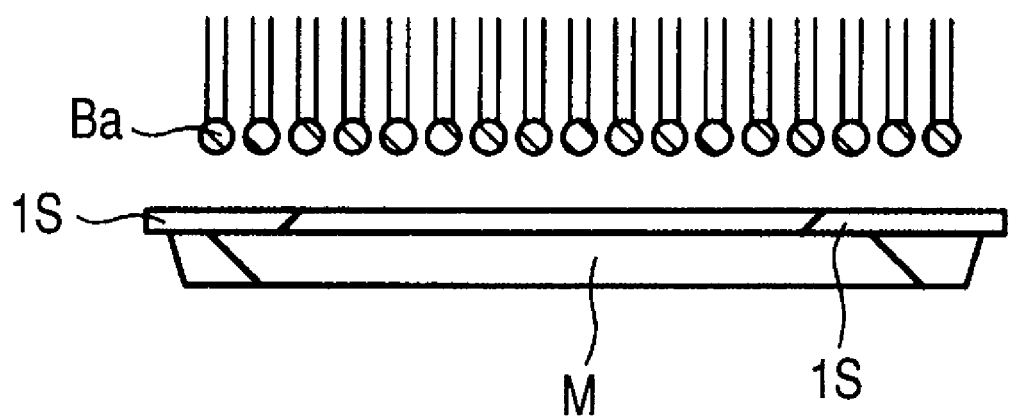
FIG. 59 is a sectional view showing the manufacturing process of the BGA.
Figure 60:
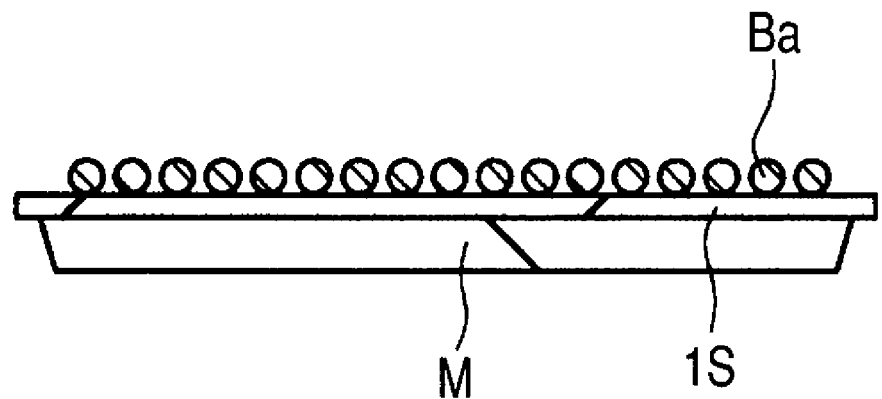
FIG. 60 is a sectional view following FIG. 59, showing the manufacturing process of the BGA.

FIGS. 38 through 42 are similar to the first embodiment of the present application. Subsequently, solder balls Ba are picked up as shown in FIG. 59 and mounted onto the back surface of the wiring board 1S as shown in FIG. 60. Then, reflow is performed on the wiring board 1S (S210 in FIG. 58). Consequently, the solder balls Ba formed at the back surface of the wiring board 1S become external coupling terminals for the BGA. Subsequent process steps are similar to those in the first embodiment of the present application. The BGA according to the fourth embodiment of the present application can be manufactured in this way.

Fifth Embodiment

Figure 61:
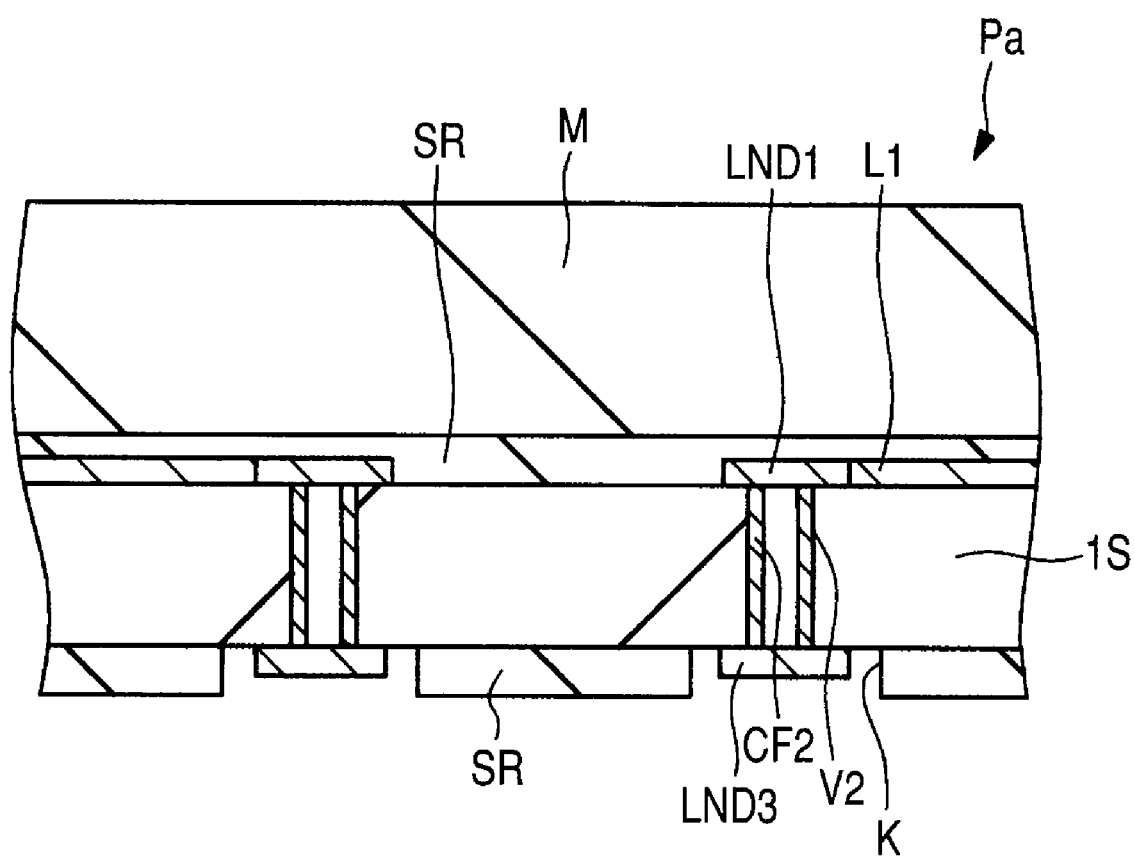
FIG. 61 is a sectional view illustrating a typical configuration of a package comprised of an LGA according to a fifth embodiment.

A fifth embodiment of the present application will explain an example in which the present invention is applied to the LGA. FIG. 61 is a typical configuration of a package Pa comprised of an LGA according to the fifth embodiment of the present application. The package Pa shown in FIG. 61 is approximately similar in configuration to the package Pa comprised of the half ball LGA of the first embodiment of the present application shown in FIG. 49. A point of difference therebetween resides in that in the package Pa shown in FIG. 61, no half balls are formed, whereas in the package Pa shown in FIG. 49, the half balls HBa are formed. The configuration of the package Pa shown in FIG. 61 will be explained below. The package Pa shown in FIG. 61 has a wiring substrate or board 1S. Vias V that penetrate the wiring board 1S are defined in the wiring board 1S. Conductive films CF2 each comprised of a plating film are formed at their corresponding side surfaces of the vias V. Lands LND3 are formed at the back surface (lower surface) of the wiring board 1S so as to be coupled directly to the vias V respectively. Solder balls Ba corresponding to external coupling terminals are formed over the lands LND3 respectively. Consequently, a land on via structure is formed. A solder resist SR is formed at the back surface (lower surface) of the wiring board 1S. The lands LND3 are respectively formed inside openings K defined in the solder resist SR. At this time, the diameter of each opening K is formed to be larger than the diameter of the land LND3, and the configuration form of the land LND3 is brought to an NSMD. Namely, the package Pa (LGA) according to the first embodiment of the present application is of a land on via structure and corresponds to a package in which the configuration form of the land LND3 is taken as an NSMD. Lands LND1 are respectively formed to be coupled to the vias V at the surface (upper surface) of the wiring board 1S. Wirings L1 are respectively formed to be coupled to the lands LND1. The lands LND1 and the wirings L1 formed at the surface of the wiring board 1S are covered with a solder resist SR. A resin M is formed over the solder resist SR. If described in detail, although not shown in FIG. 61, each semiconductor chip (not shown) is mounted over the solder resist SR formed over the surface (upper surface) of the wiring board 1S, and the resin M is formed to cover the semiconductor chip.

In the LGA according to the fifth embodiment of the present application, no half balls are mounted onto the lands LND formed at the back surface of the wiring board 1S. Therefore, the problem that variations in the height of each half ball mounted onto the land LND3 should be reduced does not exist in the LGA according to the fifth embodiment of the present application. Nevertheless, such a configuration that the configuration of coupling between the land LND3 and the via V formed at the back surface of the wiring board 1S is taken as the land on via structure and the configuration form of the land LND3 formed at the back surface of the wiring board 1S is taken as the NSMD is useful even for the LGA according to the fifth embodiment of the present application. This point will be explained.

When the LGA is mounted to its corresponding motherboard, opposing solder is applied onto the motherboard and the LGA is mounted onto the motherboard by the opposing solder. Therefore, the exposed lands LND3 are solder-coupled upon mounting the LGA onto the motherboard.

When each of the lands LND3 and its corresponding via V are coupled to each other using the corresponding wiring without taking the land LND3 formed in the LGA as the land on via structure herein, for example, the land LND3 and part of the wiring are exposed from each opening defined in the solder resist SR. Thus, the opposing solder applied onto the motherboard is formed so as to cover the exposed land LND3 and the exposed part of wiring. Since the land LND3 is shaped in circular form and also large in area at this time, the strength of adhesion between the land LND3 and the opposing solder becomes higher. Since, however, the wiring is thin and also small in area, stress applied to the LGA and the motherboard makes each land LND3 including the wiring liable to cause its peeling off from the wiring board 1S every wiring at each portion where the wiring and the opposing solder are bonded to each other. In this case, the LGA is peeled off from the motherboard, thus resulting in a mounting failure.

As to this respect, the configuration of the land LND3 and the via V is set to the land on via structure in the fifth embodiment of the present application. Therefore, even when the configuration form of the land LND3 is taken as the NSMD, the metal film exposed from the opening defined in the solder resist SR becomes only the land LND3. From this point of view, the opposing solder is adhered or bonded only to the land LND3 shaped in circular form in the fifth embodiment of the present application. Namely, since the wiring for coupling each land LND3 and its corresponding via V does not exist in the fifth embodiment of the present application even though the configuration form of the land LND3 is taken as the NSMD, each wiring and its corresponding opposing solder are not bonded to each other. Thus, since the opposing solder is adhered only to the land LND3 large in area and fixedly secured to the wiring board, the land LND3 can be prevented from being peeled off from the wiring board 1S. It is understood from the above that such a configuration that the configuration of coupling between the land LND3 and its corresponding via V formed at the back surface of the wiring board 1S is taken as the land on via structure and the configuration form of the land LND3 formed at the back surface of the wiring board 1S is taken as the NSMD is useful even for the LGA according to the fifth embodiment of the present application.

Figure 62:
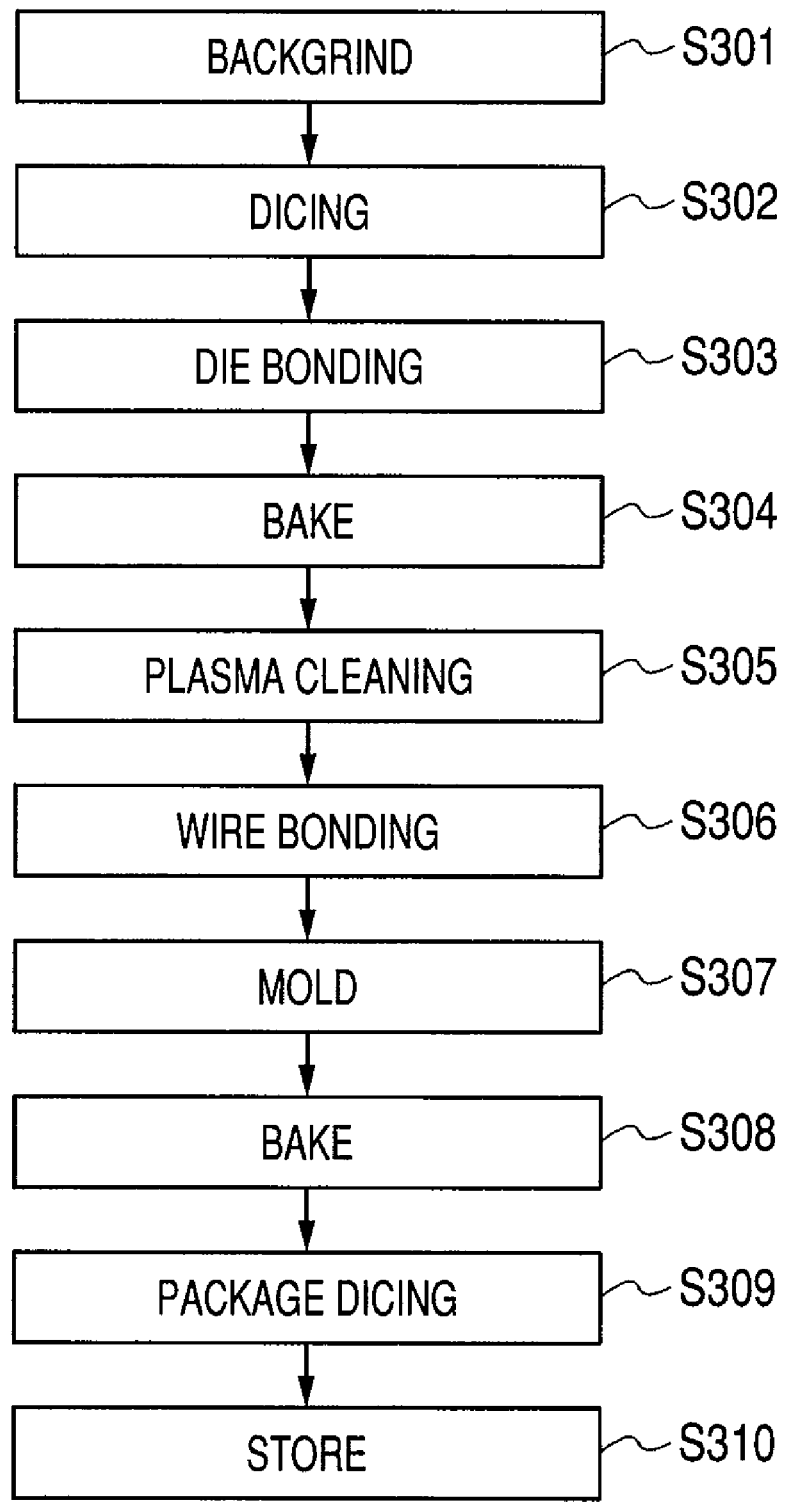
FIG. 62 is a flowchart showing a process for manufacturing the LGA according to the fifth embodiment.

A process for manufacturing the LGA according to the fifth embodiment of the present application will next be explained. The manufacturing process of the LGA according to the fifth embodiment of the present application is however approximately similar to that for the half ball LGA according to the first embodiment of the present application. That is, FIG. 62 is a flowchart showing the process of manufacturing the LGA according to the fifth embodiment of the present application. S301 through S310 shown in FIG. 62 are however approximately similar to S101 through S112 shown in FIG. 37 respectively. A point of difference therebetween resides in that the step of forming each half ball over the wiring board does not exist. The LGA according to the fifth embodiment of the present application can be manufactured in this way.

While the invention made above by the present inventors has been described specifically on the basis of the preferred embodiments, the present invention is not limited to the embodiments referred to above. It is needless to say that various changes can be made thereto without the scope not departing from the gist thereof.

Although each of the embodiments referred to above has explained the package with each semiconductor chip having the function of the RFIC mounted thereon while taking up it specifically, the present invention is not limited to it. The present invention can widely be applied to packages (such as a BGA, a half ball LGA and an LGA) each equipped with a semiconductor chip having functions other than the RFIC.

The present invention can widely be used in the manufacturing industry that manufactures a semiconductor device.

What is claimed is:
1. A semiconductor device comprising:
 (a) a wiring board;
 (b) a semiconductor chip mounted over a first surface of the wiring board; and
 (c) a plurality of wires which respectively couple a plurality of electrodes formed at the wiring board and a plurality of bonding pads formed at the semiconductor chip,
 wherein the wiring board includes:
 (a1) the electrodes formed at the first surface of the wiring board;
 (a2) a plurality of first lands formed at the first surface of the wiring board and provided so as not to overlap with the electrodes in a plan view;
 (a3) a plurality of first wirings which are formed at the first surface of the wiring board and which electrically couple the electrodes and the first lands, respectively;
 (a4) a plurality of vias which are respectively formed so as to be internally contained in the first lands in a plan view and which extend through the wiring board;
 (a5) a plurality of second lands which are formed at a second surface corresponding to a surface opposite to the first surface of the wiring board and formed so as to internally contain the vias in a plan view and which are electrically coupled to the vias, respectively;
 (a6) a protective film formed at the second surface of the wiring board, the protective film having a plurality of first openings being larger in area than the second lands, respectively, and internally containing the second lands, respectively; and
 (a7) a plurality of first protruded electrodes respectively provided at the first openings defined in the protective film and which are electrically coupled to the second lands, respectively,
 wherein the wiring board is shaped in rectangular form,
 wherein the electrodes are disposed along the sides of the wiring board,
 wherein some of the first lands are disposed in an area lying outward from an area of the wiring board at which the electrodes are disposed, and
 wherein some of the first lands are disposed in an area lying inward from the area of the wiring board at which the electrodes are disposed.
2. The semiconductor device according to claim 1, wherein the heights of the first protruded electrodes are respectively less than or equal to 0.1 mm.
3. The semiconductor device according to claim 1, wherein the heights of the first protruded electrodes are respectively higher than 0.1 mm.
4. The semiconductor device according to claim 1,
 wherein each of the electrodes is shaped in rectangular form, and
 wherein the second lands and the first openings are respectively shaped in circular form.
5. The semiconductor device according to claim 1,
 wherein the wiring board is shaped in rectangular form,
 wherein the electrodes are disposed at an outer peripheral portion of the wiring board, and
 wherein the first lands are disposed in an area lying inward from the outer peripheral portion of the wiring board at which the electrodes are placed.

6. The semiconductor device according to claim 1,
wherein the vias that penetrate the wiring board respectively have diameters at the second surface of the wiring board, which are smaller than diameters thereof at the first surface of the wiring board, and
wherein the diameters of the vias become smaller as the vias proceed from the first surface of the wiring board to the second surface of the wiring board.

7. The semiconductor device according to claim 1, wherein the semiconductor chip is of an RFIC chip used in a cellular phone.

8. The semiconductor device according to claim 7, wherein the RFIC chip is formed with a circuit which realizes the function of modulating a baseband signal to a radio-frequency transmit signal upon transmission and the function of demodulating a radio-frequency receive signal to a baseband signal upon reception.

9. A semiconductor device comprising:
(a) a wiring board;
(b) a semiconductor chip mounted over a first surface of the wiring board; and
(c) a plurality of wires which respectively couple a plurality of electrodes formed at the wiring board and a plurality of bonding pads formed at the semiconductor chip,
wherein the wiring board includes:
(a1) the electrodes formed at the first surface of the wiring board;
(a2) a plurality of first lands formed at the first surface of the wiring board and provided so as not to overlap with the electrodes in a plan view;
(a3) a plurality of first wirings which are formed at the first surface of the wiring board and which electrically couple the electrodes and the first lands, respectively;
(a4) a plurality of vias which are respectively formed so as to be internally contained in the first lands in a plan view and which extend through the wiring board;
(a5) a plurality of second lands which are formed at a second surface corresponding to a surface opposite to the first surface of the wiring board and formed so as to internally contain the vias in a plan view and which are electrically coupled to the vias, respectively;
(a6) a protective film formed at the second surface of the wiring board, the protective film having a plurality of first openings being larger in area than the second lands respectively and internally containing the second lands, respectively; and
(a7) a plurality of first protruded electrodes respectively provided at the first openings defined in the protective film and which are electrically coupled to the second lands, respectively,
the semiconductor device further including at the second surface of the wiring board:
(a8) a plurality of third lands respectively provided so as not to overlap with the vias in a plan view;
(a9) second wirings which electrically couple certain ones of the second lands and the third lands, respectively;
(a10) a protective film formed at the second surface of the wiring board, the protective film having a plurality of second openings being smaller in area than the third lands respectively and being contained in the third lands in a plan view without exposing the second wirings; and
(a11) a plurality of second protruded electrodes respectively provided at the second openings defined in the protective film and electrically coupled to the third lands, respectively,
wherein the certain ones of the second lands respectively electrically coupled to the third lands are covered with the protective film.

10. The semiconductor device according to claim 9, wherein the heights of the first protruded electrodes and the heights of the second protruded electrodes are both less than or equal to 0.1 mm.

11. The semiconductor device according to claim 9, wherein the heights of the first protruded electrodes and the heights of the second protruded electrodes are both higher than 0.1 mm.

12. The semiconductor device according to claim 9, wherein the first protruded electrodes are placed at corner portions of the wiring board.

13. The semiconductor device according to claim 9,
wherein the wiring board is shaped in rectangular form,
wherein the electrodes formed at the first surface of the wiring board are disposed along the sides of the wiring board, and
wherein the first protruded electrodes formed at the second surface of the wiring board are disposed in a plan view in an area lying outward from the area in which the electrodes are disposed, whereas the second protruded electrodes formed at the second surface of the wiring board are disposed in plan view in an area lying inward from the area in which the electrodes are disposed.

14. The semiconductor device according to claim 13, wherein the first protruded electrodes are disposed at the outermost periphery of the wiring board.

* * * * *